US006399270B1

(12) United States Patent
Mori et al.

(10) Patent No.: US 6,399,270 B1
(45) Date of Patent: Jun. 4, 2002

(54) SUPPORT FOR PRINTING PLATE AND PRINTING PLATE

(75) Inventors: Takahiro Mori; Kazuyuki Nishio; Io Mizushima; Katsura Hirai, all of Hino (JP)

(73) Assignee: Konica Corporation (JP)

( * ) Notice: Subject to any disclaimer, the term of this patent is extended or adjusted under 35 U.S.C. 154(b) by 0 days.

(21) Appl. No.: 09/452,647

(22) Filed: Dec. 1, 1999

(30) Foreign Application Priority Data

| | | |
|---|---|---|
| Dec. 4, 1998 | (JP) | 10-34525 |
| Dec. 9, 1998 | (JP) | 10-350110 |
| Dec. 28, 1998 | (JP) | 10-377064 |
| Feb. 1, 1999 | (JP) | 11-023848 |

(51) Int. Cl.$^7$ .................. G03F 7/09

(52) U.S. Cl. .................. 430/270.1; 430/138; 101/453

(58) Field of Search .................. 430/270.1, 302, 430/138; 101/453, 455, 456, 457, 458, 459, 463.1, 467

(56) References Cited

U.S. PATENT DOCUMENTS

| | | | | | |
|---|---|---|---|---|---|
| 4,559,292 | A | * | 12/1985 | Geissler et al. | 430/256 |
| 4,912,014 | A | * | 3/1990 | Feldman | 430/202 |
| 4,970,116 | A | * | 11/1990 | Kimura et al. | 428/332 |
| 5,501,940 | A | * | 3/1996 | Bloom et al. | 430/253 |
| 5,547,534 | A | * | 8/1996 | Conforti et al. | 156/230 |
| 5,908,731 | A | * | 6/1999 | Leenders et al. | 430/273.1 |
| 5,998,084 | A | * | 12/1999 | Elsaesser et al. | 430/165 |
| 6,007,962 | A | * | 12/1999 | Pearce et al. | 430/269 |
| 6,010,817 | A | * | 1/2000 | Van Damme et al. | 430/200 |
| 6,019,045 | A | * | 2/2000 | Kato et al. | 101/466 |
| 6,048,626 | A | * | 4/2000 | Tsuzuki et al. | 428/480 |
| 6,114,083 | A | * | 9/2000 | Kawamura et al. | 430/270.1 |
| 6,136,508 | A | * | 10/2000 | DeBoer et al. | 430/302 |
| 6,194,114 | B1 | * | 2/2001 | Toyoda et al. | 430/110 |
| 6,283,029 | B1 | * | 9/2001 | Tashiro et al. | 101/455 |

FOREIGN PATENT DOCUMENTS

| | | | | |
|---|---|---|---|---|
| JP | 6-183164 | A | * | 7/1994 |

* cited by examiner

*Primary Examiner*—Janet Baxter
*Assistant Examiner*—Barbara Gilmore
(74) *Attorney, Agent, or Firm*—Bierman, Muserlian and Lucas

(57) ABSTRACT

A support for a printing plate is disclosed, comprising a substrate having thereon at least one component layer contains porous particles. The component layer further contains a flaky inorganic particles or a material having the function of converting light to heat. A printing plate comprising the support is also disclosed, having on the support an image forming layer containing a thermally fusible particles.

15 Claims, No Drawings

SUPPORT FOR PRINTING PLATE AND PRINTING PLATE

FIELD OF THE INVENTION

The present invention relates to supports used for printing plates and printing plates by the use thereof.

BACKGROUND OF THE INVENTION

The surface of a support used for planographic printing plates such as a pre-sensitized plate (hereinafter, also denoted as a PS plate) has been conventionally subjected to a roughening treatment to endow water receptivity and to enhance plate life, and is further subjected to anodic oxidation to endow a hydrophilic property and enhanced resistance to wear by forming an oxide film on the surface thereof.

Generally known roughening treatments include chemical means (e.g., alkali.acid dissolution), mechanical means (e.g., rubbing with an abrasive, sand-blasting, liquid honing, rolling by a roughness-transfer roller, etc.) and electrochemical means (either direct or alternating current electrolytic treatment in an acidic solution). The support surface is subjected to the optimal combination of the treatments described above.

Specifically, electrochemical roughening is indispensable to form pits of 0.1 to a few μm in diameter to enhance water receptivity, and the acid concentration of an electrolysis solution, the aluminum concentration in the electrolysis solution, the concentration of impurities contaminated in the pre-treatment and the temperature of the electrolysis solution need to be tightly controlled to stably form a uniformly roughened surface, and there are many limitations such that the acceptable composition range of usable aluminum raw plates is limited and the histo-uniformity needs to be superior. The anodic oxidation, in which an aqueous sulfuric acid solution is employed in a high concentration of 20 to 40%, produces safety problems in use of the solution and adverse effects of the effluent on environment.

On the other hand, examples of the surface roughening treatment of a printing plate support, which does not necessarily need the electrochemical roughening treatment nor the anodic oxidation treatment, include a printing plate making method described in Tokuhyohei 9-504241 (WO 95/18019), in which, after being subjected to a mechanical roughening treatment to make the Ra of the substrate 0.3 to 1.5 μm, oxide particles are thermally sprayed (e.g., by plasma spraying) onto the surface to form a hydrophilic layer; and a method for preparing supports for printing plates described in WO 96/06200, characterized in that a specific substance is formed onto the support surface by a plasma method under low pressure of 1.9984×104 Pa (i.e., 150 torr). However, it was proved that formation of pits of 0.1 to a few μm in diameter to provide superior water receptivity was not accomplished by such plasma spraying method, and that printing performance was at unacceptable levels, processing stability in the width and longitudinal directions was insufficient when processing was continuously run, and costs were unacceptably high.

A preparation method of printing plate supports is proposed in WO 97/1987, characterized in that inorganic particles dispersed in an aqueous silicate solution were coated on the substrate to form a hydrophilic layer. Thereby, cost reduction may be achieve, however, in this method, multi-layered roughness structure was not added onto the surface so that the dampening water amount latitude during printing was insufficient, and water glass used as a binder was insufficient in flexibility, exhibiting defects such as easily cracking easily which required it to be peeled off and insufficient plate life.

JP-A 9-99662 (hereinafter, the term JP-A means a unexamined, published Japanese Patent Application) proposes a support for offset printing plates, characterized in that an image receiving layer provided on the support has a three-dimensional network structure having 30 to 80% voids and comprising fine inorganic particles of 100 nm or less of an average primary diameter and a water soluble resin. However, it was proved that stain in non-image portions, the dampening water amount latitude and printing life were not at acceptable levels.

SUMMARY OF THE INVENTION

Accordingly, it is an object of the present invention to provide a support for a printing plate in which treatment for making the support surface hydrophilic can be performed by coating at a low cost, exhibiting performance as a printing plate (e.g., dampening water amount latitude, resistance to staining in non-image portions or blanket stain, etc.) being superior to the grained aluminum used in conventional presensitized plates and having sufficient plate life.

Further, low-priced, printing plates used for computer to plate making system (hereinafter, also denoted as CTP), which provide easy handlablability and printability at a level equal to conventional presensitized plates (hereinafter, also denoted as PS plates) are desired along with digitalization of printing data. Recently, various types of CTP employing infrared laser recording means have been proposed. Of these, noted is a so-called dry CTP (including development with dampening water in a printing machine), which does not need any specific development, as described in JP-A 8-507727, 6-186750, 6-199064 and 7-314934. However, any type thereof employs laser ablation whereby a layer provided on the substrate is removed, producing problems such as stains occurring in the exposure apparatus. There has been proposed an exposure apparatus in which a suction type cleaner was provided to prevent such staining. However, it was difficult to completely remove ablated substances. There has been proposed a system covering the surface overall with a cover sheet to prevent scattering of the ablated substances, but problems are also produced, such as poor handling in covering with a cover sheet, unacceptable peeling or production of peeled waste.

In cases of printing with using water, there is a problem that the hydrophilicity of a layer constituting a non-image area, and having the function of water receptivity, is insufficient, leading to staining at the time of printing.

Accordingly, it is another object of the invention is to provide a printing plate which is handleable in room light, image formation can be made without need of ablation and therefore without causing any stains in the exposure apparatus, specific developing treatment is not required, there occurs no matter regarding staining of the printing machine, even when being developed in the printing machine and is superior in visualizabity; and an image forming method by the use thereof.

The above objects of the present invention are accomplished by the following constitution:

1. a support for a printing plate comprising a substrate and at least one component layer, wherein the component layer contains porous particles;
2. the support described in 1 above, wherein the component layer is a hydrophilic layer;
3. the support described in 1 above, wherein the porous particles are porous inorganic particles;

4. the support described in 1 above, wherein the porous particles have an average particle size of not more than 1 $\mu$m;
5. the support described in 1 above, wherein the porous particles have a pore volume of not less than 0.5 ml/g;
6. the support described in 3 above, wherein the porous inorganic particles comprise porous silica particles or porous aluminosilicate particles;
7. the support described in 3 above, wherein the porous inorganic particles comprise zeolite particles;
8. the support described in 1 above, wherein the component layer contains flaky inorganic particles;
9. the support described in 8 above, wherein the flaky inorganic particles have an average particle size of not more than 20 $\mu$m and an average aspect ratio of not less than 20;
10. the support described in 8 above, wherein the flaky inorganic particles exhibit not less than 0.7 of a degree of orientation on the substrate surface;
11. the support described in 1 above, wherein the component layer contains metal oxide particles having an average particle size of not more than 100 nm;
12. the support described in 11, wherein the metal oxide particles are colloidal silica;
13. the support described in 1 above, wherein the component layer contains inorganic particles having a Mohs hardness of not less than 5;
14. the support described in 13 above, wherein the inorganic particles having a Mohs hardness of not less than 5 have an average particle size more than an average layer thickness of said component layer;
15. the support described in 1 above, wherein the component layer contains a light-to-heat converting material;
16. the support described in 15 above, wherein the light-to-heat converting material is electroconductive;
17 the support described in 16 above, wherein the light-to-heat converting material is a metal oxide;
18. the support described in 15 above, wherein the light-to-heat converting material contained in the component layer exhibit colorless or white;
19. a printing plate comprising a substrate and at one component layer, wherein the component layer contains porous particles;
20. the printing plate described in 19 above, wherein the porous particles are porous inorganic particles;
21. the printing plate described in 19 above, wherein the component layer is an image recording layer;
22. the printing plate described in 21 above, wherein the component layer contains thermally fusible particles;
23. the printing plate described in 22 above, wherein the surface of the thermally fusible particles is covered with a material exhibiting a thermal conductivity of 0.10 to 70 $Wm^{-1}K^{-1}$ at 300 K;
24. the printing plate described in 19 above, wherein the printing plate further has an image recording layer;
25. the printing plate described in 24 above, wherein the image recording layer contains thermally fusible particles;
26. the printing plate described in 25 above, wherein the surface of said thermally fusible particles is covered with a material exhibiting a thermal conductivity of 0.10 to 70 $Wm^{-1}K^{-1}$ at 300 K;
27. the printing plate described in 24 above, wherein the image recording layer contains an infrared dye and a novolac resin, which is made of a condensate of phenols, and aldehydes or ketones;
28. the printing plate described in 27 above, wherein the image recording layer contains an acid generating material and an acid-decomposable material;
29. A support for a printing plate, characterized in that the support comprises a substrate having thereon a layer containing porous inorganic particles and a material having a function of converting light to heat;
30. the support described in 29 above, characterized in that an image forming layer capable of forming images through thermally varying solubility, physical strength or adhesion to the support is provided on the support;
31. an image forming method, characterized in that a printing plate, which comprises the support described in 29 or 30 above having thereon a layer containing a thermally fusible material, is imagewise heated to fuse the thermally fusible material, at least a part thereof being allowed to permeate into a porous layer to form an image portion and the thermally fusible material in a non-imaging portion being removed to form an image;
32. a support for a printing plate, characterized in that the support comprises a substrate having thereon a hydrophilic layer containing porous inorganic particles;
33. a support for printing plate, characterized in that the support comprises a substrate having thereon a hydrophilic layer containing flaky inorganic particles;
34. a printing plate, characterized in that the printing plate comprises the support described in 32 or 33 above and provided thereon an ink receptive image layer;
35. a method for preparing a support for a printing plate which comprises preparing a coating solution containing porous inorganic particles, coating the coating solution on a substrate and drying it to form a hydrophilic layer, characterized in that the method further comprises a step of crushing the porous inorganic particles by mechanical dispersion;
36. a method for preparing a support for a printing plate which comprises preparing a coating solution containing flaky mineral particles, coating the coating solution on a substrate and drying it to form a hydrophilic layer, characterized in that the method further comprises a step of crushing the flaky mineral particles by mechanical dispersion;
37. a method for preparing a support for a printing plate which comprises preparing a coating solution containing swellable flaky clay mineral particles, coating the coating solution on a substrate and drying it to form a hydrophilic layer, characterized in that the method further comprises a step of allowing the swellable flaky clay mineral particles to be swollen with a solvent to divide into flakes having an average thickness of not more than 100 nm; and
38. a heat sensitive planographic printing plate comprising a support having thereon an image forming layer exhibiting reduced hydrophilicity on heating, characterized in that the image forming layer further contains thermally fusible particles, the surface of which is covered with a material exhibiting a thermal conductivity of 0.10 to 70 $Wm^{-1}K^{-1}$.

DETAILED DESCRIPTION OF THE INVENTION

A support for printing plates comprises a substrate and at least one component layer, in which the component layer contains porous particles. The component layer may be a single layer or plural layers. There may be further provided layer(s) other than the component layer, such as a sublayer which improves adhesion between the substrate and the component layer, or an anticurl layer. The component layer is preferably hydrophilic. Herein, the expression "hydrophilic" means that it is receptive to water and repulsive to an oil component such as an ink. Or it means that a contact angle between water and the layer is not more than 30°, more preferably not more than 10°, and still more preferably not more than 5°. Alternatively, it means that water is more receptive, as compared to a non-hydrophilic layer or a non-hydrophilic portion of an ink-receptive, image recording layer.

The component layer preferably contains a light-to-heat converting material. The component layer preferably contains flaky inorganic particles. Further, the component layer preferably contains metal oxide particles having an average particle size of not more than 100 nm. Furthermore, the component layer preferably contains inorganic particles exhibiting a Mohs hardness of not less than 5. Materials contained in the component layer will be further explained.

Light-to-heat converting material

Employed as a material having a function of converting light to heat can be a material having the function of converting infrared rays to heat, which is absorptive in the infrared region. The infrared region means the wavelength region of 700 nm or more, and preferably 750 nm or more. Examples of light-to-heat converting materials include generally known infrared absorbing dyes including organic compounds such as cyanine dyes, chloconium dyes, polymethine dyes, azulenium dyes, squalanium dyes, thiopyrylium dyes, naphthoquinone dyes, and anthraquinone dyes; and organic metal complexes of phthalocyanine type, naphthalocyanine type, azo type, thioamide type, dithiol type, and indoaniline type. Exemplary examples thereof are described in JP-A 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. The compounds may be used alone or in combination. When the component layer is hydrophilic, a water soluble dye can readily be uniformly dispersed without causing aggregation of the dye, leading to enhanced light-to-heat conversion efficiency. A sparingly water-soluble dye can keep fastness as well as water-resistance.

Among light-to-heat converting materials having absorption in the infrared region, an electroconductive one is preferred, including semiconductors. Although the reason is not definitely clarified, when a conductive light-to-heat converting material is contained in the layer, adhesion of ink to a non-imaging area is improved, specifically in printing by the use of dampening water, leading to improved recovery from stains. Examples of such materials include metals, conductive carbon, graphite, and conductive metal oxides. Of these is preferred a conductive metal oxide. Any metal is usable, so far as it is comprised of fine particles having an average size of not more than 0.5 $\mu$m, preferably not more than 100 nm, and more preferably not more than 50 nm. Any particle form is feasible, including spherical, flaky or needle-like forms. Specifically, colloidal fine metal particles (such as Ag or Au) are preferred.

Preferred conductive carbon includes furnace black and acetylene black. Particle size (represented in terms of $d_{50}$) is preferably not more than 100 nm, and more preferably not more than 50 nm. The conductivity character as defined below, is preferably not less than 30, and more preferably not less than 50:

$$\text{Conductivity character}=(\text{specific surface area [m2/g]}\times\text{DBP oil-absorbing amount [ml/100 g]})^{1/2}/(1+\text{volatile amount})$$

Preferred graphite is fine particles having an average size of not more than 0.5 $\mu$m, preferably not more than 100 nm, and more preferably not more than 50 nm.

Preferred conductive (or semi-conductive) metal oxides include ZnO, ZnO doped with Al, $SnO_2$, $SnO_2$ doped with Sb (ATO), $In_2O_3$ doped with Sn (ITO), $TiO_2$ and TiO obtained by reducing $TiO_2$ ( titanium oxide nitride, generally known as titanium black). Materials in which a core material (such as $BaSO_4$, $TiO_2$, $9Al_2O.2B_2O$ and $K_2O.nTiO_2$) is covered with these metal oxides, is also usable. The particle size thereof is preferably not more than 0.5 $\mu$m, more preferably not more than 100 nm, and still more preferably not more than 50 nm. Of these conductive metal oxides, those which do not color (i.e., colorless or white) when incorporated in the layer, are preferred. Such materials include ATO or ITO used as a transparent conductive membrane, and ATO or ITO covering a transparent core material.

It is important that the light-to-heat converting material be uniformly distributed in the coating layer. It is preferred to disperse the light-to-heat convering material alone or in combination with another coating component, by mechanical means, to form a coating solution, in which a dispersing agent may be used. The content of the light-to-heat converting material id preferably 1 to 40%, and more preferably 2 to 20%, based on the component layer. In cases where the light-to-heat converting material is used in the form of a dispersion of solid particles, at least 80% of the total particles is accounted for by particles having a particle size (including secondary or more aggregation particle size) of not more than 2 $\mu$m, preferably not more than 1 $\mu$m, and more preferably not more than 0.5 $\mu$m. Specifically, it is preferred that the solid particles be dispersed in the form of primary particles. The primary particle size is preferably 1 nm to 1 $\mu$m, and more preferably 10 nm to 0.5 $\mu$m.

Porous Particles

In the invention, the component layer contains porous particles. The porous particles in the state before being dispersed preferably have a pore volume of not less than 0.5 ml/g, more preferably not less than 0.8 ml/g, and still more preferably not less than 1.0 ml/g and not more than 2.5 ml/g. Porous organic particles such as alginate particles (e.g., calcium alginate particles) may be used, and porous inorganic particles are preferred. Preferred examples of the porous inorganic particles include porous silica and porous aluminosilicate, but are not limited to these.

Porous Silica or Porous Aluminosilicate

Porous silica can be prepared in a wet process or a dry process. In the wet process, gel obtained by neutralizing an aqueous silicate solution, or precipitates deposited by neutralization are dried and pulverized to obtain the particles. In the dry process, silicon tetrachloride is calcined with hydrogen and oxygen to form silica particles. Porosity or the particle size of the thus prepared silica can be controlled by adjusting the manufacturing conditions. Porous silica particles are preferably those which are prepared according to the wet process. Porous aluminosilicate particles can be prepared according to the method described in JP-A 10-71764, which are amorphous composite particles synthesized through hydrolysis using, as main components, aluminum alkoxide and silicon alkoxide. In this case, another metal alkoxide may further be added during preparation to form composite particles containing three or more components. The thus prepared composite particles can be controlled by adjusting the manufacturing conditions, with respect to porosity and particle size. The pore volume is closely related to water-receptivity of the coating layer. A high pore volume is superior in water receptivity, preventing staining at the time of printing and leading to increased water latitude. The particles size, at the time of being incorporated in the hydrophilic layer (including the case in which the particles have been subjected to dispersion grinding treatment), is preferably not more than 1 $\mu$m, and more preferably not more than 0.5 $\mu$m. In cases where coarse particles are present, porous, sharp protrusions are formed on the hydrophilic layer surface and ink easily remains around the protrusion, resulting in staining in non-imaging areas.

Zeolite Particles

Zeolite particles may be employed as porous inorganic particles. The zeolite particles need not meet the range of the pore volume described above. Zeolite is a crystalline aluminosilicate and a porous material having a regular three-dimensional network structure with voids of 0.3 to 1 nm. Natural or synthetic zeolite is represented by the following general formula:

$$(M^{I}, M^{II}{}_{1/2})m(Al_mSi_nO_{2(m+n)}).^xH_2O$$

where MI and MII represent an exchangeable cation, $M^I$ is $Li^+$, $Na^+$, $K^+$, $Ti^+$, $MeN^+$ (TMA), $Et4N^+$ (TEA), $Pr4N^+$ (TPA), $C_7H_{15}N_2{}^+$, and $C_8H_{16}N^+$, and $M^{II}$ is $Ca^{2+}$, $Mg^{2+}$, $Ba^{2+}$, $Sr^{2+}$, $C_8H_{18}N2^{2+}$; n≧m and M/n (i.e., Al/Si) is not more than 1, the higher the ratio of Al/Si is, the more exchangeable cations are contained, leading to higher polarity and enhanced hydrophilicity. The ratio of Al/Si is preferably 0.4 to 1.0, and more preferably 0.4 to 1.0.

Zeolite particles used in the invention are preferably synthetic zeolite particles, in which the Al/Si ratio is stable and particle size distribution is relatively sharp. Examples thereof include Zeolite A: $Na_{12}(Al_{12}Si_{12}O_{48}).27H_2O$ with a Al/Si ratio of 1.0; Zeolite X: $Na_{86}(Al_{86}Si_{106}O_{384}).264H_2O$ with a Al/Si ratio of 0.811; and Zeolite Y: $Na_{56}(Al_{56}Si_{136}O_{384}).250H_2O$ with a Al/Si ratio of 0.412. Hydrophilicity of the component layer is enhanced by containing hydrophilic porous particles of a Al/Si ratio of 0.4 to 1.0, preventing staining during printing and increasing the water latitude. Further staining due to finger print is also improved. The particle size incorporated in the layer is preferably not more than 1.0 $\mu$m, and more preferably not more than 0.5 $\mu$m. In cases where coarse particles are present, porous, sharp protrusions are formed on the hydrophilic layer surface and ink easily remains on the protrusion or in the vicinity thereof, resulting in staining in a non-imaging area.

Content of Porous Particles

The porous particles contained in the layer are preferably in an mount of 20 to 95 wt %, and more preferably 30 to 80 wt %, based on the total layer(s).

Fine Metal Oxide Particles with an Average Size of 100 nm or Less

Examples of fine metal oxide particles with an average size of 100 nm or less include colloidal silica, alumina sol, titania sol and other metal oxide sols. The fine metal oxide particles may take any common form, including spherical, needle-like, feather-like or other forms. The average particle size is preferably 3 to 100 nm. A few kinds of fine metal oxide particles different in the average particle size may be blended. The particle surface may also be treated. The fine metal oxide particles can be used as a binder, employing their film-forming property. Reduction in hydrophilicity is less than the use of an organic binder so that it is suitable to be used in a hydrophilic layer. Specifically, colloidal silica, which exhibits a high film-forming property, even at a low temperature, is preferred. In the case of colloidal silica, the smaller the particle size, the stroner is the binding strength. However, when exceeding 100 nm, the binding strength is lowered, leading to insufficient strength as a binder. In cases when the fine metal oxide particles are used with porous silica particles, the fine particles are used preferably in a positive-charged form, for example, in the form of alumina sol or acidic colloidal silica. In cases when the fine metal oxide particles are used with porous aluminosilicate particles and/or zeolite particles, the fine particles are used preferably in a negative-charged form, for example, in the form of alkaline colloidal silica. In cases when used with porous silica particles and porous aluminosilicate particles and/or zeolite particles, for example, it is preferred to use colloidal silica which has been surface-treated with aluminum to provide stability within a broad pH range. The fine particles are contained preferably in an amount of 1 to 90% by weight, more preferably 10 to 70% by weight, and still more preferably 20 to 60% by weight of the layer. Inorganic particles having a Mohs hardness of 5 or more Non-porous metal oxide particles (such as silica, alumina, titania, zirconia, iron oxide, chromium oxide, etc.), metal carbide particles (such as silicon carbide), boron nitride particles and diamond particles are included. Particles without acute angles are preferred, which are basically spherical particles, such as fused silica particles and silous balloon particles. As a characteristic of "non-porous", the specific surface area represented by a BET value is preferably not more than 50 $m^2/g$, and more preferably not more than 10 $m^2/g$. The average particle size thereof is preferably 1 to 2 (and more preferably 1.1 to 1.5) times the thickness of a hydrophilic layer. The particle size distribution preferably is narrow; and at least 60% of the total being included preferably within the range of 0.8 to 1.2 times the average particle size and particles having sizes of 2 or more times the average particle size preferably account for 5% or less. The thickness of the component layer is preferably 0.2 to 10 $\mu$m, and more preferably 0.5 to 5 $\mu$m. The average particle size is preferably 0.2 to 20 $\mu$m, and more preferably 0.5 to 10 $\mu$m. The content of particles having a Mohs hardness of 5 or more is preferably 1 to 50 wt %, and more preferably 3 to 30 wt %, based on the total layer(s).

Flaky Inorganic Particles

Flaky inorganic particles used in the invention preferably have an average particle size (in which the particle size means the maximum length of the particle) of 20 $\mu$m or less, in the state of being contained in the component layer (including the case which has been subjected to swelling and peeling-off steps), exhibiting an average aspect ratio (ratio of the longest length of the grain to its grain thickness) of 20 or less. Inorganic particles having an average particle size of 10 $\mu$m or less and an aspect ratio of 50 or more are more preferred. Continuity and flexibility in the direction of the flat plane of the component layer is provided by meeting the range described above, preventing cracking and forming a tough layer. Further, staining in non-imaging areas or on the blanket is also prevented. Examples of the flaky inorganic particles include clay minerals such as kaolinite, halloysite, chrysotile, talc, smectite (montmorillonite, beidelite, hectorite, saponite, etc.), vermiculite, mica, and chlorite; hydrotalcite, layered polysilicate (e.g., kanemite, macatite, iarite, magadyte, kenyte, etc.). Of these inorganic particles, it is contemplated that the higher charge density of a unit layer, the higher the polarity and the higher the hydrophilicity. The charge density is preferably not less than 0.25, and more preferably not less than 0.6. Such minerals having a higher charge density include smectite (with negative charge density: of 0.25 to 0.6), vermiculite (with negative charge density of 0.6 to 0.9), mica (with negative charge density of up to 1, hydrotalcite (with positive charge density of up to 2) and magadyte (with negative charge density of up to 1; negative charge). Specifically, synthetic fluoromica, which has a stable image quality and is commercially available, is preferred. Of layered mineral particles such as synthetic fluoromica, those which swell, are preferred, and those which swell more freely, are more preferred. Further, an intercalation compound (such as a pillared crystal) of the layered minerals described above, layered minerals which have been subjected to ion-exchange treatment, and those which have been subjected to surface-finishing (such as silane coupling agents) are also employed. The flaky inorganic particles is contained preferably in an amount of 1 to 50 wt %, and more preferably 3 to 30 wt %, based on the total weight of the component layers).

Degree of Orientation to Substrate of Flaky Inorganic Particles

When the flaky inorganic particles are present in the component layer so that the particle plane is oriented parallel to the surface of the substrate, strengthening of the layer is most efficiently effected. The degree of orientation of flaky inorganic particles can be controlled by employing coating of the component layer in which shearing force is lengthwise applied and by adjusting the shearing force. For example, using a reverse roll coater or extrusion coater, the degree of orientation can be controlled by adjusting the solid content of a coated layer, the wet layer thickness or the coating speed. The degree of orientation can be enhanced by subjecting the coated layer to a calendering treatment after coating and drying the layer to compress it. The degree of orientation can be determined by observing the section of the support with scanning electromicroscope (SEM). Thus, an angle (θ) between a line of the substrate surface in the section of the support and a line of the section of a flaky particle observed in the component layer is measured to determine a value of cos θ. In this case, when the line is curved, a line approximated by a first-order equation is used. Similarly, measurements are repeated to determine cos θ and an average value of cos θ is defined as a degree of orientation. The degree of orientation is preferably not less than 0.7, and more preferably not less than 0.8. A degree of orientation of less than 0.7 may result in insufficient strengthening of the coated layer or an increase of unwanted surface roughness, leading to staining in non-imaging areas or on the blanket. Dispersingly pulverizing of porous particles or dispersingly peeling of flaky inorganic particles The pulverization process of porous particles with mechanically dispersing (hereinafter, also simply referred to as dispersingly pulverization) and the peeling and pulverization process of flaky particles with mechanically dispersing (hereinafter, also simply referred to as dispersingly peeling) is performed through a dry process or a wet process. The dry process of dispersingly crushing does not further need a drying process and is simple. However, the wet process is more advantageous for dispersedly-crushing up to a submicron order or dispersingly-peeling of a flake thickness of 100 nm or less than the dry process. Examples of a dry-processed pulverization apparatus include a high-speed rotating impact shearing type mill (such as an annular type ionizer), an air-type crusher (such as a jet mill), a roll type mill, a dry medium-stirring mill (such as a ball mill) and compression shearing type crusher (such as an angmill). Examples of a wet-processed pulverization apparatus include a wet-processed medium-stirring mill (such as a ball mill and aquamizer) and a high-speed rotating, shearing friction type mill (such as colloid mill). After being subjected to pulverization, the average size of porous particles is preferably substantially not more than 1 μm, and more preferably not more than 0.5 μm. Remaining coarse particles can be removed by classification or filtering. After being subjected to peeling and pulverization, the flaky inorganic particle preferably have an average size (being the longest dimension of the particle) of not more than 20 μm, and more preferably not more than 10 μm; and an average aspect ratio (being the longest dimension of the particle/thickness of the particle) of not less than 20, and more preferably not less than 50. Flaky inorganic material may be swelled before being subjected to peeling and pulverization. Specifically, it is preferred that in the wet process, a coating solution can be prepared without subjecting porous particles or flaky inorganic particles to a drying process. When subjected to drying after pulverization or peeling pulverization, particles often be easily aggregated. Concentration or dilution may be conducted to adjust the solid content of the coating solution. During the process of pulverization or peeling pulverization, a surface finishing agent may be added to modify the surface of the particles. During the process of pulverization or peeling pulverization, other components to be added to a coating solution may be simultaneously added; or after the process of pulverization or peeling pulverization, other components to be added to a coating solution may be simultaneously added and redispersed. It is contemplated that a mechano-chemical reaction simultaneously occurs during the process of pulverization or peeling pulverization, so that in cases when it is dispersed with other components to be added to a coating solution, enhanced strength of the coated layer is often effected.

Swelling Process of Flaky Mineral Particles

In the preparation of a coating solution for a component layer containing swellable flaky mineral particles, it is preferred to provide a process in which the mineral particles are allowed to swell with a solvent to separate it into flakes with an average thickness of 100 nm or less, and more preferably 10 nm or less. Freely-swellable synthetic fluoromica is sufficiently swelled simply by mixing with water and stirring to form a dispersion containing flakes of an average thickness of 10 nm or less. Mg-vermiculite, for example, is subjected to the following ion-exchange treatment to achieve swellability:

Mg-vermiculite+lithium citrate aq.→Li-vermiculite+magnesium citrate aq.

Further, the Li-vermiculite which has been swelled while being restricted under osmotic pressure, is mechanically peeled and pulverized to be separated into flakes of an average thickness of 10 nm or less.

Organic Binder or Organic Additive

In addition to the components described above, an organic binder or additives may be incorporated into the component layer. The organic binder preferably is to be hydrophilic. Preferred examples thereof include proteins such as casein, soybean protein and synthetic proteins; chins; starches; gelatins; polyvinyl alcohol, silyl-modified polyvinyl alcohol, cation-modified polyvinyl alcohol; cellulose derivatives such as methyl cellulose, carboxymethyl cellulose and hydroxyethyl cellulose; polyethylene oxide, polypropylene oxide, polyethylene glycol, polyvinyl ether, styrene-butadiene copolymer, conjugated diene type copolymer latex of methyl methacrylate-butadiene copolymer, acryl-type polymeric latex, vinyl-type polymeric latex, polyacrylamide, and polyvinyl pyrrolidone. Into the component layer may be incorporated cationic resins. Examples of cationic resins include polyalkylene amines such as polyethylene amine and polypropylene amine, or their derivatives; acryl resin containing a tertiary amino group or a quaternary ammonium group; and diacrylamine. The cationic resin may incorporated in the form of fine particles, such as cationic micro-gel described in JP-A 6-161101. Further, a crosslinking agent may be incorporated into the component layer. Examples of the crosslinking agent include melamine resin, isocyanate compounds, isooxazoles, aldehydes, N-methylol compounds, dioxane derivatives, active vinyl compounds and active halogen compounds.

Binder of Aqueous Silicate Solution

As a binder to be incorporated into the component layer, an aqueous silicate solution may also be employed. Alkali metal silicates such as sodium silicate, potassium silicate and lithium silicate are preferred. The ratio of $SiO_2/M_2O$ is so selected that when a silicate is added, the pH of the coating solution is 13 or less (for preventing dissolution of particles).

Inorganic, or Organic-inorganic Hybrid Binder

Inorganic, or organic-inorganic hybrid polymers prepared by the sol-gel method may also be employed as a binder to be incorporated into the component layer. Preparation of inorganic, or organic-inorganic hybrid polymers by the sol-gel method is detailed, e.g., in Application of Sol-Gel Method (by S. Sakuhana, and published by Agne-Shofusha), or literature cited therein.

Organic Component Content

Organic components are contained in the component layer, preferably in an amount of 0 to 30%, more preferably 0 to 10%, still more preferably 0 to 5%, based on the total component layer. So far as this range is met, high durability, high water-resistance and high water-receptivity can be kept.

Substrate

Known materials used as a substrate for printing plates can be employed, including a metal plate, plastic resin film, paper finished with polyolefins, films or sheets made of various ceramics, and a composite substrate laminated with material described above. The substrate thickness is not specifically limited, but preferably 50 to 500 μm, and more preferably 200 to 500 μm . Examples of the metal plate include iron, stainless and aluminum, and aluminum is preferred in terms of the relationship between specific gravity and rigidity. An aluminum plate is conventionally used after subjected to degreasing treatment with acids, alkalis or solvents to remove oil on the surface which was used in rolling or reeling. Degreasing with an aqueous alkaline solution is preferred. In order to enhance adhesion to a coating layer, the coating side is preferably treated to promote adhesion or subbed. For example, after dipping into or coating a solution containing a silane coupling agent such as a silicate or a silane coupling agent, sufficient drying is conducted. Anodic oxidation is supposed to be a method for promoting adhesion. The combination of the anodic oxidation and the dipping or coating described above is also applicable. On the surface which has been subjected to degreasing or anodic oxidation, organic-inorganic sol-gel membrane may be formed according to the method described in JP-A 8-240914. Aluminum plates which have been roughened according to the known method may also be employed. Examples of plastic resin films include polyethylene terephthalate, polyethylene naphthalate, polybutylene terephthalate, polyimide, polyamide, polycarbonate, polystyrene, polyphenylene oxide, cellulose esters, polyvinyl chloride, ABS resin, polyacrylate, polyether ketone, polyethersulfon, polyether imide, polyarylate, polyethylene and polypropylene. Of these are preferred polyethylene terephthalate and polyethylene naphthalate. In order to enhance adhesion to a coating layer, the plastic resin film is preferably treated to promote adhesion or subbed. Treatments for promoting adhesion includes a corona discharging treatment, flame treatment and UV exposure treatment. The sublayer includes a layer containing gelatin or latex. The composite substrate is one which is made by laminating materials described above. Lamination may be made before or after forming the component layer, or immediately before being fitted onto a printing machine.

The component layer according to the invention can be formed on the substrate, for example, as follows. A coating solution for the component layer can be prepared by mixing a dispersion in which porous inorganic particles and/or flaky inorganic particles are mechanically dispersed through pulverization or peeling, a binder such as colloidal silica and other component material(s) and further by dispersing them. Alternatively, porous inorganic particles and/or flaky inorganic particles, a binder such as colloidal silica and other component material(s) are mixed with each other and then subjected to dispersing. Filtration may be optionally applied.

Coating the solution for the component layer onto the substrate can be made by known means in the art, including rotating coating, wire-bar coating, dipping, air-knife coating, roll coating, blade coating, curtain coating and extrusion coating. Drying is conducted at a temperature of 50 to 100° C. in the case of a resin substrate, and 50 to 300° C. in the case of a metal substrate, over a period of 5 sec. to 10 min.

Printing Plate

Next, printing plates will be explained. The printing plate comprises a support having thereon a component layer, which contains porous particles. The support for printing plates described above may be employed in the printing plate of the invention, or another support may be employed. The printing plate of the invention is preferably a planographic printing plate. Various kinds of printing plates described below are those used for CTP (i.e., computer to plate making system), but embodiments of the present invention are not limited to these.

The printing plates of the invention include those in which the component layer itself also play a role as a image recording layer, and those in which an image recording layer is provided besides the component layer. In the former case, the above-described support itself can play a role as a printing plate. In one preferred embodiment of the former case, the component layer is a hydrophilic layer and an imaging area (e.g., exposed area) of the image recording layer becomes ink-receptive. In the latter case where the component layer and the image recording layer are different with each other, the entire image recording layer may be an ink-receptive layer; alternatively, the image recording layer is a hydrophilic layer and an imaging area (e.g., exposed area) of the image recording layer becomes ink-receptive. Various types of image recording layers are employed according to the image forming process. Representative examples are described below.

Image Recording Layer Containing Thermally Fusible Material

The image recording layer is obtained by fixing the thermally fusible material described below. In the case of a component layer containing thermally fusible particles, the component layer may play a role as an image recording layer, or an image recording layer may be provided aside from the component layer.

In the former case where the component layer is also an image recording layer, the component layer contains a thermally fusible material. The component layer is preferably hydrophilic. The component layer may contain light-to-heat converting material, or a light-to-heat converting layer containing a light-to-heat converting material may be provided aside from the component layer (preferably, between the component layer and the substrate). The light-to-heat converting layer may be lipophilic (or hydrophobic). Examples of the light-to-heat material include those described in the support. Further, on the component layer (containing porous particles) may be provided a hydrophilic layer containing porous particles. In this case, after subjected to exposure, the hydrophilic layer is removed by development with dampening water or a developer, while a part of the hydrophilic layer remains, and a thermally fusible material contained in an imaging area (exposed area) of the component layer (image recording layer) bleeds out onto the surface of the remaining hydrophilic layer to make the hydrophilic layer surface ink-receptive. In this embodiment, a water soluble protective layer may be provided on the hydrophilic layer. The hydrophilic protective layer is removable by development. The light-to-heat converting material may be contained in the component layer (image recording layer) or a light-to-heat converting layer may be provided between the component layer and the substrate.

In the latter case where the component layer and the image recording layer are individually provided, the image recording layer includes one to which thermally fusible material is dispersedly adhered by means of electrostatic coating or through fusion and one which is a hydrophilic layer provided on the component layer and containing thermally fusible material. Alternatively, the light-to-heat converting material may be contained in the component layer or the image recording layer. A light-to-heat converting layer containing light-to-heat converting material may be provided aside from the component layer. Examples of light-to-heat converting material include those described in the section of the support. As one embodiment of image forming by using a printing plate having the image recording layer containing a thermally fusible material, when exposed to laser, the thermally fusible material is fused through thermal transfer from the light-to-heat converting material heated upon exposure and bleeds out from the surface of the component layer containing porous particles through pores of the component layer to vary the surface of an exposed area of the image recording layer from hydrophilicity to hydrophobicity.

The image recording layer may contain a matting agent, or a layer containing a matting agent may be provided on the image recording layer. Further, on the image recording layer, there may be provided a protective layer or a cover sheet to prevent ablation. The average thickness of the image recording layer containing thermally fusible material is preferably 0.01 to 5 $\mu$m, more preferably 0.1 to 3 $\mu$m, and still more preferably 0.3 to 2 $\mu$m.

Thermally Fusible Material

Thermally fusible materials used in the invention are preferably ink-receptive. The softening point is preferably 40 to 150° C., and more preferably 60 to 100° C.; and the melting point is preferably 50 to 200° C., more preferably 70 to 200° C., and still more preferably 80 to 150° C. In cases where the softening point is less than 40° C. or the melting point is less than 50° C., storage stability is deteriorated; and where the softening point is more than 150° C. or the melting point is more than 200° C., sensitivity is reduced. Thermally fusible material usable in the invention includes any one which is fused at a temperature of 50 to 200° C., exhibiting fluidity. Examples thereof include parafin, polyolefin, microwax, fatty acid type wax and oxidized polyethylene wax. These have a molecular weight of 800 to 10000, which can be obtained as low-density or high-density polyethylene prepared by conventional high pressure polymerization or low pressure polymerization, or obtained through thermal degradation of polyolefin. To enhance emulsifying property, these waxes may be oxidized to introduce a polar group such as hydroxy group, an ester group, carboxy group, aldehyde group or peroxide group. To lower the softening point or enhance handlability, these waxes may be used in combination. The latter case includes stearylamide, linolenamide, lauroylamide, myrysteruamide, hardened cow fatty acid amide, palmitoamide, oleinic acid amide, rice bran fatty acid amide, palm fatty acid amide, or methylol compounds of these fatty acid amides, methylenebissteraloamide and ethylenebissteraloamide. These compound may be used in combination. Furthermore, cumarone-indene resin, rosin-modified phenol resin, terpene-modified phenol resin, xylene resin, ketone resin, acryl resin, ioonomer and copolymer of these resin are also usable.

The thermally fusible material preferably exhibits a melt viscosity of 500 cps or less, and more preferably 200 cps or less at 140° C. In cases when the melt viscosity is less than 500 cps at 140° C., permeation to the layer containing porous particles is promoted at the time of melting and an imaging area is combined with the layer containing porous particles to strengthen images. The ink-receptive material preferably exhibits a softening point of 150° C. or less and a melting point of 200° C. or less. The ink-receptive material may be covered with a substance exhibiting a softening point of 40° C. or more and a melting point of 50° C. or more. The covering substance may be porous or non-porous. In cases of being non-porous, ink-receptive core material may be liquid at room temperature (i.e., among materials described above, one having a relatively low molecular weight is also usable). Even if the covering substance is not melted at a temperature of not more than 200° C. and if it produces pores or cracks on heating (provided that porous covering substance may not be necessarily varied on heating), fused core material is allowed to bleed out of the covering substance. The covering method can be referred to the known microcapsule forming method, for example, as described in “Microcapsules, their function and application” (edited by T. Kondo, published by Nihon Kikaku Kyokai, 1991). Thermally fusible material or one which are further covered with other substance preferably in the form of thermally fusible particles of an average size of 0.05 to 10 $\mu$m (and more preferably 0.1 to 5 $\mu$m). If the thermally fusible material is in the form of particles, when the image recording layer is provided on the component layer containing porous particles, the thermally fusible material can be uniformly distributed over the component layer. When the average particle size meets the range described above, staining in non-imaging area is prevented and optimum resolution can be achieved. The thermally fusible particles may be in the form of a emulsified dispersion or powder, so far as particles are not aggregated.

The thermally fusible material in unexposed area is fixed, after exposure, on the component layer containing porous particles in such a form that almost of the material is removable by some physical power and/or dissolution with water or a solution. The thermally fusible material in the form of powder, for example, may be allowed to adhere to the surface of the component layer containing porous particles by the known power coating method (such as electrostatic coating) and further to fuse to the layer surface by optimally heating. In this case, the layer surface is preheated and the powder may be adhered and fused to the layer surface at the same time. Specifically, in cases when applying thermal fusion, it is necessary to prevent permeation into the inside of the porous particles as less as possible. This can be achieved by heating air contained in the layer at the time of fusing to expand its volume, preventing the melt from permeating into pores of the particles. The thermally fusible material particles can also be fused by applying ultrasonic, instead of heating. Alternatively, the thermally fusible material particles may be adhered only by van der Waals force of electrostatic force. The thus fixed thermally fusible material, after exposure, is almost removed by some physical force. The thermally fusible material particles are dispersedly adhered onto the surface of the component layer so that the thus particle-adhered component layer may be regarded as an image recording layer, or the thermally fusible material particles adhered to the surface of the component layer may be regarded as a dispersed image recording layer. Preferably, the image recording layer is to be a planar layer. Fixing may be made by using a organic and/or inorganic binder. Thus, this can be done in such a manner that thermally fusible material dispersed in a solution in which a binder is dissolved is coated on the layer containing porous particles, or the binder-dissolved solution is coated on the layer containing porous particles and then the thermally fusible material particles are adhered thereto by the powder coating method, while the binder remains adhesive. In this case, as a binder component easily permeates into pores of the porous particles in the component layer, it is necessary to control a binder concentration of the coating solution so that the pores are not completely filled with the coating solution. This can be achieved by heating air contained in the layer at the time of coating to expand its volume, preventing the coating solution from permeating into pores of the particles. The thus-fixed thermally fusible material in the non-imaging area, after exposure, is almost removed by dissolving the binder with a binder to separate the binder from the surface of the component layer containing porous particles and/or by applying some physical force.

In cases when employing a printer by using dampening water, the binder is preferably water soluble to make it possible to remove the thermally fusible material in the non-imaging area. Water soluble binders usable in the invention include those usable as a hydrophilic binder aforementioned. Specifically, cellulose derivatives such as methyl cellulose, carboxymethyl cellulose and hydroxymethyl cellulose, and polyvinyl alcohol are preferred. As an inorganic binder, metal silicate may be added.

Fine metal oxide particles with a size of 100 nm or less are employed as a binder. Specifically, fine metal oxide particles with a size of 30 to 100 nm, which are relatively weak in binding and do not prevent developability with physical force, are preferred, and colloidal silica within such a size range are particularly preferred. An aqueous binder and the fine metal oxide particles of 100 nm or less may be employed in combination. A matting agent may be incorporated into a layer containing a thermally fusible material to enhance handlability. The particle size of the matting agent is preferably larger than that of the thermally fusible material particles. Organic compound particles are preferred as a matting agent in terms of causing no precipitation in a coating solution, such as particles of PMMA, silicone, and PTFE. These particles may be subjected to surface-finishing or surface-covering.

Further, the surface of thermally fusible particles is preferably covered with material having thermal conductivity of 0.10 to 70 $m^{-1}K^{-1}$ at 300 K. Thereby, marked phase change of hydrophilicity to hydrophobicity in a heated area and high hydrophilicity in a non-heated area are achieved at the same time without causing abrupt sublimation of the thermally fusible particles. Moreover, it also enhances sensitivity and enables high definition screening printing, satisfying requirements in ink affinity in an imaging area, background staining and plate life. Herein, the thermal conductivity k (represented by a unit of $Wm^{-1}K^{-1}$) is defined as heat quantity flown through a board with an area of 1 $m^2$ for 1 sec. when the temperature difference between both side of the board of thickness of 1 m is 1° C.

The thickness of a covering layer is also important and preferably 0.01 to 1.0 μm, and conversely when the thickness is less than 0.01 μm, heat reserving by the covering layer can not be effectuated. When the thickness is more than 1 μm, heat reserving effects tend to be excessive. The layer thickness can be measured by electronmicroscopic observation of an ultrathin slice at the central portion of the particle.

The material covering the thermally fusible particles preferably contains 10 to 100% metal oxide. In cases when they are covered with metal oxide by the dry process, fine metal oxide particles may sometimes be buried in the surface of the thermally fusible particles due to heat of friction, so that the content of a thermally fusible resin in the metal oxide covering layer is not more than 90%. In such case, when a circle is drawn around the center of the thermally fusible particle along the periphery, the region between the minimum and maximum circles in contact with the covering particles is defined as a covering layer and the content is represented by the proportion of the area accounted for by the covering material. The determination thereof can be made using transmission electronmicrographs. The material covering the thermally fusible particles preferably is metal oxide.

Any metal oxide exhibiting a thermal conductivity of 0.10 to 70 $Wm^{-1}K^{-1}$ at 300 K is acceptable and preferred metal oxides are silica, titanium oxide or zinc oxide. Ferromagnetic material is also preferred, including $\alpha$-$Fe_2O_3$, $CoCO_3$, $MnCO_3$, $CrF_3$, $Fe_3O_4$, ferrite, Fe, Ni, Co, and $CrO_2$. Of these are preferred $\alpha$-$Fe_2O_3$, $Fe_3O_4$, ferrite, and $CrO_2$. However, Fe, Ni and Co, which exhibit a high thermal conductivity, are not preferably employed in the invention.

The thermally fusible particles covered with resin can be effectively used in planographic printing plates. In this case is preferred the resin exhibiting a thermal conductivity lower than that of thermal fusible particles. The resin exhibiting a melting point higher than that of the thermally fusible particles is preferably employed.

The average size of the thermally fusible particles covered with a material exhibiting a thermal conductivity of 0.10 to 70 $Wm^{-1}K^{-1}$ is preferably 0.2 to 6.0 μm. An average size of less than 0.2 μm leads to insufficient fluidity at the time of melting and it becomes difficult to make the surface hydrophobic, resulting in insufficiency in ink affinity. An average size of more than 6.0 μm leads to excessive fluidity at the time of melting, resulting in deterioration in high definition-printed images. The average size can be determined by electronmicroscopic observation and is represented by an average value of 100 or more particles.

Next, the content of thermally fusible particles will be described. After covering the surface of the thermally fusible particles with a material exhibiting a thermal conductivity of 0.10 to 70 $Wm^{-1}K^{-1}$, the thermally fusible particles are coated with other materials on a support to form an image forming layer, in which the content of the thermally fusible particles in the image forming layer is preferably 10 to 50% by weight, based on covered particles. In this case, the thermally fusible particles refer to those which have been covered. The content of less than 10% by weight results in reduced sensitivity, and the content of more than 50% by weight leads to enhanced sensitivity but also to reduction in hydrophilicity of non-imaging areas, easily causing background staining.

Next, hydrophilic material used in the invention will be described. Hydrophilic material which uniformly disperses thermally fusible particles and light-to-heat converting material to form a film and keep the surface hydrophilic includes inorganic fine self-film-forming particles. The expression, fine self-film-forming particles refers to fine particle material exhibiting durability as film after being dried alone.

Examples of the fine inorganic self-film-forming particles include silica (colloidal silica), water glass, alumina or its hydrate (e.g., alumina sol, colloidal alumina, aluminum polyhydroxide, cationic aluminum oxide or its hydrate, pseudo boehmite, etc.) and surface-finished cationic colloidal silica. These fine inorganic particles are usually employed in the form of particles dispersed in a solvent and maintaining a primary particle diameter. Exemplarily, colloidal silica is commercially available as Snowtex series (available from Nissan Kagaku Co. Ltd.), Cataloid S-series, Fine Cataloid f-120, USBB-120, etc. (available from Shokubai Kagaku Co. Ltd.) and Rudox series (available from Du Pont Co.). Examples of alumina sol include Alumina Sol (available from Nissan Kagaku Co. ltd.), Cataloid A-series (available from Shokubai Kagaku Co. Ltd.) and Nano-whisker series (available from Daiichkigenso Kagakukohgyo Co. Ltd.). These may be used alone or in combination thereof. In cases where used in combination, a combination of particles having the same skeleton with each other is specifically preferred. The inorganic fine self-film-forming particles is contained in an image forming layer in an amount of 30 to 80% by weight, based on the entire image forming layer. The content of less than 30% by weight leads to reduced hydrophilicity of the surface and the content of more than 80% by weight reduces changeability from hydrophilicity to hydrophobicity in an exposed area. A hydrophilic resin may be used in combination as far as the image forming layer surface is kept highly hydrophilic. Any known hydrophilic resin may be usable. Examples thereof include polyvinyl alcohol, polysaccharide, polyvinyl pyrrolidone, polyethylene glycol, gelatin, glue, casein, hydroxyethyl cellulose, carboxymethyl cellulose, methyl cellulose, hydroxyethyl starch, sacchulose octaacetate, ammonium alginate, sodium alginate, polyvinylamine, polyallylamine, polystyrene sulfonic acid, polyacrylic acid, polyamide, polyacrylamide, anhydrous maleic acid copolymer, polyurethane and polyester. These compounds are used alone or in combination as a main component. Conventional known hardening agents may be incorporated to enhance layer strength.

The light-to-heat converting material used in the invention will be described. The light-to-heat converting material is preferably one which efficiently absorbs light and is capable of converting it to heat. Depending on the kind of light sources used, in cases where using a semiconductor laser emitting near-infrared light as a light source, organic compounds such as carbon black, cyanine dyes, polymethine dyes, azulenium dyes, squalium dyes, thiopyrylium dyes, naphthoquinone dyes and anthraquinone dyes; and phthalocyanine type, azo type, and thioamide type organic metal complexes are optimally used. Exemplary examples thereof are described in JP-A 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476.

Next, a filler used in the invention will be described. Fillers are employed to enhance hydrophilicity, layer strength and resistance to wear-out in a non-imaging area. Examples of inorganic type particles include silica (silicon oxide), aluminum oxide, titanium oxide, aluminosilicate, magnesium oxide, zinc oxide, calcium alginate, barium sulfate, calcium carbonate and zirconium type fine particles. Examples of organic type particles include acryl particles such as polymethyl methacrylate (PMMA), styrene type particles olefin type particles such as polyethylene or polypropylene, fluoro-type particles such as polytetrafluoroethylene, other radical polymerization type polymer particles, and condensation type polymer particles such as polyester or polycarbonate.

Inorganic type particles and organic type particles are applicable in the invention, and inorganic type particles are preferred in terms of hydrophilicity and wear resistance. The filler used in the invention is preferably one which is readily dispersible in water. Silica particles or aluminosilicate particles, which can enhance chemical wettability, are specifically preferred. Monodispersed particles having a narrow size distribution are more preferred. The water-dispersible particles used in the invention are preferably 0.2 to 10 μm in terms of an average particle size obtained by light scattering type measurement such as a Coulter counter, and more preferably 0.3 to 7 μm. Particles having such an average size can be used preferably within a range of 0 to 80% by weight, more preferably 1 to 60% by weight, and still more preferably 2 to 50% by weight. Such setting enhances strength as a support and achieves higher hydrophilicity. The particles may be used in the form of a mixture of two or more kinds of the same kind and/or different kinds of particles. Specifically, a combination of particles which are the same in kind but different in size is preferred in terms of controlling the surface form.

The thickness of the image forming layer needs to be controlled in relation to the size of the thermally fusible particles, the outer surface of which has been covered. The image forming layer thickness is preferably 110 to 500%, based on the average size of the covered, thermally fusible particles. In cases when the layer thickness is less than 110% of the average particle size, many thermally fusible particles are exposed on the surface and when brought into physically strong contact, the surface is changed to hydrophobicity, tending to become ink-receptive. In cases when the layer thickness is more than 500%, on the other hand, it becomes difficult to allow the thermally fusible particles to be orientated by magnetic power and the particles are localized on the surface or under the surface, making it difficult to control the image forming functions.

The printing plate according to the invention may be provided with a water soluble protective layer to enhance storage stability. Any material which can readily be removed by washing may be used as a material for the water soluble protective layer, including compounds containing a water-solubilizing group such as hydroxy, carboxy, group having a (secondary or tertiary) amine, amino, amido, carbamoyl, sulfonic acid group, sulfonamido, phosphonic acid group, mercapto group, and an alkyl ether group. Exemplary examples thereof include polyvinyl alcohol, polysaccharide, polyvinyl pyrrolidone, polyethylene glycol, gelatin glue, casein, hydroxyethyl cellulose, carboxymethyl cellulose, methyl cellulose, and hydroxyethyl cellulose. These compounds may be used alone or in combination.

The method for covering the surface of the thermally fusible particles will be described below. In the preparation of printing plates according to the invention, the surface of the thermally fusible particles, which is covered with material exhibiting a thermal conductivity of 0.10 to 70

$Wm^{-1}K^{-1}$ at 300 K, is incorporated into a dispersing solution of other image forming material(s), coated and dried. Methods for covering the outer surface of particles with another material, i.e., methods for preparing microcapsules include wet-covering methods such as interfacial polymerization, interfacial polycondensation, an in-situ method, a submerged covering method, coacervation method (each of which is a phase separation method from an aqueous solution), a phase separation method from an organic solvent, a fusion-dispersing and cooling method, an aerial suspension covering method and a spray drying method; and a dry-covering method such as an electrostatic adsorption method. In embodiments of the invention, the thermally fusible particles are covered by a sol-gel method, a spray drying method or an electrostatic adsorption method to prepare a printing plate.

A representative sol-gel method usable in the invention is a process in which hydrolysis and polycondensation of a metal alkoxide are allowed to proceed on the surface of the thermally fusible particles to cover the surface with a gel membrane of a metal oxide or a metal hydroxide. In this case, a thermally fusible resin containing a polar group capable of promoting adsorption of the metal alkoxide is preferably employed. Preferred examples thereof include an emulsion of ethylene-acrylamide copolymer, ethylene-acrylic acid copolymer, ethylene-glycidyl acrylate copolymer, ethylene-maleic acid copolymer or ethylene-vinyl acetate copolymer. A resin having a siloxane skeleton, such as silicone-acryl resin may also be employed. Any alkoxide may be used, and metals such as silica, alumina, titanium and zirconium are usable. Prior to covering the thermally fusible particles with an inorganic material, it is preferred to modify the particle surface with a silane coupling agent, whereby the silane coupling agent is allowed to be attached to the particle surface to cause a hydrolysis group capable of binding with the inorganic material to be orientated on the surface. Hydrolysis of the metal alkoxide on the surface of the thermally fusible particles can be done by adding the thermally fusible particles to an aqueous or alcoholic dispersion of the metal alkoxide or by adding an aqueous or alcoholic dispersion of the metal alkoxide to the thermally fusible particles. The thermally fusible particles may be in the form of powder or an emulsified dispersion. After hydrolysis, the dispersion may be used as such, and preferably, the dispersion is dried by heating at a temperature lower than the melting point of the thermally fusible particles or by evaporation under reduced pressure. In this case, it is preferred to combine mechanical dispersion to prevent aggregation of the thermally fusible particles. Thereby, an inorganic material gelled in a dispersing solution can be allowed to be adsorbed onto the particle surface by electrostatic forces. Gel condensed in a dispersing solution without being formed on the particle surface may be added to a coating solution as such, or separated from the thermally fusible particles.

In the method of covering the thermally fusible particles with an inorganic material by the submerged polymerization, a polymer containing an alkali metal salt is allowed to be cross-linked with a polyvalent metal ion on the surface of the thermally fusible particles to cover the particles with a polymeric membrane of a metal oxide or metal hydroxide. Examples of the polymer containing an alkali metal salt include poly(sodium acrylate), poly(potassium acrylate), poly(sodium vinylcarboxylate), poly(potassium vinylcarboxylate), poly(sodium vinylsulfonate) and poly (potassium vinylsulfonate). Of these are preferred poly (sodium acrylate) and poly(potassium acrylate). Examples of the polyvalent metal ion include $Al^{3+}$, $Fe^{3+}$, $Zn^{2+}$, $Fe^{2+}$, $Ca^{2+}$, $Mg^{2+}$ and $Mn^{2+}$. Of these metal ions is preferred $Al^{3+}$. The inorganic material to obtain a polymeric membrane of a metal oxide or metal hydroxide is preferably an alkali metal silicate, and preferably sodium silicate or potassium silicate. For example, thermally fusible particles and a polymer containing an alkali metal salt are stirred in a liquid and a polyvalent metal salt is added thereto to allow a polymer cross-linked with a polyvalent metal ion to be deposited on the surface of the thermally fusible particles. Further, an alkali metal silicate is added to cause a reaction of the silicate with the polyvalent metal ion to form a polymerized membrane on the surface of the polyvalent metal salt-crosslinked polymer which covers the thermally fusible particles.

In the method of covering the thermally fusible particles with an inorganic material by the spray-drying method, a dispersion liquid of thermally fusible particles and a covering material is sprayed using a spray gun to finely grain liquid and dried to form covered thermally fusible particles. In this case, the particle surface is physically covered, so that so far as spraying and drying are feasible, any material to form a dispersion is usable to cover the particles. The spray gun used in the invention is referred to as an apparatus which finely grains liquid and delivers them to the receiving surface. Examples thereof include air spray, air-less spray, electrostatic air spray and electrostatic atomizing spray. To finely grain the dispersion liquid of thermally fusible particles and a covering material by means of a spray gun, a system in which the dispersion liquid is added dropwise to a cup or disc rotating at a high speed (e.g., 10,000 to 100,000 rpm) to form fine-grained liquid and spreading or a flying distance is controlled by electrostatic force. An air flow (i.e., electrostatic atomizing spray) is preferred in terms of fineness and uniformity of sprayed droplets. It is preferred that the sprayed droplets are dried to solidify before attaching to the receiver surface. The thus received thermally fusible particles are preferably separated to particles by mechanical dispersing means. The method of covering thermally fusible particles with an inorganic material and dispersing them in a coating solution is also referred to JP-B 4-18297 (herein, the term, JP-B means published Japanese Patent).

In the method of covering thermally fusible particles with an inorganic material by the electrostatic adsorption method, the thermally fusible particles and the covering material are mixedly dispersed by a dry process to generate frictional electrostatic force on the particle surface and fine powdery inorganic material is allowed to adsorb onto the particle surface. Thus, in this method, the thermally fusible particles are not fused by frictional heat nor deformed by collision with the inorganic material particles, and the particle surface is charged. On the other hand, the inorganic material is pulverized by mutual collision and the resulting powdery material is electrostatically adsorbed onto the surface of the thermally fusible particles. In this case, the thermally fusible particles are not ground, therefore, it is necessary to use particles with desired sizes. The inorganic material can be pulverized to the desired size. The final size of the inorganic material is preferably not more than 1/10 of the size of the thermally fusible particles in terms of adsorption efficiency. Alternatively, using fine inorganic material particles having a previously selected size distribution, it is possible to allow the particles to be adsorbed without being ground or pulverized. It is preferred to subject them to cooling to prevent fusion of the thermally fusible particles by excessively generated frictional heat during mixedly dispersing, or to subject them to a heating treatment at a temperature lower than the meting point of the thermally fusible particles after covering the thermally fusible particles with inorganic material.

There will be described a method in which after covering the thermally fusible particles with a magnetic material, the particles are dispersed, coated, and prior to drying, the arrangement of the particles in the coated layer is controlled by magnetic force. In this method, for example, the thermally fusible particles which have been covered with magnetic material, such as ferrite, are coated as an image forming material and before the coated layer on a support is dried, the arrangement of the particles in the coated layer is precisely controlled by magnetic force. Preferred examples of the magnetic material include the afore-mentioned metal oxides such as $\alpha$-$Fe_2O_3$, $Fe_3O_4$, ferrite and $CrO_2$. The thermally fusible particles are covered with the magnetic material, preferably by the electrostatic adsorption method. Alternatively, the thermally fusible particles and the magnetic material may be subjected to kneading and grinding. The thermally fusible particles covered with a magnetic material are dispersed together with a light-to-heat converting material and a hydrophilic material and then coated onto a support by any means, such as dip coating, air-doctor coating, curtain coating or hopper coating. Simultaneous multi-layer coating may also be applied as described in U.S. Pat. Nos. 2,781,791 and 2,941,898. A permanent magnet or a magnetic coil is provided at the position between a coating section and drying zone, so that thermally fusible particles in the coated layer are orientated by magnetic force. The permanent magnet or magnetic coil may be positioned over or under the transporting web. Plural permanent magnets or magnetic coils may also be provided. In cases where the thermally fusible particles are orientated in the lower portion of the coated layer, magnetic force is applied to allow the particles to orientate themselves to the layer surface. In cases where the particles are orientated in the upper portion of the coated layer, magnetic force is applied to allow the particles to orientate themselves to the lower portion of the layer. It is important to apply magnetic force so that after being dried, the thermally fusible particles are orientated near the surface without being exposed on the surface. Permanent magnets or magnetic coils exhibiting a surface magnetic flux density of not less than 3,000 gauss are preferably employed. The magnetic force is applied preferably over a period of 0.1 to 5 sec.

Material which is not completely thermally fusible is also usable as a thermally adherent material. In cases where a component layer and an image recording layer are different, and the image recording layer contains a thermally adherent material, the thermally adherent material adheres to the component layer upon exposure and image recording layer components other than the thermally adherent material adhered onto the component layer are removed during development.

Exposing Method

It is preferred to expose to infrared laser. An exposure apparatus conventionally used in CTP can be employed. Exposure energy is preferably 100 to 500 $mJ/cm^2$. Developing method by physical force or dissolution It may be performed by scrubbing off by a brush or sponge. An adhesive material such as adhesive sheet or self-adhesive tape is brought into contact with the surface to perform stripping-off.

It may also be performed by dissolving a binder fixing a thermally fusible material (and by physical force). For example, it is performed by dipping into or flowing a solution which can dissolve a binder, while rubbing by a brush or a sponge. It may be scrubbed with a sponge containing the solution.

Developing Method in Printing Machine

A printing plate is attached to a plate cylinder and brought into contact with at least one of a dampening water supplying roller, an ink supplying roller and a blanket cylinder with rotating the plate cylinder. Thermally fusible material in a non-imaging area is removed as a result of either one or the composite of binder dissolution by dampening water or an ink solvent and peeling-off by contact with each roller. Alternatively, a developing apparatus (which may be any one capable of removing the thermally fusible material in a non-imaging area) is exclusively installed into a printing machine, thereby removing the thermally fusible material in a non-imaging area. Material which is to be removed from the printing plate surface in the printing machine is preferably colorless or white. A strongly colored material may produce problems such as staining in the printing machine or color mixing in printed material.

Image Recording Layer Formed by Ink Jet Method

Using a commonly-known ink jet method, an ink-receptive material is imagewise adhered onto a hydrophilic component layer to form an image recording layer. In this case, the component layer and the image recording layer are different each from the other. The ink-receptive material is water resistant. Hot-melt or a thermosetting or photohardenable material which is hardenable on heating or exposing to light after forming images. The thermosetting material and photohardenable material are described in JP-A 9-99662.

Image Recording Layer Formed by Thermal Transfer Method

Using a commonly known thermal transfer method, a sheet having an ink-receptive thermal transfer layer (image recording layer) on a component layer is brought into contact with a hydrophilic component layer and is heated imagewise from the sheet side by a thermal head or laser light to transfer a heated thermal transfer layer portion from the sheet to the component layer surface. After peeling the sheet, an image recording layer is imagewise formed on the component layer. In this case, the component layer and image recording layer are different each from the other.

Image Recording Layer Formed by Electrophotography

Using commonly known electrophotography, an ink-receptive material is allowed to imagewise adhere onto a hydrophilic component to form an image recording layer. In this case, the component layer and image recording layer are different each from the other. The ink-receptive material is water resistant. Hot-melt or a thermosetting or photohardenable material which is hardenable on heating or exposing to light after forming images. The thermosetting material and photohardenable material are described in JP-A 9-99662.

Photosensitive or Thermosensitive Image Recording Layer

Commonly known photohardenable or photosolubilizable photosensitive layer (image recording layer) is coated on a hydrophilic component layer and after exposure, soluble portions are removed by development to imagewise form an image recording layer. Commonly known thermohardenable (e.g., by infrared rays) or thermosolubilizable (e.g., by infrared rays) photosensitive layer (image recording layer) is coated on a hydrophilic component layer and after exposed to laser, soluble portions are removed by development to imagewise form an image recording layer. In these cases, the component layer and image recording layer are different each from the other.

Examples of the photosensitive layer described above include a photosensitive composition layer containing a polycondensation resin of a polyhydroxyphenol and a ketone or aldehyde, o-naphthoquinonediazidosulfonic acid ester and alkali-soluble resin; a photosensitive composition layer containing a polymeric compound having a hydroxyphenyl methacrylamide moiety and a o-quinonediazide compound; a photosensitive composition layer containing a polycondensation polymer of phenol, m-and p-cresol and aldehyde, and o-quinonediazide compound; a photosensitive composition layer containing a o-quinonediazide compound, a s-triazine compound, a dye capable of changing color upon reaction with a photolytic product of the s-triazine compound, and an alkali-soluble resin; a photosensitive composition layer containing a compound having at least a addition-polymerizable ethylenically unsaturated double bond, a compound having aromatic hydroxy group in its side chain and/or a compound having aliphatic hydroxy group in its side chain, an alkali-soluble or alkali-swellable acidic vinyl copolymer, a photopolymerization initiator and a diazo resin; a photosensitive composition layer containing an acid generating agent, acid-decomposable compound, and an infrared absorbent; and a photosensitive composition layer containing an acid generating agent, an acid-insolubilizable compound and an infrared absorbent.

The photosensitive image recording layer preferably contains an infrared absorbing dye and a novolac resin of condensation polymer of a phenol and an aldehyde or ketone. The embodiment containing an infrared absorbing dye and a novolac resin of condensation polymer of a phenol and an aldehyde or ketone will be further described below.

Photosensitive Layer

Infrared Absorbing Dye

A dye having absorption in the infrared region (hereinafter, denoted as an infrared absorbing dye) has an absorption at wavelengths of 700 nm or more (preferably 700 to 850 nm), exhibiting a molar extinction coefficient (ϵ) of 105 or more. Examples of infrared absorbing dyes include cyanine type dyes, squalium type dyes, chroconium type dyes, azulenium type dyes, phthalocyanine type dyes, naphthalocyanine type dyes, polymethine type dyes, naphthoquinone type dyes, thiopyrylium type dyes, dithiol metal complex type dyes, anthraquinone type dyes, indoaniline metal complex type dyes and intermolecular CT dyes. The above dyes are exemplarily described in JP-A 63-139191, 64-33547, 1-160683, 1-280750, 1-293342, 2-2074, 3-26593, 3-30991, 3-34891, 3-36093, 3-36094, 30360953-42281, and 3-103476.

The infrared absorbing dye is preferably a cyanine dye represented by the following formula (1) or (2):

Formula (1)

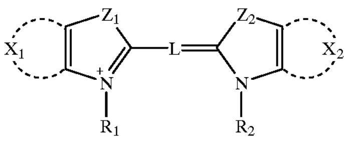

Formula (2)

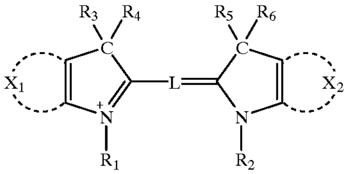

wherein $Z_1$ and $Z_2$ each represent a sulfur atom, selenium atom or oxygen atom; $X_1$ and $X_2$ each represent a nonmetallic atom group necessary to form a benzo-condensed ring or naphtho-condensed ring, which may be substituted; $R_1$ and $R_2$ each represent a substituent, provided that either one of $R_1$ and $R_2$ is an anionic dissociative group; $R_3$, $R_4$, $R_5$ and $R_6$ each represent an alkyl group having 1 to 3 carbon atoms, hydrogen atom or a halogen atom. The cyanine dye represented by formula (1) or (2) includes one in which the dye forms a cation and has a center anion. In this case, the counter anion includes $Cl^-$, $Br^-$, $ClO4^-$, $BF4^-$ and t-butyltriphenylborane. In formula (1) or (2), in cases where laser emitting an infrared ray is employed as a light source, the conjugated chain carbon number (n) is optimally selected so as to meet an emitting wavelength of the laser. In cases of employing YAG laser at 1060 nm, for example, n is preferably 9 to 13. The conjugated bond portion may be substituted, and may be combined through plural substituents to form a ring. The ring represented by $X_1$ or $X_2$ may be substituted. Examples of preferred substituents include a halogen atom, an alkyl group having 1 to 5 carbon atoms, —$SO_3M$ and —COOM ( in which M is hydrogen or an alkali metal). $R_1$ and $R_2$ each are a substituent and preferred examples thereof include al alkyl group having 1 to 5 carbon atoms, an alkoxy group having 1 to 5 carbon atoms, —$[(CH_2)n—O—]_k$—$(CH^2)^m$OR, in which m and n are each an integer of 1 to 3 and k is 0 or 1; R is an alkyl having 1 to 5 carbon atoms; one of $R_1$ and $R_2$ is —R—$SO_3M$ and the other is R—$SO_3$—, in which R is an alkyl having 1 to 5 carbon atoms and M is an alkali metal; or one of $R_1$ and $R_2$ is —R—COOM and the other is —R—COO—, in which R is an alkyl having 1 to 5 carbon atoms and M is an alkali metal; one of $R_1$ and $R_2$ —R—SO3— or —R—COO— and the other is —R—SO3M or —R—COOM in terms of sensitivity and developability. When a semiconductor laser is employed as a light source, the cyanine dye represented by formula (1) or (2) preferably has an absorption peak at 750 to 900 nm and molar extinction coefficient, ϵ of more than $1\times10^5$, and when YAG laser is employed, the cyanine dye preferably has an absorption peak at 900 to 1200 nm and molar extinction coefficient, ϵ of more than $1\times10^5$.

Exemplary examples of infrared absorbing dyes used in the invention are shown below, but are not limited to these examples.

IR1
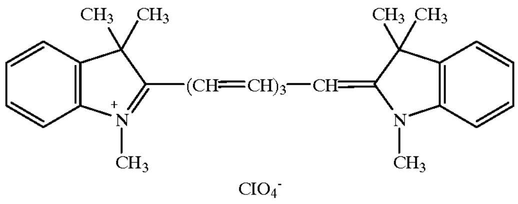
IR2
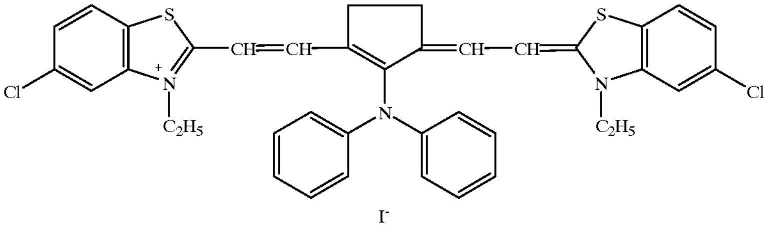
IR3
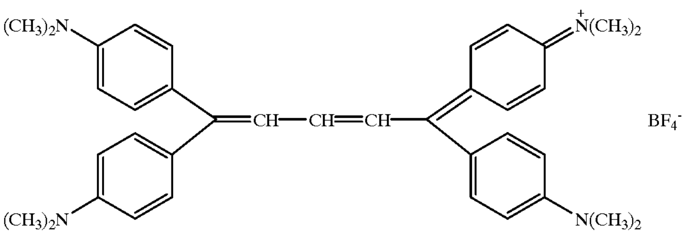
IR4
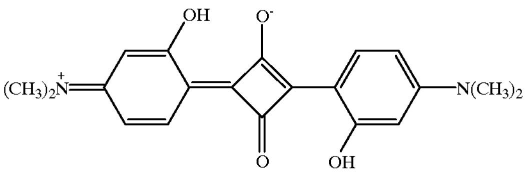
IR5
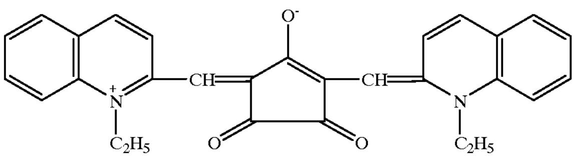
IR6
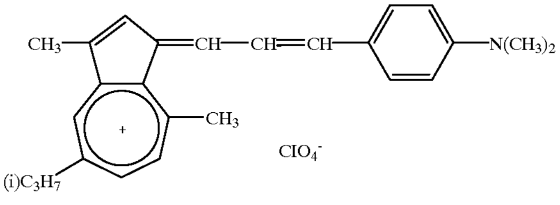
IR7
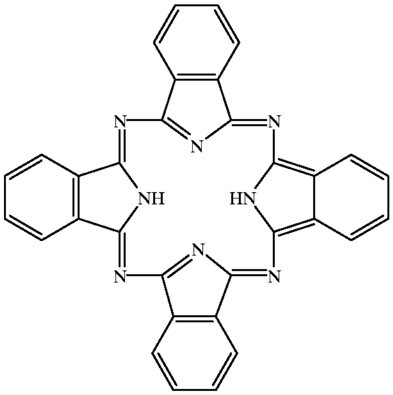
IR8
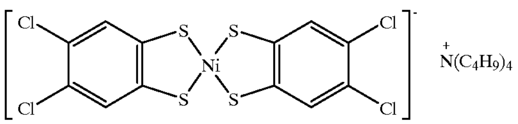
IR9
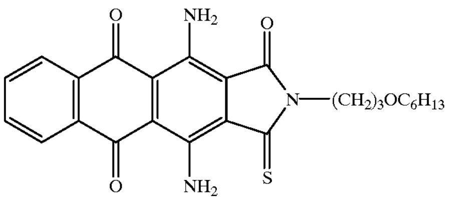

-continued
IR10
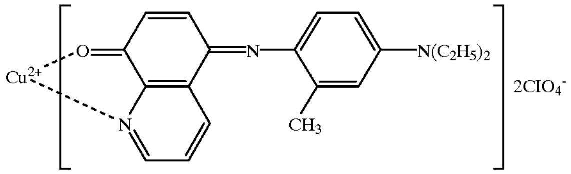
IR11
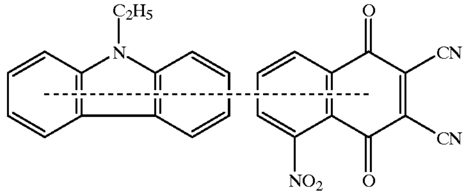
IR12
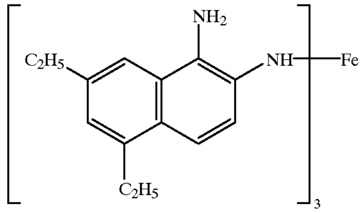
IR13
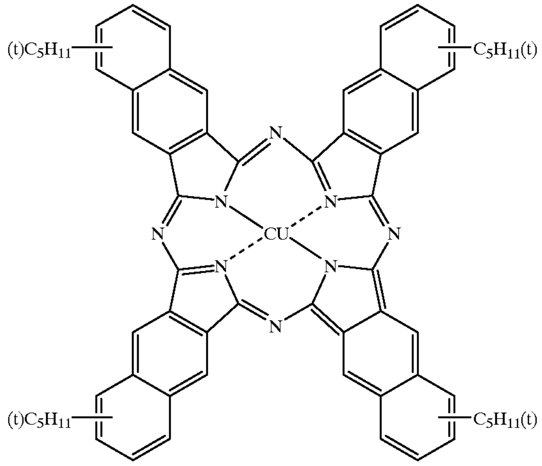
IR14
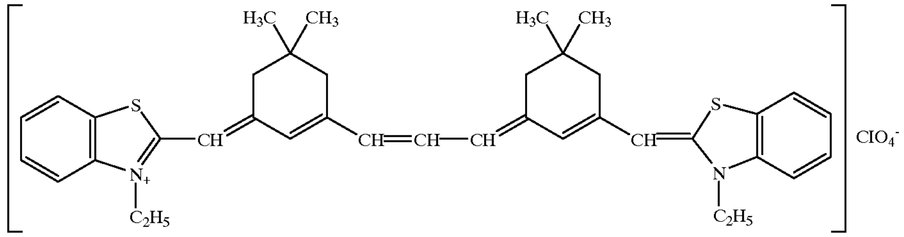
IR15
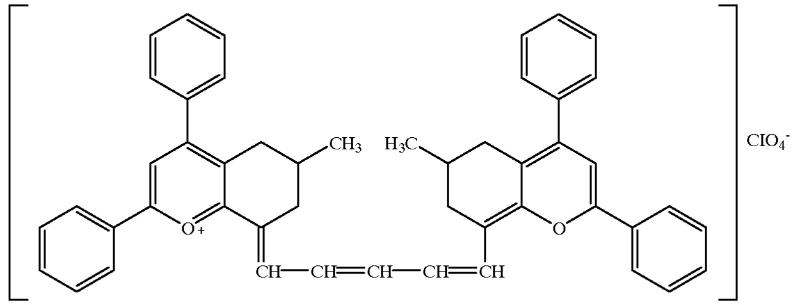
IR16
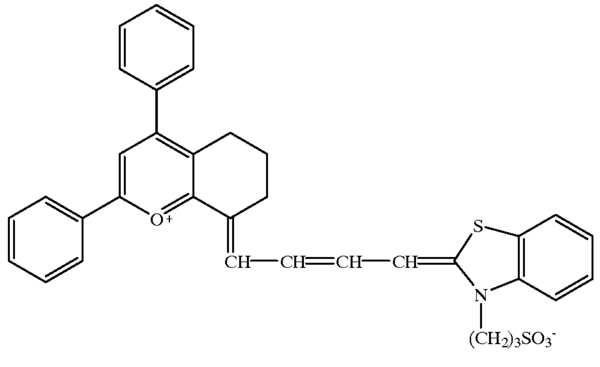

-continued
IR17
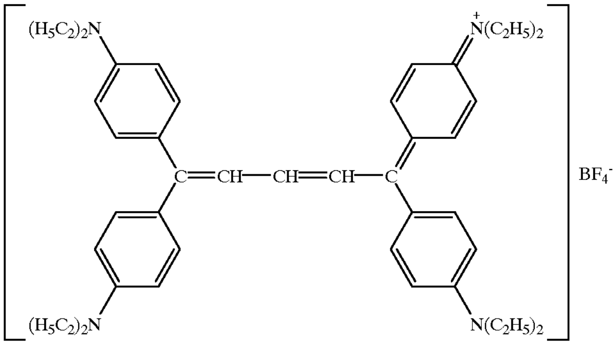
IR18
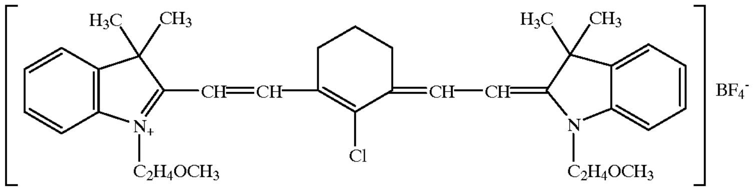
IR19
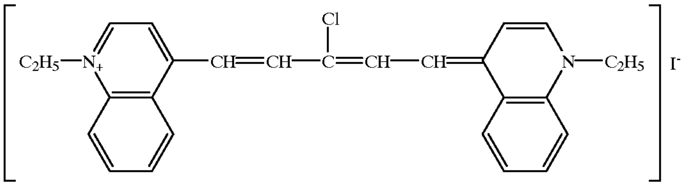
IR20
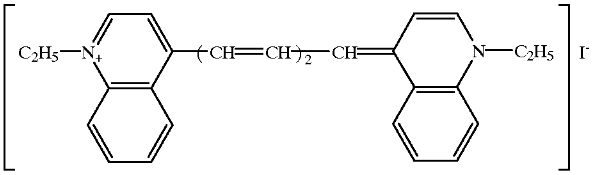
IR21
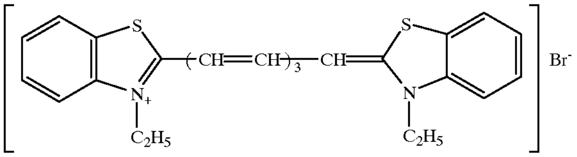
IR22
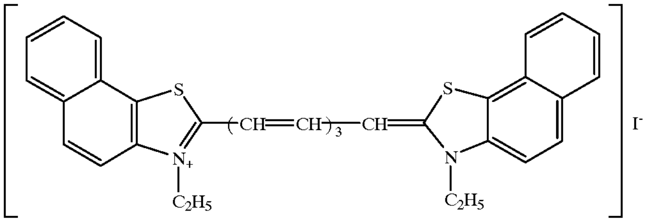
IR23
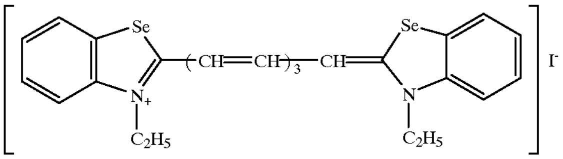

-continued
IR24
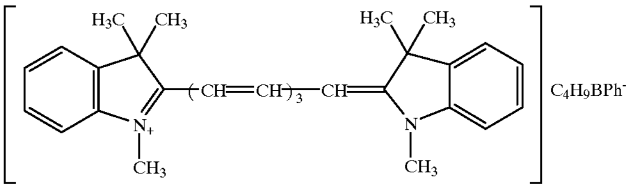
IR25
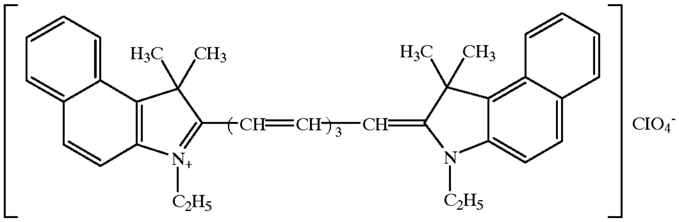
IR26
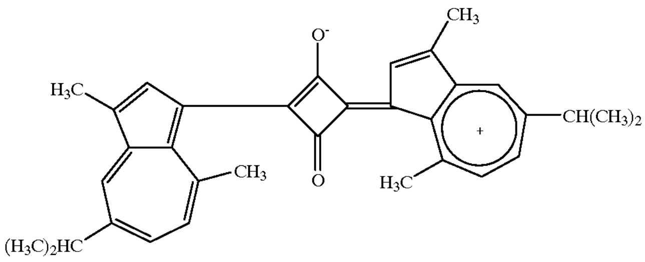
IR27
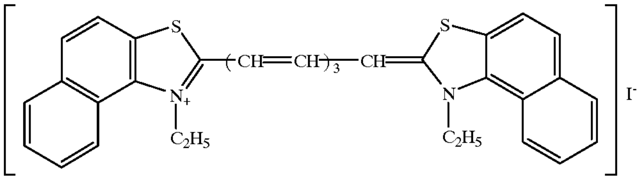
IR28
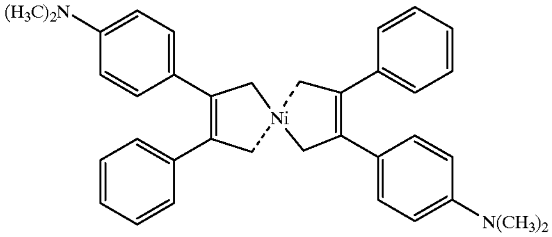
IR29
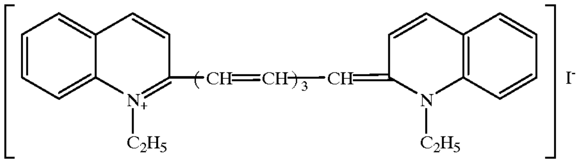
IR30
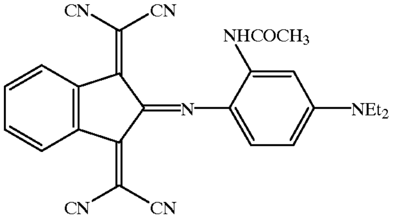
IR31
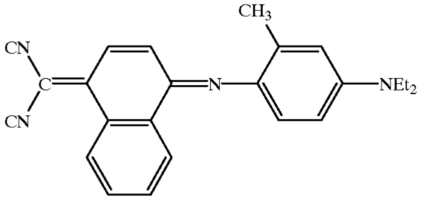

-continued
IR32
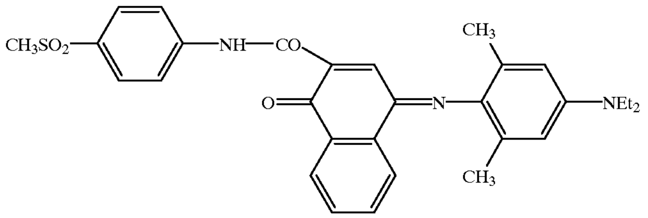
IR33
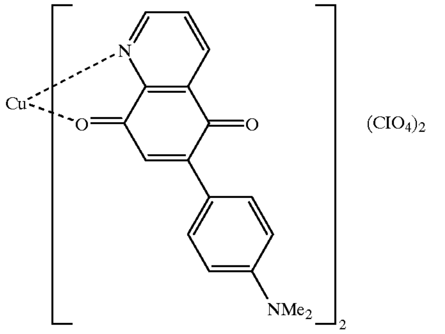
IR34
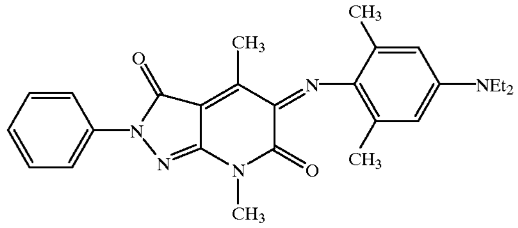
IR35
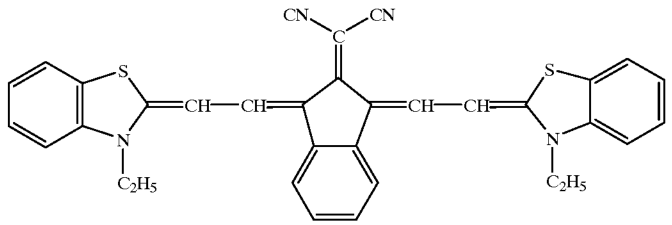
IR36
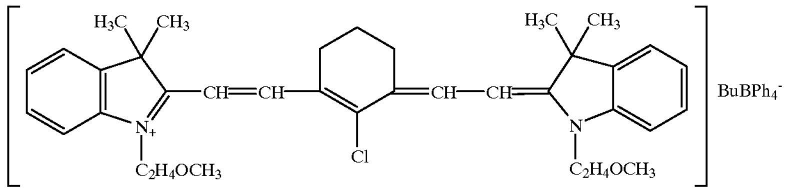
IR37
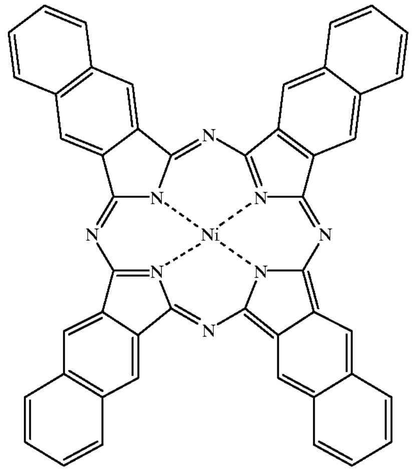
IR38
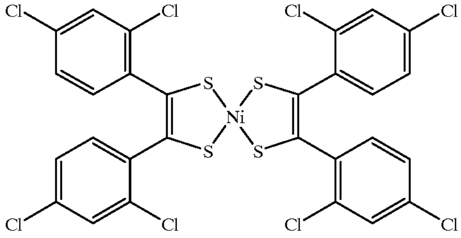

-continued
IR39
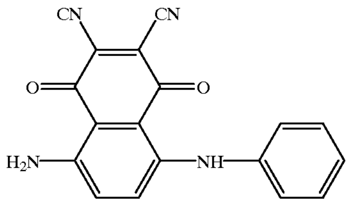
IR40
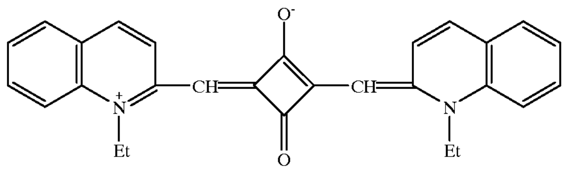
IR41
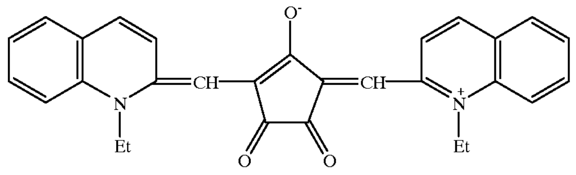
IR42
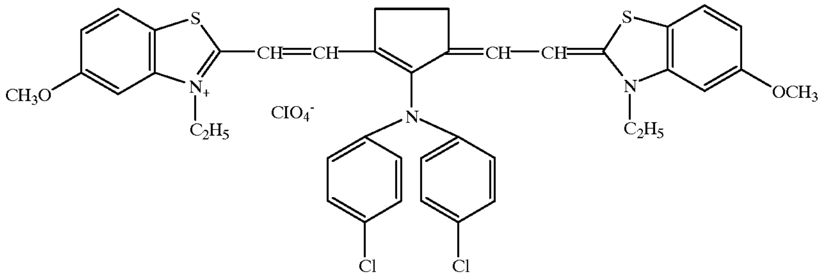
IR43
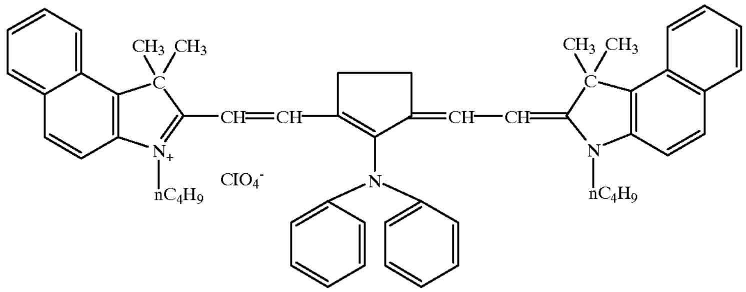
IR44
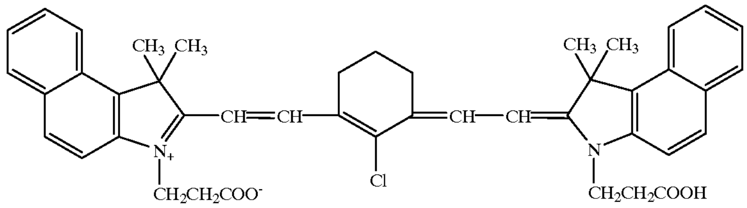
IR45
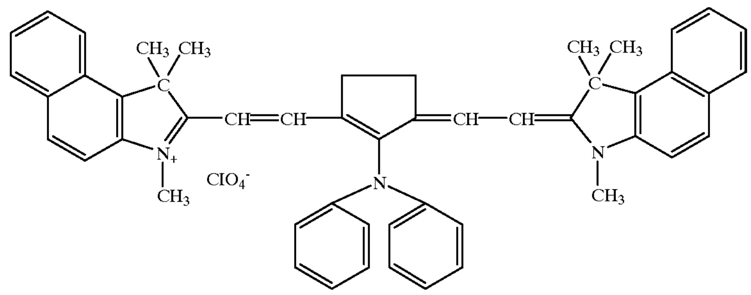

-continued
IR46
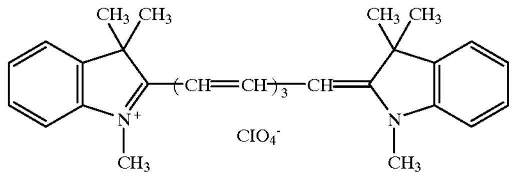
IR47
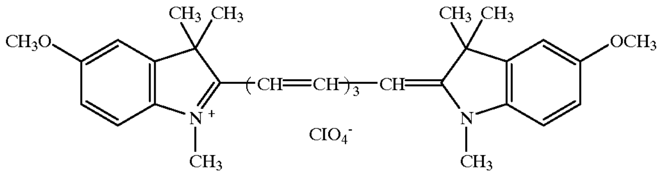
IR48
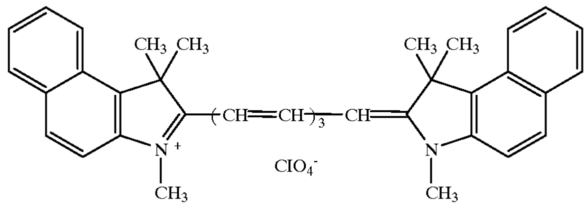
IR49
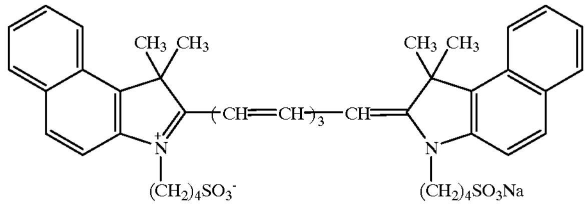
IR50
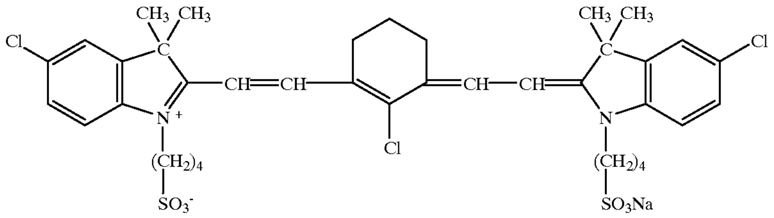
IR51
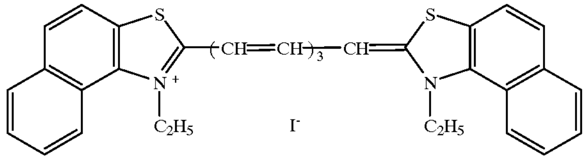
IR52
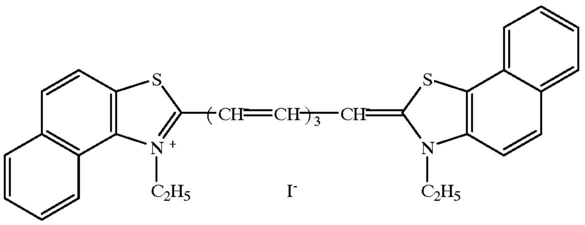
IR53
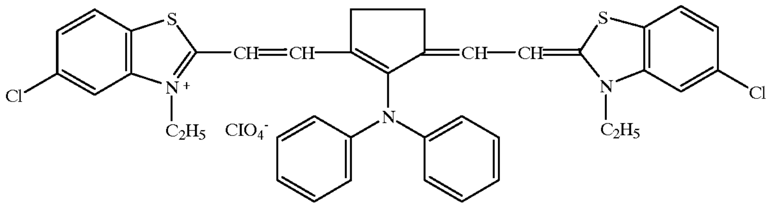

-continued

IR54

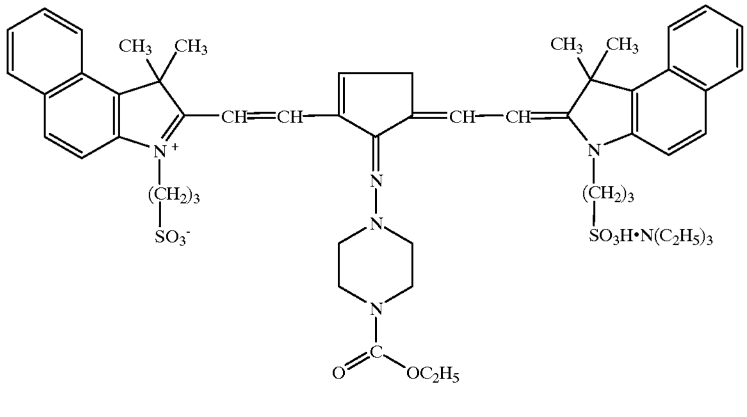

IR55

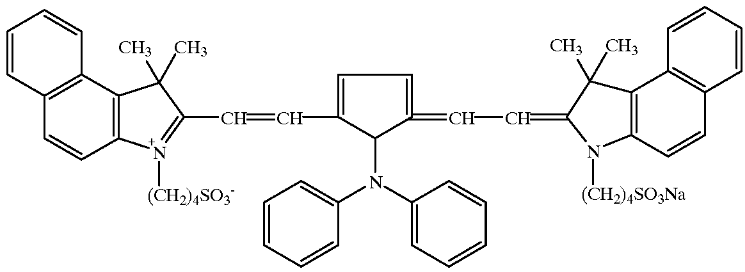

These dyes can be readily synthesized according to the known method and are also commercially available dyes are also shown below:

- Nihon Kayaku: IR750 (anthraquinone type); IR002 and IR003 (aluminum type); IR820 (polymethine type); IRG022, IRG033 (diimonium type); CY-2, CY-4, CY-9, CY-20;
- Mitsui Toatsu: KIR103, SIR103 (phthalocyanine type); KIR101, SIR114 (anthraquinone type); PA1001, PA1005, PA1006, SIR128 (metal complex type);
- Dainihon Ink: Fastogen blue 8120;
- Midori Kagaku: MIR-101, 1011, furthermore the dyes are also available from Dainihon Kanko Shikiso, Sumitomo Chemical Co., and Fuji Film Co.

The dye is incorporated preferably in an amount of 0.5 to 5 wt %. In cases of more than 5.0 wt %, developability in non-imaging area (exposed area) is reduced, and in cases of less than 0.5 wt %, resistance to development in imaging area is reduced.

The photosensitive layer contains preferably an acid generating agent and a compound having a acid-decomposable bonding (hereinafter, denoted as a acid-decomposable compound).

Acid Generating Agent

The acid generating agent is a compound capable of generating an acid upon exposure to actinic light. Acid generating agents include various known compounds and mixture thereof. Examples of the acid generating agent include $BF_4^-$, $PF_6^-$, $SbF_6^-$, $SiF_6^{2-}$ or $ClO_4^-$ salt of a diazonium, phosphonium, sulfonium or iodonium; an organic halogen compound; o-quinonediazidosulfonyl chloride and organic metal/organic halogen compound, each of which is actinic light-sensitive ingredient capable of forming or separating an acid upon exposure to actinic light and is usable as an acid generating agent used in the invention. Organic halogen compounds, which are known as radical-forming photo-initiator and forms hydrogen halogenic acid, are all usable as the acid generating agent. Examples of the hydrogen halogenide acid forming compound are described in U.S. Pat. Nos. 3,515,552, 3,536,489 and 3,779,778; and West German patent 2,243,621. Compounds capable of generating an acid on photolysis described in West German Patent 2,610,842 are also usable as the acid generating agent.

o-Naphthoquinonediazido-4-sulfonic acid halogenide described in JP-A 50-36209 is usable.

As the acid generating agen, organic halogen compounds are preferred in terms of sensitivity in image formation by infrared exposure and storage stability of image forming materials. Preferred organic halogen compounds include triazines having a halogen-substituted alkyl group (i.e., haloalkyl) and oxadiazoles having a halogen-substituted alkyl group and s-triazines having a halogen-substituted alkyl group are specifically preferred. Example of oxadiazoles having a halogen-substituted alkyl group include 2-halomethyl-1,3,4-oxadiazole compounds described in 54-74728, 55-24113, 55-77742, 60-3626 and 60-138539. Preferred examples of 2-halomethyl-1,3,4-oxadiazole type acid generating agents are shown below.

A

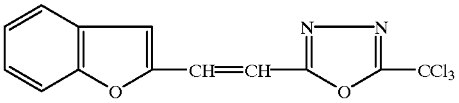

B

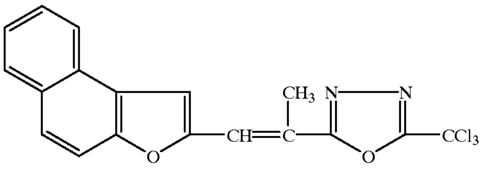

C

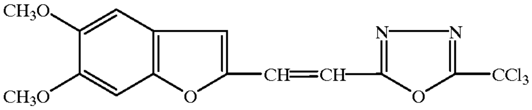

s-Triazines having a halogen-substituted alkyl group is preferably represented by the following formula (3):

Formula (3)

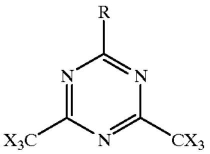

wherein R represents an alkyl group, a haloalkyl group or an alkoxy group, a phenylvinylene group or an aryl group, which may be substituted; and X represents a halogen atom.

Examples of s-triazine type acid generating agent represented by formula (3) are shown below.

(1)

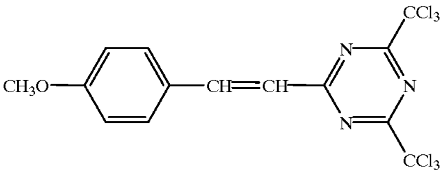

(2)

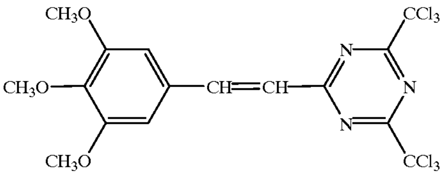

(3)

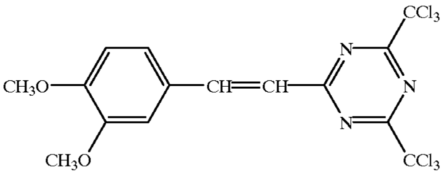

-continued (4)

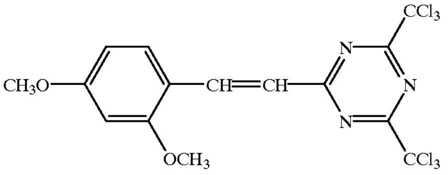

(5)

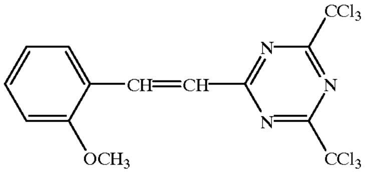

(6)

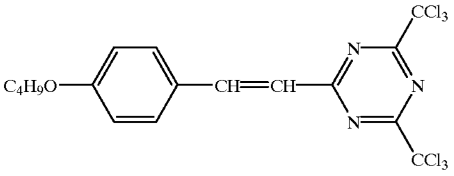

(7)

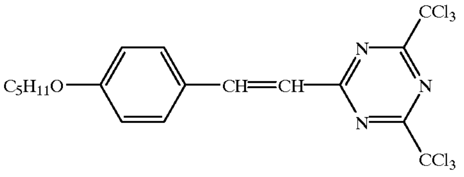

(8)

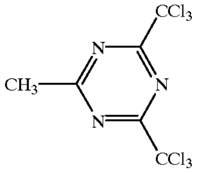

(9)

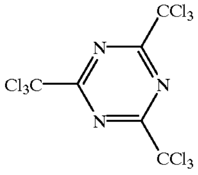

(10)

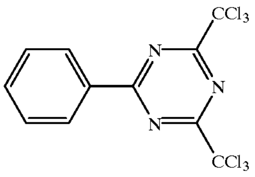

(11)

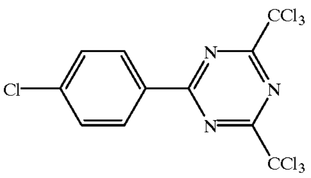

-continued (12)

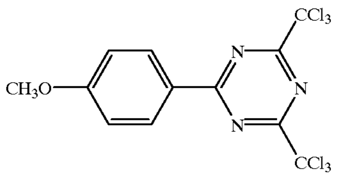

(13)

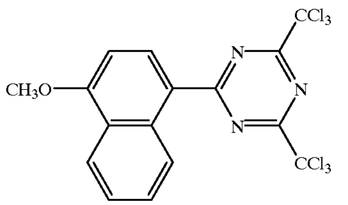

(14)

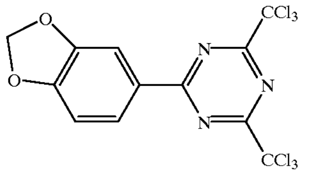

The content of the acid generating agent is broadly variable, depending of its chemical property, and composition or physical property of the photosensitive layer of image forming materials; preferably 0.1 to 20% by weight, and more preferably 0.2 to 10% by weight, based on the total solid content of the photosensitive layer.

Acid Decomposing Compound

Examples of acid-decomposable compound (also referred to as acid decomposing compound) include compounds having C—O—C bonding described in JP-A 48-89003, 51-120714, 53-133429, 55-12995, 55-126236 and 56-17345; compounds having Si—O—C bonding described in 60-37549 and 60-121446; and other acid decomposing compounds described in 60-3625 and 60-10247. Further, compounds having Si—N bonding described in Japanese Patent Application No. 61-16687; carbonate ester described in Japanese Patent Application No. 61-94603; ortho-carbonate ester described in Japanese Patent Application No. 60-251744; ortho-titanate ester described in Japanese Patent Application No. 61-125473; ortho-silicate ester described in Japanese Patent Application No. 61-125474; acetal and ketal described in Japanese Patent Application No. 61-15548; and compounds having C—S bonding described in Japanese Patent Application No. 61-87769 are also cited.

Of these are preferred compounds having C—O—C bonding, compounds having Si—O—C bonding, orthocarbonate ester, acetals ketals and silyl ethers described in JP-A 53-133429, 56-17345, 60-121446 and 60-37549, Japanese Patent Application No. 60-251744 and 61-155481. Further, of these, an organic polymeric compound having repeating acetal or ketal portion in its main chain and increasing its solubility in a developer by action of an acid described in JP-A 53-133429; and an acid-decomposable compound having the following structure unit, described in JP-A 63-10153 are specifically preferred:

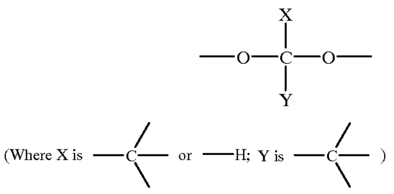

Exemplary examples of the acid decomposing compounds are described in the references described above. Synthesis of these compounds are also described therein.

A compound having —$(CH_2CH_2O)$— group, in which n is an integer of 2 to 5) is preferred as an acid decomposing compound in terms of balance of sensitivity and developability. Specifically, a compound in which n of the ethyleneoxy group is 3 or 4 is preferred. Examples thereof include condensation products between dimethoxycyclohexane, benzaldehyde or its derivative, and either one of diethylene glycol, triethylene glycol, tetraethylene glycol, and pentaethylene glycol.

An acid decomposing compound represented by the following formula (4) is also preferred in terms of sensitivity and developability:

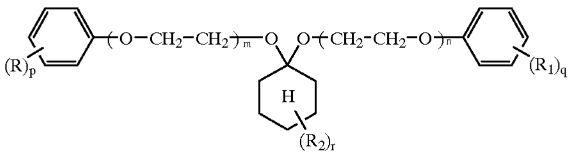

wherein R, $R_1$ and $R_2$ each represent a hydrogen atom, an alkyl group having 1 to 5 carbon atoms, an alkoxy group having 1 to 5 carbon atoms, sulfo group, carboxy group or hydroxy; p, q, r each are an integer of 1 to 3; m and n are integer of 1 to 5. The alkyl group represented by R, $R_1$ or $R_2$ may be straight-chained or branched, including methyl, ethyl, propyl, isopropyl, butyl, t-butyl and pentyl; the alkoxy group includes methoxy, ethoxy, propoxy, isopropoxy, butoxy, t-butoxy and pentoxy; and the sulfo or carboxy group includes its salts. Of the compounds represented by formula (4) is specifically preferred a compound in which m and n are 1 or 2. These compounds represented by formula (4) can be synthesized according to the commonly known method.

In the invention, a compound having a polyacetal group or a polysilyl ether group is preferred; and a compound having a polyacetal group or a polysilyl ether group and a molecular weight of 400 to 1,000, or a compound having a monomeric acetal or a silyl ether group is specifically preferred.

The content of the acid decomposing compound is preferably 5 to 70 wt % solid and more preferably 10 to 50 wt % solid, based on the total composition forming the photosensitive layer. The acid decomposing compound may used alone or in combination.

The photosensitive component of the photosensitive layer may be any one which acts positively. Ingredients other than the photosensitive component described above are cited below.

Binder of Photosensitive Layer

A binder is employed in the photosensitive layer of the image forming material used in the invention. Examples of the binder include polymeric binder, such as novolac resin, a polymer containing a hydroxystyrene unit, a polymer having a structure unit represented by formula (5) described below, and commonly known acryl resin.

Examples of novolac resin include phenol/formaldehyde resin, cresol/formaldehyde resin, phenol/cresol/formaldehyde polycondensation resin described in JP-A 55-57841, polycondensation resin of p-substituted phenol and phenol, or cresol and formaldehyde described in JP-A 55-127553. Examples of the polymer containing a hydroxystyrene unit include polyhydroxystyrene and hydroxystyrene copolymer described in JP-B 52-41050.

The polymer having a structure unit represented by formula (5) include a homopolymer having the structure unit alone as a repeating structure and a copolymer having the structure unit in combination with at least one structure unit in which unsaturated double bond of other vinyl type monomer is cleaved:

Formula (5)

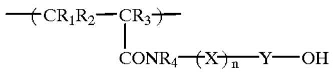

wherein $R_1$ and $R_2$ represent a hydrogen atom, an alkyl group such as methyl and ethyl, or carboxy group (preferably, hydrogen atom); $R_3$ represents a hydrogen atom, a halogen atom such as chlorine or bromine atom or an alkyl group such as methyl or ethyl, (preferably, hydrogen or methyl); $R_4$ represents a hydrogen atom, an alkyl group such as methyl or ethyl, a phenyl group or naphthyl group, Y represents a phenylene group or naphthylene group, which may be substituted, and examples of a substituent include an alkyl group such as methyl or ethyl, a halogen atom such as chlorine or bromine atom, a carboxy group, an alkoxy group such as methoxy or ethoxy, hydroxy, sulfo, cyano or an acyl group (and preferably unsubstituted one or one substituted by methyl), X represents a bivalent organic linkage group connecting a nitrogen atom and an aromatic carbon , and n is an integer of 0 to 5 (preferably n is 0). Exemplary examples of the polymer having the structure unit represented by formula (5) include the following (a) to (f):

Formula (5)

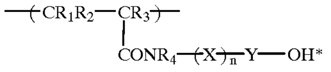

(a)

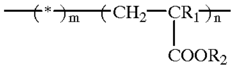

m:n = 30:70

(b)

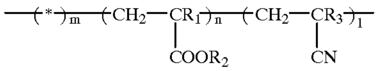

m:n:l = 30:40:30

(c)

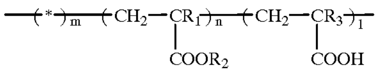

m:n:l = 30:60:10

(d)

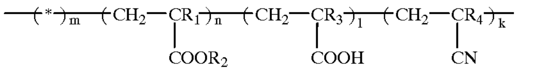

m:n:l:k = 30:30:10:30

-continued (e)

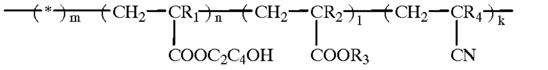

m:n:l:k = 25:5:40:30

(f)

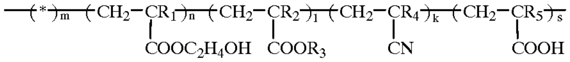

m:n:l:k:s = 30:5:30:30:5

In (a) to (f) , $R_1$ to $R_5$ represent a hydrogen atom, an alkyl group or a halogen atom; m, n, l and k each represent a mole percentage of each structure unit.

The novolac resin, the polymer containing hydroxystyrene unit, the polymer having a structure unit represented by formula (5) and acryl resin described above may be used in combination. An preferred embodiment is one containing a novolac resin and an acryl resin. The acryl resin is a polymer containing acrylic acid, methacrylic acid or their esters as a constituting unit, and specifically, a polymer having a monomer unit represented by formula (5) is preferred. The novolac resin is preferably contained in an amount of 20 to 80% by weight, based on the photosensitive layer, and the acryl resin is preferably contained in an amount of 1 to 50% , and more preferably 5 to 30% by weight, based on the photosensitive layer. Another preferred embodiment is one containing a novolac resin and a nonionic surfactant. Examples of the nonionic surfactant include polyoxyethylene alkyl ether, polyoxyethylene alkylallyl ether, polyoxyethylene derivatives, oxyethylene-oxypropylene block copolymer, sorbitane fatty acid ester, glycerin fatty acid ester, polyoxyethylene fatty acid ester, polyoxyethylene alkylamine, alkylalkanolamide, and polyethylene glycol. The novolac resin is preferably contained in an amount of 20 to 80% by weight, based on the photosensitive composition; and the nonionic surfactant is preferably contained in an amount of 0.01 to 10% by weight, based on the photosensitive composition.

Lipophilic Resin

A lipophilic resin may be incorporated into the photosensitive layer to enhance ink receptivity of the photosensitive layer. Examples of the lipophilic resin include condensation products of a phenol substituted by an alkyl group having 3 to 15 carbon atoms and an aldehyde, such as t-butylphenol formaldehyde resin.

Other Additive into Photosensitive Layer

Further, a dye, colorant or sensitizer may optionally be incorporated into the photosensitive layer.

Coating of Photosensitive Layer

Ingredients constituting the photosensitive layer are dissolved in a solvent, coated on a support having a hydrophilic layer, and dried to form the photosensitive layer. Examples of the solvent include propylene glycol monomethyl ether, propylene glycol monoethyl ether, methyl cellosolve, methyl cellosolve acetate, ethyl cellosolve, ethyl cellosolve acetate, dimethylformamide, dimethylsulfoxide, dioxane, acetone, cyclohexane, trichloroethylene, and methyl ethyl ketone. These solvents are employed alone or in combination. Commonly known coating methods are applicable, such as rotary coating, wire bar coating, dip coating, air knife coating, roll coating, blade coating and curtain coating. The coating amount is dependent of the use and in cases of planographic printing plates, for example, preferably 0.5 to 5.0 g/$m^2$ solid.

Image Forming Method

Image forming materials used in the invention are imagewise exposed using light source in the wavelength region of 400 700 nm, such as a semiconductor laser, He—Ne laser, YAG laser and carbon dioxide gas laser. The output is preferably not less than 50 mW per laser beam and more preferably not less than 100 mW per laser beam. Image formation of the image forming material is performed by imagewise heating or exposing to light at the wavelengths of 700 nm or more and removing an exposed area of the photosensitive layer with a developer. Means for imagewise exposure is preferably the use of infrared laser. As a developing solution and a developer replenishing solution is preferably an aqueous alkali developer solution. Examples thereof include aqueous alkali metal salts such as sodium hydroxide, potassium hydroxide, sodium carbonate, potassium carbonate, sodium metasilicate, potassium metasilicate, sodium secondary phosphate and sodium tertiary phosphate. The concentration of the alkali metal salt is preferably 0.05 to 20% by weight, and more preferably 0.1 to 10% by weight. The ratio of silicate concentration to alkali metal concentration (i.e., $SiO_2$ molar concentration/alkali metal molar concentration) of the developing solution or replenishing solution is preferably 0.15 to 1.0, and the silicate concentration is preferably 0.5 to 5.0% by weight, based on the total weight. The silicate concentration/alkali metal concentration of the developing solution is more preferably 0.25 to 0.75 and the silicate concentration is more preferably 1.0 to 4.0% by weight. The silicate concentration/alkali metal concentration of the replenishing solution is more preferably 0.15 to 0. 5 and the silicate concentration is more preferably 1.0 to 3.0% by weight. There may also be employed non-silicate type developers described in JP-A 8-305039 and 8-160631.

Organic solvents are suitably those which have solubility in water of not more than 10% by weight, preferably not more than 2% by weight. Examples thereof include propylene glycol, ethylene glycol monophenyl ether, benzyl alcohol, n-propyl alcohol, 1-phenylethanol, 2-phenylethanol, 3-phenylpropanol, 1,4-phenylbutanol, 2,2-phenylbutanol, 1,2-phenoxyethanol, 2-benzyloxyethanol, o-methoxybenzyl alcohol, m-methoxybenzyl alcohol, p-methoxybenzyl alcohol, cyclohexanol, 2-methylcyclohexanol, 4-methylcyclohexanol, and 3-methylcyclohexanol. Of these, propylene glycol, ethylene glycol monophenyl ether, benzyl alcohol and n-propyl alcohol are more preferably employed in the invention. The amount of the organic solvent to be used is preferably 1 to 5% by weight, based on the total weight of a developing solution. The organic solvent amount is closely related with the amount of a surfactant to be used so that as the organic solvent increases, the surfactant is preferably increased.

Additives such as an alkali-soluble mercapto compound and/or a thioether compound, a water-soluble reducing agent, a defoaming agent and a water-softening agent may be added to the developing solution.

It is preferred to perform development using an automatic processor, as described in JP-A 5-188601 and 9-143882. Processing agents described in Japanese Patent Application No. 8-56894 may be added to a developing solution, an eraser solution or post-processing solution.

After exposure and before development, image forming materials may be subjected to a heating treatment at a temperature lower than a decomposition temperature of a thermally acid-generating agent. In this case, a heating treatment at 80 to 200° C. for 5 to 20 sec. is preferred. After development, image forming materials may be subjected to a burning treatment at 150 to 300° C. for 20 to 200 sec., leading to markedly enhanced mechanical strength of the photosensitive layer. In cases of photosensitive planographic printing plates, plate life can be markedly enhanced.

Visible Image Forming Method

For example, commonly known techniques employed in thermosensitive paper are applicable, including a method in which a electron-donating dye such as a leuco dye and electron accepting developer are thermally reacted to form color and a method in which a diazonium salt and a coupler (e.g., a phenol derivative, a active methylene group containing compound, etc.) are thermally reacted to form color, and then exposed to light to be fixed. The color forming agent is preferably colorless before being heated. These materials may be microcapsulated. In cases where a colored material such as titanium black in which a part of oxygen is removed to endow electroconductivity is employed as a light-to-heat converting material, oxidation is allowed to proceed by exposure and heating to decolorize. For example, black-colored titanium black is changed to white on oxidation, thereby forming visible images at an exposed area.

Exposing Method

It is preferred to expose to infrared laser. An exposure apparatus conventionally used in CTP can be employed. Exposure energy is preferably 100 to 500 mJ/$cm^2$.

Developing Method by Physical Force or Dissolution

It may be performed by scrubbing off by a brush or sponge. An adhesive material such as adhesive sheet or self-adhesive tape is brought into contact with the surface to perform stripping-off.

It may also be performed by dissolving a binder fixing a thermally fusible material (and by physical force). For example, it is performed by dipping into or flowing a solution which can dissolve a binder, while rubbing by a brush or a sponge. It may be scrubbed with a sponge containing the solution.

Developing Method in Printing Machine

A printing plate is attached to a plate cylinder and brought into contact with at least one of a dampening water supplying roller, an ink supplying roller and a blanket cylinder with rotating the plate cylinder. Thermally fusible material in a non-imaging area is removed as a result of either one or the composite of binder dissolution by dampening water or an ink solvent and peeling-off by contact with each roller. Alternatively, a developing apparatus (which may be any one capable of removing the thermally fusible material in a non-imaging area) is exclusively installed into a printing machine, thereby removing the thermally fusible material in a non-imaging area. Material which is to be removed from the printing plate surface in the printing machine is preferably colorless or white. A strongly colored material may produce problems such as staining in the printing machine or color mixing in printed material.

EXAMPLES

Embodiments of the present invention will be further explained, based on examples, but the invention is not limited to these.

Example 1

Preparation of Porous Particle or Flaky Inorganic Particle Dispersing Solution

Dispersion (1)

Porous silica, SYLOJET P-403 (produced by GRACE Davidson Co., at a pore volume of 2.05 ml/g and an average particle size of 3 μm) is gradually added to water with stirring so that a dispersing solution of 20% solid was obtained.

Dispersion (2)

Synthetic A-type zeolite, SILTON B (produced by MIZUSAWA INDUSTRIAL CHEMICALS Co., at a Al/Si ratio of 1, and an average particle size of 1.5 μm) is gradually added to water with stirring and a dispersing solution of 20% solid was obtained.

Dispersion (3)

Swellable synthetic mica, SOMASIF ME-100 (produced by Cope Chemical Co., at an average particle size of 1 to 5 μm and an aspect ratio of not less than 20) is gradually added to water with stirring and a dispersing solution of 5% solid was obtained. The resulting mica was supposed to be completely swelled, and the average particle thickness was not more than 100 nm and the aspect ratio was not less than 50.

Dispersion (4)

Porous aluminosilicate, AMT silica #100B (produced by MIZUSAWA Kagaku Co., at a pore volume of 0.5 ml/g or oil absorbing amount of 70 ml/100 g and an average particle size of 1 μm) is gradually added to water with stirring and a dispersing solution of 20% solid was obtained.

Preparation of Coating Solution for Hydrophilic Layer

Solutions were prepared in accordance with the composition and dispersing condition as shown in Tables 1 and 2, and then filtered to obtain coating solutions for a hydrophilic layer. Each of the coating solutions was coated on PET film and dried. The form of porous particles or flaky inorganic particles was observed with scanning electronmicroscope (SEM), as shown in Table 1.

Preparation of Support for Printing Plate

Supports were prepared using the combination of a coating solution, a substrate and a coating thickness, as shown in Tables 3 to 5. Substrates as described below were employed. The hydrophilic layer was coated using a wire bar. To obtain the desired thickness, the wire bar was optimally varied according to the composition of the coating solution and the solid component concentration. After coating, the coat was dried at 80° C. for 2 min.

Substrate PET-1

On a 0.18 mm thick polyethylene terephthalate (hereinafter, also denoted as PET) film, two sublayers were coated in the following manner.

1) First Sublayer

After the coating side of the PET film was subjected to a corona discharge treatment, a coating solution having the following composition was coated using a wire bar under atmosphere at 20° C. and 55% RH so as to obtain a dry thickness of 0.4 μm, after which it was dried at 140° C. for 2 min.

| First sublayer composition: | |
|---|---|
| Acryl latex particles n-butylacrylate/t-butylacrylate/styrene/hydroxyethyl methacrylate = 28/22/25/25 | 36.9 g |
| Surfactant (A) | 0.36 g |
| Hardener (a) | 0.98 g |
| Water to make | 1000 ml |

2) Second Sublayer

After the first sublayer side was subjected to a corona discharge treatment, a coating solution having the following composition was coated by the air knife coating method under an atmosphere at 35° C. and 22% RH so as to obtain a dry thickness of 0.1 μm and dried at 140° C. for 2 min.

| Second sublayer composition | |
|---|---|
| Gelatin | 9.6 g |
| Surfactant (a) | 0.4 g |
| Hardener (b) | 0.1 g |
| Water to make | 1000 ml |

Surfactant (A)

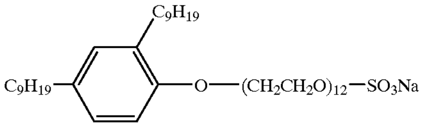

Hardener (a)

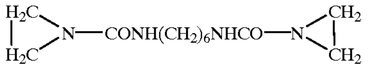

Hardener (b)

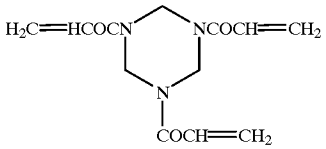

Substrate Al-1

A 0.24 mm thick aluminum plate (1050 material) was dipped into an aqueous 2 wt % sodium hydroxide solution at 50° C. for 30 sec. to decrease the plate surface. After being sufficiently washed, the plate was further dipped into an aqueous 2 wt % sodium silicate solution at 70° C. for 30 sec, washed and dried.

Substrate Al-2

An aluminum plate which was degreased similarly to the Al substrate 1 was subjected to anodic oxidation treatment at a temperature of 25° C. and a voltage of 20 V, using an aqueous 20 wt % sulfuric acid solution to form an anodic oxidation film on the plate surface. After washing, the plate was subjected to sodium silicate treatment in a manner similar to the Al substrate 1.

Substrate Al-3

An aluminum plate which was degreased similarly to the Al substrate 1 was dipped in an aqueous 20 wt % nitric acid solution for 10 sec. After neutralization, using an aqueous 2.0 wt % nitric acid solution at 30° C., the plate was subjected to a surface roughening treatment with a sine wave of a peak current density of 60 $A/dm^2$ and an electricity quantity of 500 $c/dm^2$. Then the plate was dipped in an aqueous 1 wt % sodium hydroxide solution at 30° C. for 20 sec. and after being washing, the plate was further subjected to anodic oxidation and sodium silicate treatments in a manner similar to the Al substrate 2.

Substrate Al-4

On the surface of an aluminum plate which was subjected to anodic oxidation similarly to the Al substrate 2, organic-inorganic sol-gel film in a manner similar to Example 1 of JP-A 8-240914.

Printing Plate Preparation

Images were formed by an ink jet system using an ink having the following composition and then dried at 100° C. for 2 min. to obtain printing plate samples, as shown in Table 3. The image formation by the ink jet system was performed at an ink discharging amount to give a dot diameter of ca. 40 μm on the printing plate and at a resolution of 720 dpi.

| Ink composition | |
|---|---|
| Latex particles, Yodosol GD87B aqueous solution (available from KANEBO NSG Co., average size of 90 nm, Tg of 60° C., 50 wt % solid) | 170 parts |
| Carboxymethyl cellulose CMC-1220 (available from DAICEL Chemical Ind. Co.) | 5 parts |
| Aqueous carbon black solution (containing dispersing agent) SD9020 (available from DAINIPPON INK AND CHEMICALS INC., primary particle size of 100 nm and 30 wt % solid) | 33 parts |
| Water to make 7.0 wt % solid. | |

Printing Condition

Employing a printing machine, GTO (produced by HEIDERBERG Corp.), printing was performed by the use of coated paper, dampening water (H-solution SG-51, concentration of 1.5%, and available from TOYO INK corp.) and an ink (TOYO KING HIGH ECHO M deep red, available from TOYO INK Corp.).

Evaluation

The thus prepared printing samples were evaluated with respect to printability according to the following:

Resistance to Staining in Non-imaging Area

At the time 1000 sheets were printed, staining in non-imaging area was visually evaluated.

Reproducibility of Shadow Portion

At the time 1000 sheets were printed, reproducibility of screen images was visually evaluated in a shadow portion (70% halftone dot at 120 lines per inch).

Fingerprint Stain

The extent of staining at a previously fingerprinted portion in a non-imaging area was visually evaluated at the time of 1,000 sheets were printed Recovery from Staining At the time 1,000 sheets were printed, supplying of dampening water was stopped and only ink was applied overall to the printing plate. Thereafter, dampening water was again supplied and printing was again resumed. Stain recovery was evaluated, based on the number of printed sheets at the time the extent of staining in non-imaging area became the same as that at the time 1,000 sheets were printed (the more, the worse).

Results of evaluation are shown in Table 3. In the Table, "slightly poor" and "poor" are levels unacceptable for practical use.

Printing Plate Preparation

On a support shown in Table 4, an image forming layer having composition described below was coated so as to have a dry weight of 1.2 g/m2 and dried at 50° C. for 3 min. to obtain printing plate samples, as shown in Table 4. The plate was wound onto a drum of a laser exposure apparatus and imagewise exposed to 830 nm infrared laser with varying exposure energy, as shown in Table 4. Exposed plates were developed with water as a developer using an automatic processor and dried plates were employed as a printing plate. The extent of image formation with varying exposure energy is shown in Table 6.

| Composition of image layer 1 | |
|---|---|
| Latex particles, Yodosol GD87B aqueous solution (available from KANEBO NSG Co., average size of 90 nm, Tg of 60° C., 50 wt % solid) | 190 parts |
| Carboxymethyl cellulose CMC-1220 (available from DAICEL Chemical Ind. Co.) | 5 parts |
| Water to make | 11.0 wt % solid |

Printing Condition

Employing a printing machine GTO (produced by HEIDERBERG Corp.), printing was performed using coated paper, dampening water (H-solution SG-51, concentration of 1.5%, and available from TOKYO INK corp.) and an ink (TOYO KING HIGH ECHO M deep red, available from TOYO INK Corp.).

Evaluation

The thus prepared printing samples were evaluated with respect to printability according to the following:

Plate Life

Plate life was evaluated based on the number of printed sheet at the time of inking trouble, exhibited in an imaging area of the print. The number of printed sheets at that time was determined for an imaging area corresponding to each exposure energy and evaluated with respect to the plate life.

Evaluation results are shown in Table 4. In the Table, "No image", "Slightly poor", and "Poor" are levels unacceptable for practical use.

Printing Plate Preparation

On the support shown in Table 5, an image forming layer having the composition described below was coated so as to have a dry weight as shown in Table 5 and dried at 70° C. for 3 min. to obtain printing plate samples, as shown in Table 5. The plate was wound onto a drum of a laser exposure apparatus and imagewise exposed to 830 nm infrared laser of 4,000 dpi with varying exposure energy, as shown in Table 5.

| | |
|---|---|
| Composition of image layer 2 | |
| Ink receptive thermally fusible particles, Polyethylene Wax Emulsion A101 (available from Gifu Selac Co., average size of 1.5 μm, softening point of 85° C., meting point of 122° C., melt viscosity of 150 cps at 140° C., 40 wt % solid) | 100 parts |
| Carboxymethyl cellulose CMC-1220 (available from DAICEL Chemical Ind. Co.) | 5 parts |
| Water to make | 10.0 wt % solid |
| Composition of image layer 3 | |
| Ink receptive thermally fusible particles, Microcrystaline Wax Emulsion A206 (available from Gifu Selac Co., average size of 0.5 μm, softening point of 65° C., meting point of 108° C., melt viscosity of 8 cps at 140° C., 40 wt % solid) | 100 parts |
| Colloidal silica, SNOWTEX 20L (available from NISSAN CHEMICAL INDUSTRIES Co. Ltd., average size of 45 nm, 20 wt % solid) | 50 parts |
| Water to make | 10.0 wt % solid |
| Composition of image layer 4 | |
| Ink receptive thermally fusible particles, Microcrystaline Wax Emulsion A206 (available from Gifu Selac Co., average size of 0.5 μm, softening point of 65° C., meting point of 108° C., melt viscosity of 8 cps at | 100 parts |

-continued

| | |
|---|---|
| 140° C., 40 wt % solid) | |
| Colloidal silica, SNOWTEX 20L (available from NISSAN CHEMICAL INDUSTRIES Co. Ltd., average size of 45 nm, 20 wt % solid) | 50 parts |
| Matting agent, PMMA particles MX220 (available from SOKEN CHEMICAL & ENGINEERING Co. Ltd., average size of 2 μm) | 10 parts |
| Water to make | 12.0 wt % solid |
| Composition of image layer 5 | |
| Ink receptive thermally fusible particles, Microcrystaline Wax Emulsion A213 (available from Gifu Selac Co., average size of 1.0 μm, softening point of 65° C., meting point of 108° C., melt viscosity of 8 cps at 140° C., 30 wt % solid) | 135 parts |
| Colloidal silica, SNOWTEX 20L (available from NISSAN CHEMICAL INDUSTRIES Co. Ltd., average size of 45 nm, 20 wt % solid) | 50 parts |
| Light-to-heat converting material, Aqueous carbon black solution (containing dispersing agent) SD9020 (available from DAINIPPON Ink AND CHEMICALS INC., primary particle size of 100 nm and 30 wt % solid) | 20 parts |
| Water to make | 11.0 wt % solid |
| Composition of image layer 6 | |
| Ink receptive thermally fusible particles, Microcrystaline Wax Emulsion A206 (available from Gifu Selac Co., average size of 0.5 μm, softening point of 65° C., meting point of 108° C., melt viscosity of 8 cps at 140° C., 40 wt % solid) | 105 parts |
| Colloidal silica, SNOWTEX 20L (available from NISSAN CHEMICAL INDUSTRIES Co. Ltd., average size of 45 nm, 20 wt % solid) | 40 parts |
| Carboxymethyl cellulose CMC-1220 (available from DAICEL Chemical Ind. Co.) | 2 parts |
| Light-to-heat converting material, tin oxide-doped indium oxide T-1 available from MITSUBISHI Material Corp., primary particle size of 20 nm, powder) | 5 parts |
| Water to make | 11.0 wt % solid |
| Composition of image layer 7 | |
| Ink receptive thermally fusible particles, Microcrystaline Wax Emulsion A206 (available from Gifu Selac Co., average size of 0.5 μm, softening point of 65° C., meting point of 108° C., melt viscosity of 8 cps at 140° C., 40 wt % solid) | 100 parts |
| Colloidal silica, SNOWTEX 20L (available from NISSAN CHEMICAL INDUSTRIES Co. Ltd., average size of 45 nm, 20 wt % solid) | 50 parts |
| Matting agent, PMMA particles MX220 (available from SOKEN CHEMICAL & ENGINEERING Co. Ltd., average size of 2 μm) | 10 parts |

-continued

| | |
|---|---|
| Visible image forming agent, microcapsule of volume-averaged particle size of 3.3 μm, containing a leuco dye and developer, prepared in a manner similar to colored microcapsule 1 in Example 1 of JP-A 9-286177 (as solid) | 5 parts |
| Water to make | 12.0 wt % solid |

Printing Condition

Employing a printing machine, DAIYAIF-1 (produced by MITSUBISHI HEAVY INDUSTRY Co. Ltd.,), printing was performed by the use of coated paper, dampening water (H-solution SG-51, concentration of 1.5%, and available from TOKYO INK corp.) and an ink (TOYO KING HIGH ECHO M deep red, available from TOYO INK Corp.).

Evaluation

The thus prepared printing samples were evaluated with respect to printability according to the following:

Resistance to Staining at Low Water-supplying Rate

When the dampening water-supplying rate was reduced, resistance to staining (i.e., entanglement of halftone dots, stain in non-imaging area) was evaluated.

Water Amount Latitude

When the dampening water-supplying rate was varied, latitude of the water-supplying rate in which superior print quality was obtained was determined.

Small Dot Reproducibility

It was compared whether dots of 25 μm in diameter formed on a printing plate are confirmed on a print at the time 100 sheets were printed.

Blanket Stains

Stains accumulated on the blanket were peeled off with a tape at the time 2,000 sheets were printed, the tape was attached onto white paper to compare the extent of staining.

Plate Life

Printing was carried our until ink receptivity reached an unacceptable level, the number of printed sheets at that time was determined to evaluate the plate life.

Evaluation of Visibility-after-exposure Characteristics

After being subjected to laser exposure, the printing plates were visually evaluated with respect to distinguishability in visibility between imaging and non-imaging areas.

Evaluation results are shown in Table 5. In the Table, the grade "No image", "Image dropping-out", "Slightly poor", "Poor", and "Very poor" are an unacceptable levels for practical use. Further, in the evaluation with respect to staining in the printing machine and stain on prints, the grade "Yes" is an unacceptable level for practical uses.

TABLE 1

| Coating Solution | Composition (Weight Parts) | | Dispersion condition | Porous Particle Size (SEM) | Avergae thickness of Flaky Inorganic Particles (SEM) | Aspect Ratio of Flaky Inorganic Particles (SEM) |
|---|---|---|---|---|---|---|
| 1-1 | Dispersion (1) | 150.00 | S.G.* | not more | — | — |
| | Colloidal silica SNOWTEX-O NISSAN KAGAKU*, av. size of 15 nm, 20 wt % solid) | 150.00 | 1000 rpm 100 min. | than 1 μm | — | — |
| | Aqueous carbon black DENKA BLACK (DENKI KAGAKU, av. size of 42 nm, powder) | 5.00 | | | — | — |

TABLE 1-continued

| Coating Solution | Composition (Weight Parts) | | Dispersion condition | Porous Particle Size (SEM) | Avergae thickness of Flaky Inorganic Particles (SEM) | Aspect Ratio of Flaky Inorganic Particles (SEM) |
|---|---|---|---|---|---|---|
| | Water | 128.30 | | | — | — |
| | Solid percantage (wt %) | 15.00 | | | — | — |
| 1-2 | Dispersion (1) | 200.00 | S.G.* | not more | — | — |
| | Colloidal silica SNOWTEX-S (NISSAN KAGAKU, av. size of 8 nm, 30 wt % solid) | 100.00 | 1000 rpm 30 min. | than 1 $\mu$m | — | — |
| | Aqueous carbon black SD9020 (DAINIHON INK, primary particle size of not more than 100 nm, 30 wt % solid) | 20.00 | | | — | — |
| | Water | 186.70 | | | — | — |
| | Solid percentage (wt %) | 15.00 | | | — | — |
| 1-3 | Dispersion (4) | 150.0 | S.G.* | not more | — | — |
| | Colloidal silica SNOWTEX-S (NISSAN KAGAKU, av. size of 15 nm, 20 wt % solid) | 125.00 | 100 rpm 60 min. | than 1 $\mu$m | — | — |
| | Titanium black 13 M (MITSUBISHI MATERIAL, size of not more 100 nm, powder) | 15.00 | | | — | — |
| | Water | 176.70 | | | — | — |
| | Solid percentage (wt %) | 15.00 | | | — | — |
| 1-4 | Dispersion (2) | 150.00 | S.G.* | not more | — | — |
| | Colloidal silica SNOWTEX-S (NISSAN KAGAKU, av. size of 8 nm, 30 wt % solid) | 80.00 | 1000 rpm 50 min. | than 1 $\mu$m | | |
| | Antimonyl oxide-doped tin oxide T-1 (MITSUBISHI MATERIAL, primary particle size of 20 nm, powder) | 15.00 | | | — | — |
| | Water | 220.70 | | | — | — |
| | Solid percentage (wt %) | 15.00 | | | — | — |
| 1-5 | Dispersion (4) | 150.00 | S.G.* | not more | — | — |
| | Colloidal silica SNOWTEX-S (NISSAN KAGAKU, av. size 15 nm, 20 wt % solid) | 80.00 | 1000 rpm 100 min. | than 1 $\mu$m | — | — |
| | Titanium black 12S (MITSUBISHI MATERIAL, size of not more 100 nm, powder) | 16.00 | | | — | — |
| | Water | 220.70 | | | — | — |
| | Solid percentage (wt %) | 15.00 | | | — | — |
| 1-6 | Dispersion (2) | 150.00 | S.G.* | not more | — | — |
| | SNOWTEX-S (NISSAN KAGAKU, av. size of 8 nm, 30 wt % solid) | 80.00 | 1000 rpm 30 min. | than 1 $\mu$m | — | — |
| | Antimonyl oxide-doped tin oxide T-1 (MITSUBISHI MATERIAL, prmiary particle size of 20 nm, powder) | 16.00 | | | — | — |
| | Water | 220.70 | | | — | — |
| | Solid percantage (wt %) | 15.00 | | | — | — |
| 1-7 | Dispersion (4) | 200.00 | S.G.* | not more | not more | not less |
| | Colloidal silica SNOWTEX-O (NISSAN KAGAKU, av. size of 15 nm, 20 wt % solid) | 200.00 | 1000 rpm 60 min. | than 1 $\mu$m | than 100 nm | than 50 |
| | Dispersion (3) | 200.00 | | | | |
| | Titanium black 13M (MITSUBISHI MATERIAL, size of not more 100 nm, powder) | 20.00 | | | | |
| | Water | 113.30 | | | | |
| | Solid percabntage (wt %) | 15.00 | | | | |

TABLE 1-continued

| Coating Solution | Composition (Weight Parts) | | Dispersion condition | Porous Particle Size (SEM) | Avergae thickness of Flaky Inorganic Particles (SEM) | Aspect Ratio of Flaky Inorganic Particles (SEM) |
|---|---|---|---|---|---|---|
| 1-8 | Dispersion (2) | 200.00 | S.G.* | not more | not more | not less |
| | Colloidal silica | 80.00 | 1000 rpm | than 1 μm | than 100 nm | than 50 |
| | SNOWTEX-S | | 60 min. | | | |
| | (NISSAN KAGAKU, av. size of 8 nm, 20 wt % solid) | | | | | |
| | Dispersion (3) | 200.00 | | | | |
| | Aqueous carbon black SD9020 (DAINIHON INK, primary particle size of not more than 100 nm, 30 wt % solid) | 30.00 | | | | |
| | Water | 43.30 | | | | |
| | Solid percantage (wt %) | 15.00 | | | | |
| 1-9 | Dispersion (2) | 150.00 | S.G.* | not more | not more | not less |
| | Colloidal silica | 80.00 | 1000 rpm | than 1 μm | than 100 nm | than 50 |
| | (NISSAN KAGAKU, av. size of 8 nm, 30 wt % solid) | | 100 min. | | | |
| | Dispersion (3) | 300.00 | | | | |
| | Titanium oxide covered with antimonyl oxide-doped oxide, W-P (MITSUBISHI MATERIAL, primary particle size of 200 nm, powder) | 16.00 | | | | |
| | Water | 20.70 | | | | |
| | Solid percantage (wt %) | 15.00 | | | | |
| 1-10 | Dispersion (4) | 225.00 | S.G. | not more | — | — |
| | Colloidal silica | 180.00 | 100 rpm | than 1 μm | | |
| | SNOWTEX-O (NISSAN KAGAKU, av. size of 15 nm, 20 wt % solid) | | 60 min. | | | |
| | Polyvinyl alcohol Z-100 (NIHON GOSEIKAGAKU, aqueous 10 wt %) | 36.00 | | | | |
| | Melamine resin, SUMILEX 613 (SUMITOMO CHEMICAL, aqueous 10 wt %) after disprsion, added/stirred | 4.00 | | | | |
| | Reaction accelerator ACX-P (SUMITOMO CHEMICAL, aqueous 10 wt %) after dispersion, added/stirred | 0.50 | | | | |
| | Titanium black 13M (MITSUBISHI MATERIAL, size of not more 100 nm, powder | 15.00 | | | | |
| | Water | 206.70 | | | | |
| | Solid percantage (wt %) | 15.00 | | | | |
| 1-11 | Dispersion (1) | 150.00 | S.G. | not more | not more | not less |
| | Colloidal silica | 150.00 | 1000 rpm | than 1 μm | than 100 nm | than 50 |
| | SNOWTEX-O (NISSAN KAGAKU, av. size of 15 nm, 20 wt % solid) | | 50 min. | | | |
| | Dispersion (3) | 200.00 | | | | |
| | Fused silica FB-6D (DENKI KAGAKU, av. size of 6 μm, particles of more than 10 μm were removed, powder) | 10.00 | | | | |
| | Titanium black 13M (MITSUBISHI MATERIAL, size of not more 100 nm, powder | 20.00 | | | | |
| | Water | 136.70 | | | | |
| | Solid percantage (wt %) | 15.00 | | | | |
| 1-12 | Dispersion (4) | 225.00 | | S.G. 1000 | not more | |
| | Colloidal silica | 180.00 | | rpm 60 | than 1 μm | |
| | SNOWTEX-O (NISSAN KAGAKU, av. size of 15 nm, 20 wt % solid) | | min. | | | |
| | Polyvinyl alcohol Z-100 | 36.00 | | | | |

TABLE 1-continued

| Coating Solution | Composition (Weight Parts) | | Dispersion condition | Porous Particle Size (SEM) | Avergae thickness of Flaky Inorganic Particles (SEM) | Aspect Ratio of Flaky Inorganic Particles (SEM) |
|---|---|---|---|---|---|---|
| | (NIHON GOSEIKAGAKU, aqueous 10 wt %) | | | | | |
| | Melamine resin, SUMILEZ 613 (SUMITOMO CHEMICAL, aqueous 10 wt %) after disprsion, added/stirred | 4.00 | | | | |
| | Reaction accelerator ACX-P (SUMITOMO CHEMICAL, aqueous 10 wt %) after dispersion, added/stirred | 0.50 | | | | |
| | Fused silica FB-6D (DENKI KAGAKU, av. size of 6 μm, particles of more than 10 μm were removed, powder) | 10.00 | | | | |
| | Titanium black 13M (MITSUBISHI MATERIAL, size of not more 100 nm, powder | 15.00 | | | | |
| | Water | 263.30 | | | | |
| | Solid percantage (wt %) | 15.00 | | | | |
| 1-13 | Dispersion (1) | 200.00 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % solid) | 100.00 | | | | |
| | Dispersion (3) | 200.00 | | | | |
| | Alumina (advanced Alumina), SUMICO RUNDUM AA-5 (SUMITOMO CHEMICAL, av. size of 5 μm, powder) | 11.00 | | | | |
| | Aqueous carbon black SD9020 (DAINIHON INK, primary particle size of not more 100 nm, 30 wt % solid) | 30.00 | | | | |
| | Water | 125.70 | | | | |
| | Solid percanatge (wt %) | 15.00 | | | | |
| 1-14 | Dispersion (4) | 225.00 | S.G. 1000 rpm 60 min. | not more than 1 μm | | |
| | Colloidal silica SNOWTEX-O (NISSAN KAGAKU, av. size of 15 nm, 20 wt % solid) | 180.00 | | | | |
| | Polyvinyl alcohol Z-100 (NIHON GOSEIKAGAKU, aqueous 10 wt %) | 36.00 | | | | |
| | Melamine resin, SUMILEZ 613 (SUMITOMO CHEMICAL, aqueous 10 wt%) after disprsion, added/stirred | 4.00 | | | | |
| | Reaction accelerator ACX-P (SUMITOMO CHEMICAL, aqueous 10 wt %) after dispersion, added/stirred | 0.50 | | | | |
| | Alumina (advanced Alumina), SUMICO RUNDUM AA-2 (SUMITOMO CHEMICAL, av. size of 2 μm, powder) | 10.00 | | | | |
| | Titanium black 13M (MITSUBISHI MATERIAL, size of not more 100 nm, powder | 15.00 | | | | |
| | Water | 263.30 | | | | |
| | Solid percanatge (wt %) | 15.00 | | | | |
| 1-15 | Dispersion (2) | 175.00 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % solid) | 100.00 | | | | |
| | Dispersion (3) | 200.00 | | | | |

TABLE 1-continued

| Coating Solution | Composition (Weight Parts) | | Dispersion condition | Porous Particle Size (SEM) | Avergae thickness of Flaky Inorganic Particles (SEM) | Aspect Ratio of Flaky Inorganic Particles (SEM) |
|---|---|---|---|---|---|---|
| | Alumina (advanced Alumina), SUMICO RUNDUM AA-5 (SUMITOMO CHEMICAL, av. size of 5 μm, powder) | 5.00 | | | | |
| | Titanium black 13M (MITSUBISHI MATERIAL, size of not more 100 nm, powder) | 20.00 | | | | |
| | Water | 156.70 | | | | |
| | Solid percantage (wt %) | 15.00 | | | | |
| 1-16 | Dispersion (2) | 175.00 | S.G. 1000 rpm 60 min | not more than 1 μm | not more than 100 nm | not less than 50 |
| | Colloidal silica SNOWTEX-XS (NISSAN KAGAKU, av. size of 5 nm, 20 wt % solid) | 70.00 | | | | |
| | Colloidal silica SNOWTEX-ZL (NISSAN KAGAKU, av. size of 85 nm, 40 wt % solid) | 40.00 | | | | |
| | Dispersion (3) | 200.00 | | | | |
| | Alumina (advanced Alumina), SUMICO RUNDUM AA-5 (SUMITOMO CHEMICAL, av. size of 5 μm, powder) | 10.00 | | | | |
| | Antimonyl oxide-doped tin oxide W-P (MITSUBISHI MATERIAL, primary particle size of 200 nm, powder) | 15.00 | | | | |
| | Water | 156.70 | | | | |
| | Solid percanatge (wt %) | 15.00 | | | | |
| 1-17 | Dispersion (2) | 175.00 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % solid) | 90.00 | | | | |
| | Dispersion (3) | 200.0 | | | | |
| | Alumina (advanced Alumina), SUMICO RUNDUM AA-2 (SUMITOMO CHEMICAL, av. size of 2 μm, powder) | 10.00 | | | | |
| | Polyvinyl alcohol Z-100 (NIHON GOSEIKAGAKU, aqueous 10 wt %) | 28.00 | | | | |
| | Melamine resin, SUMILEZ 613 (SUMITOMO CHEMICAL, aqueous 10 wt % after disprsion, added/stirred | 3.50 | | | | |
| | Reaction accelerator ACX-P (SUMITOMO CHEMICAL, aqueous 10 wt %) after dispersion, added/stirred | 0.50 | | | | |
| | Titanium black 13M (MITSUBISHI MATERIAL, size of not more 100 nm, powder | 15.00 | | | | |
| | Water | 145.70 | | | | |
| | Solid percanatge (wt %) | 15.00 | | | | |
| 1-18 | Dispersion (4) | 200.00 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % solid) | 100.00 | | | | |
| | Aqueous 30 wt % sodium silicate Type No. 3 | 20.00 | | | | |
| | Dispersion (3) | 200.00 | | | | |
| | Alumina (advanced Alumina), SUMICO RUNDUM AA-2 (SUMITOMO CHEMICAL, av. size of 2 μm, powder) | 5.00 | | | | |

TABLE 1-continued

| Coating Solution | Composition (Weight Parts) | | Dispersion condition | Porous Particle Size (SEM) | Avergae thickness of Flaky Inorganic Particles (SEM) | Aspect Ratio of Flaky Inorganic Particles (SEM) |
|---|---|---|---|---|---|---|
| | Aqueous carbon black SD9020 (DAINIHON INK, primary particle size of not more than 100 nm, 30 wt % solid) | 30.00 | | | | |
| | Water | 111.70 | | | | |
| | Solid percanatge (wt %) | 15.00 | | | | |
| 1-19 | Dispersino (2) | 175.00 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % solid) | 100.00 | | | | |
| | Aqueous 30 wt % sodium silicate Type No. 3 | 20.00 | | | | |
| | Dispersion (3) | 100.00 | | | | |
| | Alumina (advanced Alumina), SUMICO RUNDUM AA-5 (SUMITOMO CHEMICAL, av. size of 5 μm, powder) | 10.00 | | | | |
| | Titanium black 13M (MITSUBISHI MATERIAL, size of not more 100 nm, powder | 14.00 | | | | |
| | Water | 247.70 | | | | |
| | Solid percantage (wt %) | 15.00 | | | | |

*NISSAN CHEMICAL INDUSTRIES Co. Ltd.
*SG: Dispersing by the means of a sand grinder, in which High Bee 20 was employed as a dispersion medium.

TABLE 2

| Coating Solution | Composition (Weight Parts) | | Dispersion condition |
|---|---|---|---|
| 2-1 | Alumina particles (av. size of 3 μm, substantially no pore, powder) | 30.0 | S.G. 1000 rpm 20 min |
| | Colloidal silica SNOWTEX-S (NISSAN KAGAKU, av. size of 8 nm, 30 wt % solid) | 100.00 | |
| | Water | 270.0 | |
| | Solid percentage (wt %) | 15.0 | |
| 2-2 | Alumina particles (av. size of 3 μm, substantially no pore, powder) | 40.0 | S.G. 1000 rpm 30 min |
| | Colloidal silica SNOWTEX-S (NISSAN KAGAKU, av. size of 8 nm, 30 wt % solid) | 100.00 | |
| | Aqueous carbon black DENKA BLACK (DENKI KAGAKU, av. size of 42 nm, powder) | 10.0 | |
| | Water | 383.3 | |
| | Solid percentage (wt %) | 15.0 | |
| 2-3 | Titanium oxide particles (av. size of 0.3 μm, substantially no pore, powder) | 50.0 | S.G. 1000 rpm 60 min. |
| | Colloidal silica SNOWTEX-S (NISSAN KAGAKU, av. size of 8 nm, 30 wt % solid) | 100.00 | |
| | Phthalocyanine dye TX-112A (NIHON SHOKUBAI) | 5.0 | |
| | Water | 411.7 | |
| | Solid percentage (wt %) | 15.0 | |
| 2-4 | Titanium oxide particles (av. size of 0.3 μm, substantially no pore, powder) | 60.0 | S.G. 1000 rpm 30 min. |
| | Polyvinyl alcohol Z-100 (NIHON GOSEIKAGAKU, aqueous 10 wt %) | 250.0 | |
| | Melamine resin, SUMILEZ 613 (SUMITOMO CHEMICAL, aqueous 10 wt %) after dispersion, added/stirred | 45.0 | |
| | Reaction accelerator ACX-P (SUMITOMO CHEMICAL, aqueous 10 wt %) after dispersion, added/stirred | 5.0 | |

TABLE 2-continued

| Coating Solution | Composition (Weight Parts) | | Dispersion condition |
|---|---|---|---|
| | Water | 240.0 | |
| | Solid percentage (wt %) | 15.00 | |
| 2-5 | Titanium oxide particles | 60.0 | S.G. |
| | (av. size of 0.3 μm, substantially no pore, powder) | | 1000 rpm |
| | Polyvinyl alcohol | 250.0 | 60 min. |
| | Z-100 (NIHON GOSEIKAGAKU, aqueous 10 wt %) | | |
| | Melamine resin, | 45.0 | |
| | SUMILEZ 613 (SUMITOMO CHEMICAL, aqueous 10 wt %) after dispersion, added/stirred | | |
| | Reaction accelerator | | |
| | ACX-P (SUMITOMO CHEMICAL, aqueous 10 wt %) | | |
| | after dispersion, added/stirred | 5.0 | |
| | Phthalocyanine dye | 5.0 | |
| | TX-112A (NIHON SHOKUBAI) | | |
| | Water | 195.0 | |
| | Solid percentage (wt %) | 15.00 | |
| 2-6 | Alumina particles | 30.0 | S.G. |
| | (av. size of 3 μm, substantially no pore, powder) | | 1000 rpm |
| | Titanium oxide particles (av. size of 0.3 μm, substantially no pore, powder) | 24.0 | 60 min. |
| | Aqueous 30 wt % sodium silicate Type No. 3 | 120.0 | |
| | Water | 426.0 | |
| | Solid percentage (wt %) | 15.0 | |
| 2-7 | Alumina particles | 26.0 | S.G. |
| | (av. size of 3 μm, substantially no pore, powder) | | 1000 rpm |
| | Titanium oxide particles (av. size of 0.3 μm, substan-1000 rpm tially no pore, powder) | 25.0 | 60 min. |
| | Aqueous 30 wt % sodium silicate Type No. 3 | 100.0 | |
| | Aqueous carbon black SD9020 (DAINIHON INK, primary particle size of not more than 100 nm, 30 wt % solid) | 30.0 | |
| | Water | 419.0 | |
| | Solid percentage (wt %) | 15.0 | |
| 2-8 | Alumina particles | 25.0 | S.G. |
| | (av. size of 3 μm, substantially no pore, powder) | | 1000 rpm |
| | Titanium oxide particles (av. size of 0.3 μm, substan-1000 rpm tially no pore, powder) | 30.0 | 60 min. |
| | Aqueous 30 wt % sodium silicate Type No. 3 | 110.0 | |
| | Phthalocyanine dye EX COLOR 602K (NIHON SHOKUBAI) | 2.0 | |
| | Water | 433.0 | |
| | Solid percentage (wt %) | 15.0 | |
| 2-9 | Dry-processed silica particles | 35.0 | S.G. |
| | AEROSYL A300 (NIHON AEROSYL, av. size of 7 nm, powder) | | 1000 rpm |
| | Polyvinyl alcohol PVA235 (KURARE, aqueous 10 wt %) | 94.0 | 60 min. |
| | Glutar aldehyde after dispersion, added/stirring | 0.6 | |
| | Water | 170.4 | |
| | Solid percentage (wt %) | 15.00 | |
| 2-10 | Dry-processed silica particles | 26.0 | S.G. |
| | AEROSYL A300 (NIHON AEROSYL, av. size of 7 nm, powder) | | 1000 rpm |
| | Polyvinyl alcohol PVA235 (KURARE, aqueous 10 wt %) | 94.0 | 60 min. |
| | Glutar aldehyde after dispersion, added/stirring | 0.6 | |
| | Phthalocyanine dye TX-112A (NIHON SHOKUBAI) | 2.0 | |
| | Water | 142.0 | |
| | Solid percentage (wt %) | 15.00 | |
| 2-11 | Dry-processed silica particles | 25.0 | S.G. |
| | AEROSYL A300 (NIHON AEROSYL, av. size of 7 nm, powder) | | 1000 rpm |
| | Polyvinyl alcohol PVA235 (KURARE, aqueous 10 wt %) | 94.0 | 60 min. |
| | Glutar aldehyde after dispersion, added/stirring | 0.6 | |
| | Antimonyl oxide-doped tin oxide | 5.00 | |
| | T-1 (MITSUBISHI MATERIAL, primary particle size of 20 nm, powder) | | |
| | Water | 142.0 | |
| | Solid percentage (wt %) | 15.00 | |

TABLE 3

| Sample No | Substrate | Coating Solution | Average Layer Thickness | Evaluation: Resistance to Staining | Shadow Reproducibility | Fingerprint Stain | Stain Recovery (sheets) |
|---|---|---|---|---|---|---|---|
| 1-1 (Inv.) | PET-1 | 1-1 | 2 μm | Good | Excellent | Good | 15 |
| 1-2 (Inv.) | PET-1 | 1-2 | 2 μm | Good | Excellent | Excellent | 15 |

TABLE 3-continued

| Sample No | Substrate | Coating Solution | Average Layer Thickness | Evaluation: Resistance to Staining | Evaluation: Shadow Reproduci-bility | Evaluation: Fingerprint Stain | Evaluation: Stain Recovery (sheets) |
|---|---|---|---|---|---|---|---|
| 1-3 (Inv.) | PET-1 | 1-3 | 2 μm | Excellent | Excellent | Excellent | 12 |
| 1-4 (Inv.) | PET-1 | 1-4 | 2 μm | Excellent | Excellent | Excellent | 12 |
| 1-5 (Inv.) | PET-1 | 1-5 | 2 μm | Excellent | Excellent | Excellent | 12 |
| 1-6 (Inv.) | PET-1 | 1-6 | 2 μm | Excellent | Excellent | Excellent | 12 |
| 1-7 (Inv.) | PET-1 | 1-7 | 2 μm | Excellent | Excellent | Excellent | 13 |
| 1-8 (Inv.) | PET-1 | 1-8 | 2 μm | Good | Excellent | Excellent | 13 |
| 1-9 (Inv.) | PET-1 | 1-9 | 2 μm | Excellent | Excellent | Excellent | 10 |
| 1-10 (Inv.) | PET-1 | 1-10 | 2 μm | Excellent | Excellent | Excellent | 12 |
| 1-11 (Inv.) | PET-1 | 1-11 | 3.5 μm | Excellent | Excellent | Excellent | 10 |
| 1-12 (Inv.) | PET-1 | 1-12 | 3 μm | Excellent | Excellent | Excellent | 10 |
| 1-13 (Inv.) | PET-1 | 1-13 | 3 μm | Good | Excellent | Excellent | 12 |
| 1-14 (Inv.) | PET-1 | 1-14 | 1.5 μm | Excellent | Excellent | Excellent | 8 |
| 1-15 (Inv.) | PET-1 | 1-15 | 3.5 μm | Excellent | Excellent | Excellent | 10 |
| 1-16 (Inv.) | PET-1 | 1-16 | 3 μm | Excellent | Excellent | Excellent | 8 |
| 1-17 (Inv.) | PET-1 | 1-17 | 1 μm | Excellent | Excellent | Excellent | 10 |
| 1-18 (Inv.) | PET-1 | 1-18 | 1.5 μm | Good | Excellent | Excellent | 10 |
| 1-19 (Inv.) | PET-1 | 1-19 | 3 μm | Excellent | Excellent | Excellent | 8 |
| 1-1 (Comp.) | PET-1 | 2-1 | 2.5 μm | Slightly good | Poor | Poor | 50 |
| 1-2 (Comp.) | PET-1 | 2-2 | 2 μm | Slightly poor | Poor | Poor | 70 |
| 1-3 (Comp.) | PET-1 | 2-3 | 2 μm | Poor | Poor | Poor | >100 |
| 1-4 (Comp.) | PET-1 | 2-4 | 1.5 μm | Poor | Poor | Poor | >100 |
| 1-5 (Comp.) | PET-1 | 2-5 | 2 μm | Poor | Poor | Poor | >100 |
| 1-6 (Comp.) | PET-1 | 2-6 | 2.5 μm | Good | Poor | Poor | 50 |
| 1-7 (Comp.) | PET-1 | 2-7 | 2.5 μm | Slightly good | Poor | Poor | 80 |
| 1-8 (Comp.) | PET-1 | 2-8 | 2 μm | Slightly poor | Poor | Poor | 90 |
| 1-9 (Comp.) | PET-1 | 2-9 | 3 μm | Slightly poor | Slightly good | Poor | >100 |
| 1-10 (Comp.) | PET-1 | 2-10 | 3 μm | Slightly poor | Excellent | Poor | >100 |
| 1-11 (Comp.) | PET-1 | 2-11 | 3.5 μm | Slightly good | Slightly good | Poor | >100 |

TABLE 4

| Sample No. | Substrate | Coating Solution | Average Layer Thickness | Image Formation versud Exposure Energy: 150 mj/cm$^2$ | 200 mj/cm$^2$ | 250 mj/cm$^2$ | 300 mj/cm$^2$ | 350 mj/cm$^2$ | 400 mj/cm$^2$ |
|---|---|---|---|---|---|---|---|---|---|
| 20 (Inv.) | A1-4 | 1-10 | 3 μm | Slightly poor | Good | Good | Good | Good | Good |
| 21 (Inv.) | A1-1 | 1-15 | 3.5 μm | Slightly poor | Good | Good | Good | Good | Good |
| 22 (Inv.) | A1-1 | 1-17 | 1.5 μm | Slightly poor | Good | Good | Good | Good | Good |
| 23 (Inv.) | A1-1 | 1-18 | 1.5 μm | Slightly poor | Good | Good | Good | Good | Good |
| 24 (Inv.) | A1-4 | 1-14 | 1.5 μm | Slightly poor | Good | Good | Good | Good | Good |
| 25 (Inv.) | A1-2 | 1-16 | 3 μm | Slightly poor | Good | Good | Good | Good | Good |
| 26 (Inv.) | A1-2 | 1-19 | 3.5 μm | Slightly poor | Good | Good | Good | Good | Good |
| 27 (Inv.) | A1-3 | 1-6 | 1.5 μm | Slightly poor | Good | Good | Good | Good | Good |
| 12 (Comp.) | A1-1 | 2-6 | 2 μm | No image | No image | Poor | Slightly poor | Good | 5000 |
| 13 (Comp.) | A1-1 | 2-9 | 1 μm | No image | No image | No image | Poor | Slightly poor | Good |
| 14 (Comp.) | A1-1 | 2-10 | 3 μm | Poor | Slightly poor | Good | Good | Good | Good |
| 15 (Comp.) | A1-2 | 2-1 | 2 μm | No image | No image | Poor | Slightly poor | Good | Good |
| 16 (Comp.) | A1-4 | 2-8 | 3 μm | Poor | Slightly poor | Good | Good | Good | Good |

TABLE 4-continued

| | | | | | | | | | |
|---|---|---|---|---|---|---|---|---|---|
| 18 (Comp.) | A1-3 | 2-10 | 2 μm | Poor | Slightly poor | Good | Good | Good | Good |
| 20 (Comp.) | A1-3 | — | — | No image | No image | No image | No image | Poor | Slightly poor |

| | Image Formation versud Exposure Energy | | | | | |
|---|---|---|---|---|---|---|
| Sample No. | 150 mj/cm$^2$ | 200 mj/cm$^2$ | 250 mj/cm$^2$ | 300 mj/cm$^2$ | 350 mj/cm$^2$ | 400 mj/cm$^2$ |
| 20 (Inv.) | >5000 | >5000 | >5000 | >5000 | >5000 | >5000 |
| 21 (Inv.) | >5000 | >5000 | >5000 | >5000 | >5000 | >5000 |
| 22 (Inv.) | >5000 | >5000 | >5000 | >5000 | >5000 | >5000 |
| 23 (Inv.) | >5000 | >5000 | >5000 | >5000 | >5000 | >5000 |
| 24 (Inv.) | >5000 | >5000 | >5000 | >5000 | >5000 | >5000 |
| 25 (Inv.) | >5000 | >5000 | >5000 | >5000 | >5000 | >5000 |
| 26 (Inv.) | >5000 | >5000 | >5000 | >5000 | >5000 | >5000 |
| 27 (Inv.) | >5000 | >5000 | >5000 | >5000 | >5000 | >5000 |
| 12 (Comp.) | — | — | 10 | 50 | 100 | 200 |
| 13 (Comp.) | — | — | — | 50 | 300 | 1000 |
| 14 (Comp.) | 100 | 500 | 1000 | 1500 | 2000 | 2000 |
| 15 (Comp.) | — | — | 50 | 100 | 500 | 1500 |
| 16 (Comp.) | 20 | 100 | 500 | 1000 | 1000 | 1500 |
| 18 (Comp.) | 200 | 1000 | 1500 | 2000 | 2500 | 2500 |
| 20 (Comp.) | — | — | — | — | 50 | 200 |

TABLE 5

| | Support | | | Image Layer | | | Development Evaluation in Printing Machine | | |
|---|---|---|---|---|---|---|---|---|---|
| Sample No. | Substrate | Coating solution | Average Layer thickness | Compo-sition | Coating Amount (g/m$^2$) | Exposure (mJ/cm$^2$) | Image Formation | Stain in Printing Machine | Color Stain in Print |
| 28 (Inv.) | PET-1 | 1-13 | 3 μm | 2 | 1.0 | 150 | Good | No | No |
| 29 (Inv.) | PET-1 | 1-13 | 3 μm | 7 | 1.7 | 200 | Good | No | No |
| 30 (Inv.) | PET-1 | 1-14 | 0.5 μm | 3 | 1.0 | 150 | Good | No | No |
| 31 (Inv.) | PET-1 | 1-14 | 0.5 μm | 4 | 1.5 | 250 | Good | No | No |
| 32 (Inv.) | PET-1 | 1-14 | 0.5 μm | 6 | 1.7 | 200 | Good | No | No |
| 33 (Inv.) | PET-1 | 1-15 | 3 μm | 2 | 1.0 | 200 | Good | No | No |
| 34 (Inv.) | PET-1 | 1-15 | 3 μm | 4 | 1.5 | 200 | Good | No | No |
| 35 (Inv.) | PET-1 | 1-15 | 3 μm | 6 | 1.7 | 150 | Good | No | No |
| 36 (Inv.) | PET-1 | 1-18 | 0.5 μm | 6 | 1.7 | 200 | Good | No | No |
| 37 (Inv.) | PET-1 | 1-17 | 0.5 μm | 2 | 1.0 | 250 | Good | No | No |
| 38 (Inv.) | PET-1 | 1-17 | 0.5 μm | 4 | 1.5 | 150 | Good | No | No |
| 39 (Inv.) | PET-1 | 1-17 | 0.5 μm | 6 | 1.7 | 150 | Good | No | No |
| 40 (Inv.) | PET-1 | 1-17 | 0.5 μm | 7 | 1.7 | 250 | Good | No | No |
| 21 (Comp.) | PET-1 | 2-1 | 2 μm | 3 | 1.0 | 200 | No image | No | No |
| 22 (Comp.) | PET-1 | 2-4 | 2 μm | 5 | 1.6 | 200 | Slightly good | Yes | Yes |
| 23 (Comp.) | PET-1 | 2-6 | 2 μm | 6 | 1.7 | 200 | Image dropping-out | No | No |
| 24 (Comp.) | PET-1 | 2-8 | 2 μm | 2 | 1.0 | 200 | Image dropping-out | No | No |
| 25 (Comp.) | PET-1 | 2-8 | 2 μm | 5 | 1.6 | 200 | Image dropping-out | Yes | Yes |
| 26 (Comp.) | PET-1 | 2-9 | 3 μm | 5 | 1.6 | 200 | Slightly good | Yes | Yes |
| 27 (Comp.) | PET-1 | 2-9 | 3 μm | 6 | 1.7 | 200 | Slightly good | No | No |

| | Life Printability Evaluation | | | | | |
|---|---|---|---|---|---|---|
| Sample No. | Resistance to Staining at Reduced Water | Dampening Water Latitude | Small Dot Reproduci-bility | Blanket Stain | Plate | Visibility-after-exposure |
| 28 (Inv.) | Excellent | Excellent | Excellent | Excellent | >5000 | No |
| 29 (Inv.) | Excellent | Excellent | Excellent | Excellent | >5000 | Yes |
| 30 (Inv.) | Excellent | Excellent | Excellent | Excellent | >5000 | No |
| 31 (Inv.) | Excellent | Excellent | Excellent | Excellent | >5000 | No |
| 32 (Inv.) | Excellent | Excellent | Excellent | Excellent | >5000 | No |
| 33 (Inv.) | Excellent | Excellent | Excellent | Excellent | >5000 | No |
| 34 (Inv.) | Excellent | Excellent | Excellent | Excellent | >5000 | No |
| 35 (Inv.) | Excellent | Excellent | Excellent | Excellent | >5000 | No |
| 36 (Inv.) | Excellent | Excellent | Excellent | Excellent | >5000 | No |
| 37 (Inv.) | Excellent | Excellent | Excellent | Excellent | >5000 | No |
| 38 (Inv.) | Excellent | Excellent | Excellent | Excellent | >5000 | No |
| 39 (Inv.) | Excellent | Excellent | Excellent | Excellent | >5000 | No |

TABLE 5-continued

| | | | | | | |
|---|---|---|---|---|---|---|
| 40 (Inv.) | Excellent | Excellent | Excellent | Excellent | >5000 | Yes |
| 21 (Comp.) | Poor | Poor | — | Slightly poor | — | No |
| 22 (Comp.) | Very poor | Poor | Poor | Poor | 200 | No |
| 23 (Comp.) | Poor | Poor | — | Poor | <10 | No |
| 24 (Comp.) | Poor | Poor | — | Poor | <10 | No |
| 25 (Comp.) | Poor | Poor | — | Poor | <10 | No |
| 26 (Comp.) | Slightly poor | Slightly poor | Slightly poor | Slightly poor | 2000 | No |
| 27 (Comp.) | Slightly poor | Slightly poor | Slightly poor | Slightly poor | 2000 | No |

According to the invention, treatment for making the support surface hydrophilic can be performed by low-priced coating and there can be provided a support for printing plates exhibiting superior performance as a printing plate (such as water amount latitude, resistance to staining in a non-imaging area, prevention of blanket stain, etc.) to grained aluminum supports used in conventional presensitized plates, and having at least sufficient plate life.

There can further be provided a printing plate, which is handlable under room light, capable of forming images without necessitating ablation and therefore without worrying about staining an exposure apparatus, and superior in visibility-after-exposure characteristics; and an image forming method by the use thereof.

Example 2

Preparation of Porous Particle or Flaky Inorganic Particle Dispersing Solution

Dispersion (1)

Porous silica, SYLOJET P-403 (produced by GRACE Davison Co., a pore volume of 2.05 ml/g and an average particle size of 3 μm) is gradually added to water with stirring and a dispersing solution of 20% solid was obtained.

Dispersion (2)

Synthetic A-type zeolite, SILTON B (produced by MIZUSAWA INDUSTRIAL CHEMICALS Co. Ltd., a Al/Si ratio of 1, and an average particle size of 1.5 μm) is gradually added to water with stirring and a dispersing solution of 20% solid was obtained.

Dispersion (3)

Porous aluminosilicate, AMT silica #100B (produced by MIZUSAWA Kagaku Co., a pore volume of 0.5 ml/g or oil absorbing amount of 70 ml/100 g and an average particle size of 1 μm) is gradually added to water with stirring and a dispersing solution of 20% solid was obtained.

Dispersion (4)

Non-swellable synthetic mica (flaky inorganic material) Micromica ME-100 (produced by Cope Chemical Co., an average particle size of 1 to 5 μm and an aspect ratio of 20 to 30) is gradually added to water with stirring and a dispersing solution of 20% solid was obtained.

Dispersion (5)

Swellable synthetic mica, Somashiff ME-100 (produced by Cope Chemical Co., an average particle size of 1 to 5 μm and an aspect ratio of not less than 20) is gradually added to water with stirring and a dispersing solution of 5% solid was obtained. The resulting mica was supposed to be completely swelled, and the average particle thickness was not more than 100 nm and the aspect ratio was not less than 50.

Dispersion (6)

Dispersion (1) was dispersed using a sand grinder and hard glass beads High Bea 20 at 1,000 rpm, over a period of 1 hr. After dispersing, the dispersion was filtered to remove the glass beads to obtain Dispersion (6). The obtained dispersion was thinly coated on polyethylene terephthalate film and dried. As a result of SEM observation, it was proved that porous silica particles were pulverized and substantially not more than 1 μm in size.

Dispersion (7)

Dispersion (2) was treated in the same manner as in Dispersion (6) to obtain Dispersion (7). As a result of SEM observation, it was proved that zeolite particles were substantially not more than 1 μm in size.

Dispersion (8)

Dispersion (3) was treated in the same manner as in Dispersion (6) to obtain Dispersion (8). As a result of SEM observation, it was proved that aluminosilicate particles were substantially not more than 1 μm in size.

Dispersion (9)

Dispersion (4) was treated in the same manner as in Dispersion (6) to obtain Dispersion (9). The SEM observation, revealed that the mica underwent interlayer peeling-off resulting in an aspect ratio of ca. 50 and an average thickness of not more than 100 nm.

Preparation of Coating Solution of Hydrophilic Layer

Solutions were prepared in accordance with the composition and dispersing condition as shown in Table 6 and filtered to obtain coating solutions of a hydrophilic layer, 3-1 to 3-26 and 4-1 to 4-6. Each of the coating solutions was coated on PET film and dried. The form of porous particles or flaky inorganic particles was observed by scanning electronmicroscope (SEM), as shown in the Table.

TABLE 6

| Coating Solution | Composition (Weight Parts) | | Dispersion condition | Porous Particle Size (SEM) | Average thickness of Flaky Inorganic Particles (SEM) | Aspect Ratio of Flaky Inorganic Particles (SEM) |
|---|---|---|---|---|---|---|
| 3-1 | Dispersion (1) | 150.0 | S.G.* | not more | — | — |
| | Colloidal silica | 150.0 | 1000 rpm | than 2 μm | | |
| | SNOWTEX-O (NISSAN KAGAKU, av. size of 15 nm, 20 wt % solid) | | 30 min. | | | |
| | Water | 100.0 | | | | |
| | Solid percantage (wt %) | 15.0 | | | | |

TABLE 6-continued

| Coating Solution | Composition (Weight Parts) | | Dispersion condition | Porous Particle Size (SEM) | Average thickness of Flaky Inorganic Particles (SEM) | Aspect Ratio of Flaky Inorganic Particles (SEM) |
|---|---|---|---|---|---|---|
| 3-2 | Dispersion (2) | 150.0 | S.G. | not more | — | — |
| | Colloidal silica | 100.0 | 20 min. | than 15 μm | | |
| | SNOWTEX-S (NISSAN KAGAKU, av. size of 8 nm, 30 wt % solid) | | 20 rpm | | | |
| | Water | 100.0 | | | | |
| | Solid percantage (wt %) | 15.0 | | | | |
| 3-3 | Dispersion (6) | 150.00 | Stirring | not more | — | — |
| | Colloidal silica | 150.0 | only | than 1 μm | | |
| | SNOWTEX-O (NISSAN KAGAKU, av. size of 15 nm, 20 wt % solid) | | | | | |
| | Water | 100.0 | | | | |
| | Solid percantage (wt %) | 15.0 | | | | |
| 3-4 | Dispersion (8) | 200.0 | Stirring | not more | — | — |
| | Colloidal silica | 100.0 | only | than 1 μm | | |
| | SNOWTEX-O (NISSAN KAGAKU, av. size of 15 nm, 20 wt % solid) | | | | | |
| | Water | 100.0 | | | | |
| | Solid percantage (wt %) | 15.0 | | | | |
| 3-5 | Dispersion (7) | 150.0 | Stirring | not more | — | — |
| | Colloidal silica | 100.0 | only | than 1 μm | | |
| | SNOWTEX-S (NISSAN KAGAKU, av. size of 8 nm, 30 wt % solid) | | | | | |
| | Water | 150.0 | | | | |
| | Solid percantage (wt %) | 15.0 | | | | |
| 3-6 | Dispersion (7) | 200.0 | Stirring | not more | — | — |
| | Colloidal silica | 66.7 | only | than 1 μm | | |
| | SNOWTEX-S (NISSAN KAGAKU, av. size of 8 nm, 30 wt % solid) | | | | | |
| | Water | 133.3 | | | | |
| | Solid percantage (wt %) | 15.0 | | | | |
| 3-7 | Dispersion (1) | 200.0 | S.G. | not more | — | — |
| | Colloidal silica | 100.0 | 1000 rpm | than 1 μm | | |
| | SNOWTEX-O (NISSAN KAGAKU, av. size of 15 nm, 20 wt % solid) | | 60 min. | | | |
| | Water | 100.0 | | | | |
| | Solid percantage (wt %) | 15.0 | | | | |
| 3-8 | Dispersion (1) | 200.0 | S.G. | not more | — | — |
| | Colloidal silica | 85.0 | 1000 rpm | than 1 μm | | |
| | SNOWTEX-O (NISSAN KAGAKU, av. size of 15 nm, 20 wt % solid) | | 60 min. | | | |
| | Polyvinyl alcohol, Z-100 (NIHON GOSEIKAGAKU, aqueous 10 wt %) | 26.0 | | | | |
| | Melamine resin, SUMILEZ 613 (SUMITOM CHEMICAL, aqueous 10 wt %) after disprsion, added/stirred | 3.5 | | | | |
| | Reaction accelerator ACX-P (SUMITOMO CHEMICAL, aqueous 10 wt %) after dispersion, added/stirred | 0.5 | | | | |
| | Water | 85.0 | | | | |
| | Solid percantage (wt %) | 15.0 | | | | |
| 3-9 | Dispersion (2) | 200.0 | S.G. | not more | — | — |
| | Colloidal silica | 66.7 | 1000 rpm | than 1 μm | | |
| | SNOWTEX-S (NISSAN KAGAKU, av. size of 8 nm, 30 wt % solid) | | 60 min. | | | |
| | Water | 133.3 | | | | |
| | Solid percantage (wt %) | 15.0 | | | | |
| 3-10 | Dispersion (2) | 200.0 | S.G. | not more | | |
| | Colloidal silica | 66.7 | 1000 rpm | than 1 μm | | |
| | SNOWTEX-S (NISSAN KAGAKU, av. size of 8 nm, 30 wt % solid) | | 60 min. | | | |
| | Gelatin 01HR20 (aqueous 10 | 26.0 | | | | |

TABLE 6-continued

| Coating Solution | Composition (Weight Parts) | | Dispersion condition | Porous Particle Size (SEM) | Average thickness of Flaky Inorganic Particles (SEM) | Aspect Ratio of Flaky Inorganic Particles (SEM) |
|---|---|---|---|---|---|---|
| | wt %) | | | | | |
| | Melamine resin, SUMILEZ 613 (SUMITOM CHEMICAL, aqueous 10 wt %) after disprsion, added/stirred | 3.5 | | | | |
| | Reaction accelerator ACX-P (SUMITOMO CHEMICAL, aqueous 10 wt %) after dispersion, added/stirred | 0.5 | | | | |
| | Water | 113.3 | | | | |
| | Solid percantage (wt %) | 15.0 | | | | |
| 3-11 | Dispersion (6) | 200.0 | S.G. 1000 rpm 60 min. | not more than 2 μm | — | — |
| | Colloidal silica SNOWTEX-O (NISSAN KAGAKU, av. size of 15 nm, 20 wt % solid) | 100.0 | | | | |
| | Water | 100.0 | | | | |
| | Solid percantage (wt %) | 15.0 | | | | |
| 3-12 | Dispersion (8) | 200.0 | S.G. 1000 rpm 60 min. | not more than 1 μm | — | — |
| | Colloidal silica SNOWTEX-S (NISSAN KAGAKU, av. size of 8 nm, 30 wt % solid) | 66.7 | | | | |
| | Water | 133.3 | | | | |
| | Solid percantage (wt %) | 15.0 | | | | |
| 3-13 | Dispersion (7) | 200.0 | Stirring only | not more than 1 μm | not more than 100 nm | not less than 50 |
| | Colloidal silica SNOWTEX-S (NISSAN KAGAKU, av. size of 8 nm, 30 wt % solid) | 66.7 | | | | |
| | Dispersion (5) | 200.0 | | | | |
| | Solid percantage (wt %) | 15.0 | | | | |
| 3-14 | Dispersion (8) | 200.0 | Stirring only | not more than 1 μm | not more than 100 nm | not less than 50 |
| | Colloidal silica SNOWTEX-S (NISSAN KAGAKU, av. size of 8 nm, 30 wt % solid) | 66.7 | | | | |
| | Dispersion (9) | 50.0 | | | | |
| | Solid percantage (wt %) | 150.0 | | | | |
| 3-15 | Dispersion (8) | 200.0 | S.G. 1000 rpm 60 min. | not more than 1 μm | not more than 100 nm | not less than 50 |
| | Colloidal silica SNOWTEX-O (NISSAN KAGAKU, av. size of 15 nm, 20 wt % solid) | 100.0 | | | | |
| | Dispersion (5) | 200.00 | | | | |
| | Solid percantage (wt %) | 14.0 | | | | |
| 3-16 | Dispersion (8) | 200.0 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % solid) | 66.7 | | | | |
| | Dispersion (5) | 200.0 | | | | |
| | Solid percantage (wt %) | 15.0 | | | | |
| 3-17 | Dispersion (2) | 200.0 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % solid) | 66.7 | | | | |
| | Dispersion (5) | 300.0 | | | | |
| | Water | 10.3 | | | | |
| | Solid percantage (wt %) | 13.0 | | | | |
| 3-18 | Dispersion (2) | 200.0 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % solid) | 66.7 | | | | |
| | Dispersion (4) | 50.0 | | | | |
| | Water | 150.0 | | | | |
| | Solid percantage (wt %) | 15.0 | | | | |
| 3-19 | Dispersion (3) | 200.0 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % | 56.7 | | | | |

TABLE 6-continued

| Coating Solution | Composition (Weight Parts) | | Dispersion condition | Porous Particle Size (SEM) | Average thick-ness of Flaky Inorganic Particles (SEM) | Aspect Ratio of Flaky Inorganic Particles (SEM) |
|---|---|---|---|---|---|---|
| | solid) | | | | | |
| | Dispersion (5) | 200.0 | | | | |
| | Polyvinyl alcohol, Z-100 (NIHON GOSEIKAGAKU, aqueous 10 wt %) | 26.0 | | | | |
| | Melamine resin, SUMILEZ 613 (SUMITOMO CHEMICAL, aqueous 10 wt %) after disprsion, added/stirred | 3.5 | | | | |
| | Reaction accelerator ACX-P (SUMITOMO CHEMICAL, aqueous 10 wt %) after dispersion, added/stirred | 0.5 | | | | |
| | Water | 13.3 | | | | |
| | Solid percantage (wt %) | 14.0 | | | | |
| 3-20 | Dispersion (3) | 200.0 | S.G. | not more | not more | not less |
| | Colloidal silica SNOWTEX-O (NISSAN KAGAKU, av. size of 15 nm, 20 wt % solid) | 125.0 | 1000 rpm 60 min. | than 1 μm | than 100 nm | than 50 |
| | Dispersion (5) | 200.0 | | | | |
| | Fused silica FB-6D (DENKI KAGAKU, av. size of 6 μm, particles of more than 10 μm were removed, powder) | 10.00 | | | | |
| | Water | 31.7 | | | | |
| | Solid percantage (wt %) | 15.0 | | | | |
| 3-21 | Dispersion (3) | 200.0 | S.G. | not more | not more | not less |
| | Colloidal silica SNOWTEX-S (NISSAN KAGAKU, av. size of 8 nm, 30 wt % solid) | 83.3 | 1000 rpm 60 min. | than 1 μm | than 100 nm | than 50 |
| | Dispersion (5) | 200.0 | | | | |
| | Fused silica FB-6D (DENKI KAGAKU, av. size of 6 μm, particles of more than 10 μm were removed, powder) | 10.0 | | | | |
| | Water | 73.3 | | | | |
| | Solid percantage (wt %) | 15.0 | | | | |
| 3-22 | Dispersion (3) | 200.0 | S.G. | not more | not more | not less |
| | Colloidal silica SNOWTEX-S (NISSAN KAGAKU, av. size of 8 nm, 30 wt % solid) | 83.3 | 1000 rpm 60 min. | than 1 μm | than 100 nm | than 50 |
| | Dispersion (4) | 200.0 | | | | |
| | Alumina (advanced Alumina), SUMICO RUNDUM AA-5 (SUMITOMO CHEMICAL, av. size of 5 μm, powder) | | | | | |
| | Water | 73.3 | | | | |
| | Solid percantage (wt %) | 15.0 | | | | |
| 3-23 | Dispersion (2) | 200.0 | S.G. | not more | not more | not less |
| | Colloidal silica SNOWTEX-S (NISSAN KAGAKU, av. size of 8 nm, 30 wt % solid) | 66.7 | 1000 rpm 60 min. | than 1 μm | than 100 nm | than 50 |
| | Dispersion (5) | 200.00 | | | | |
| | Alumina (advanced Alumina), SUMICO RUNDUM AA-5 (SUMITOMO CHEMICAL, av. size of 5 μm, powder) | 5.0 | | | | |
| | Water | 28.3 | | | | |
| | Solid percantage (wt %) | 15.0 | | | | |
| 3-24 | Dispersion (2) | 200.0 | S.G. | not more | not more | not less |
| | Colloidal silica SNOWTEX-XS (NISSAN KAGAKU, av. size of 5 nm, 20 wt % solid) | 70.0 | 1000 rpm 60 min. | than 1 μm | than 100 nm | than 50 |
| | Colloidal silica SNOWTEX-ZL (NISSAN KAGAKU, av. size of 85 nm, | 40.0 | | | | |

TABLE 6-continued

| Coating Solution | Composition (Weight Parts) | | Dispersion condition | Porous Particle Size (SEM) | Average thickness of Flaky Inorganic Particles (SEM) | Aspect Ratio of Flaky Inorganic Particles (SEM) |
|---|---|---|---|---|---|---|
| | 40 wt % solid) | | | | | |
| | Dispersion (5) | 200.0 | | | | |
| | Alumina (advanced Alumina), SUMICO RUNDUM AA-5 (SUMITOMO CHEMICAL, av. size of 5 μm, powder) | 10.0 | | | | |
| | Water | 80.0 | | | | |
| | Solid percantage (wt %) | 15.00 | | | | |
| 3-25 | Dispersion (3) | 200.0 | S.G. 1000 rpm 60 min. | not more than 1 μm | — than 100 nm | — than 50 |
| | Colloidal silica SNOWTEX-S (NISSAN KAGAKU, av. size of 8 nm, 30 wt % solid) | 73.3 | | | | |
| | Alumina (advanced Alumina), SUMICO RUNDUM AA-5 (SUMITOMO CHEMICAL, av. size of 5 μm, powder) | 10.0 | | | | |
| | Polyvinyl alcohol, Z-100 (NIHON GOSEIKAGAKU, aqueous 10 wt %) | 26.0 | | | | |
| | Melamine resin, SUMILEZ 613 (SUMITOMO CHEMICAL, aqueous 10 wt %) after disprsion, added/stirred | 3.5 | | | | |
| | Reaction accelerator ACX-P (SUMITOMO CHEMICAL, aqueous 10 wt %) after dispersion, added/stirred | 0.5 | | | | |
| | Water | 53.3 | | | | |
| | Solid percantage (wt %) | 15.0 | | | | |
| 3-26 | Dispersion (2) | 200.0 | S.G. 1000 rpm 60 min. | not more than 1 μm | not more than 100 nm | not less than 50 |
| | Colloidal silica SNOWTEX-S (NISSAN KAGAKU, av. size of 8 nm, 30 wt % solid) | 80.0 | | | | |
| | Aqueous 30 wt % soduim silicate Type No. 3 | 20.00 | | | | |
| | Dispersion (5) | 200.0 | | | | |
| | Alumina (advanced Alumina), SUMICO RUNDUM AA-5 (SUMITOMO CHEMICAL, av. size of 5 μm, powder) | 10.0 | | | | |
| | Water | 90.0 | | | | |
| | Solid percantage (wt %) | 15.0 | | | | |

TABLE 7

| Coating Solution | Composition (Weight Parts) | | Dispersion condition |
|---|---|---|---|
| 4-1 | Alumina particles (av. size of 3 μm, substantially no pore, powder) | 30.0 | S. G. 1000 rpm 60 min. |
| | Colloidal silica SNOWTEX-S (NISSAN KAGAKU, av. size of 8 nm, 30 wt % solid) | 100.0 | |
| | Water | 270.00 | |
| | Solid percentage (wt %) | 15.0 | |
| 4-2 | Titanium oxide particles (av. size of 0.3 μm, tially no pore, powder) | 50.0 | S. G. 1000 rpm 60 min. |
| | Colloidal silica SNOWTEX-S (NISSAN KAGAKU, av. size of 8 nm, 30 wt % solid) | 100.0 | |
| | Water | 383.3 | |
| | Solid percentage (wt %) | 15.0 | |
| 4-3 | Titanium oxide particles (av. size of 0.3 μm, tially no pore, powder) | 50.0 | S. G. 1000 rpm 60 min. |
| | Polyvinyl alcohol Z-100 (NIHON GOSEIKAGAKU, aqueous 10 wt %) | 250.0 | |
| | Melamine resin, SUMILEZ 613 | 45.0 | |

TABLE 7-continued

| Coating Solution | Composition (Weight Parts) | | Dispersion condition |
|---|---|---|---|
| | (SUMITOMO CHEMICAL, aqueous 10 wt %) after disprsion, added/stirred | | |
| | Reaction accelerator ACX-P (SUMITOMO CHEMICAL, aqueous 10 wt %) after dispersion, added/stirred | 5.0 | |
| | Water | 183.3 | |
| | Solid percentage (wt %) | 15.0 | |
| 4-4 | Titanium oxide particles (av. size of 0.3 μm, substantially no pore, powder) | 50.0 | S. G. 1000 rpm 60 min. |
| | Gelatin 01HR20 (aqueous 10 wt %) | 250.0 | |
| | Melamine resin, SUMILEZ 613 (SUMITOMO CHEMICAL, aqueous 10 wt %) after disprsion, added/stirred | 45.0 | |
| | Reaction accelerator ACX-P (SUMITOMO CHEMICAL, aqueous 10 wt %) after dispersion, added/stirred | 5.0 | |
| | Water | 183.3 | |
| | Solid percentage (wt %) | 15.0 | |

TABLE 7-continued

| Coating Solution | Composition (Weight Parts) | | Dispersion condition |
|---|---|---|---|
| 4-5 | Alumina particles (av. size of 3 μm, substantially no pore, powder) | 25.0 | S. G. 1000 rpm 60 min. |
| | Titanium oxide particles (av. size of 0.3 μm, substantially no pore, powder) | 25.0 | |
| | Aqueous 30 wt % sodium silicate Type No. 3 | 100.0 | |
| | Water | 383.3 | |
| | Solid percentage (wt %) | 15.0 | |
| 4-6 | Dry-processed silica particles AEROSYL A300 (NIHON AEROSYL, av. size of 7 nm, powder) | 30.0 | S. G. 1000 rpm 60 min. |
| | Polyvinyl alcohol PVA235 (KURARE, aqueous 10 wt %) | 94.0 | |
| | Glutar aldehyde after dispersion, added/stirring | 0.6 | |
| | Water | 142.0 | |
| | Solid percentage (wt %) | 15.0 | |

Preparation of Support for Printing Plate

Supports for printing plates were prepared using the combination of a coating solution, a substrate and a coating thickness, as shown in Tables 8 to 10. The hydrophilic layer was coated using a wire bar. To obtain a desired thickness, the wire bar was optimally varied according to the composition of the coating solution and the solid component concentration. After coating, coat was dried at 100° C. for 30 sec. Only in the support employed in Samples 35 or 36, the hydrophilic layer was coated by the spraying method and dried under the same condition. Substrates PET-1, Al-1 to Al-4 shown in the Tables were the same as employed in Example 1.

The thus prepared supports for printing plates were evaluated as follows

Physical Property Evaluation

Supports used in inventive Samples 1 to 26, 35 and 36, and comparative Samples 1 to 6 were evaluated with respect to physical properties, as shown in Table 8.

Cracking

The extent of cracking occurred in the coating layer was evaluated according to SEM observation, based on the following criteria:

A: No crack observed,

B: Slight cracks observed,

C: Cracks observed, which are not continuous, and

D: Cracks observed, which continuous and mosaic tile-like.

Scaling

Each support was wound around a round bar of 4 mmφ in such a manner that the hydrophilic layer-side was outwardly wound at an angle of 180°, and then was returned. After this procedure was repeated ten times, an adhesive-tape was attached to the hydrophilic layer-side, peeled off and evaluation was made according to SEM observation with respect to scaling of the hydrophilic layer, based on the following criteria:

A: No scaling observed,

B: Slightly cracking observed, but the substrate surface being little exposed,

C: Crack of not less than 5% and less than 10%, based on area, observed, and the substrate surface being exposed, and D: Crack of not less than 10% observed, the substrate surface being exposed.

Abrasion

Using an abrasion testing machine (HEIDON-18), a needle having a steel ball of 1 mmφ at the top and with loading a load of 50 g was allowed to reciprocate ten times on the hydrophilic layer surface at a rate of 20 cm/min, and evaluation was made with abrasion mark, based on the following criteria:

A: No abrasion was observed,

B: Slight abrasion was observed,

C: Abrasion mark of 0.4 mm or more in width, and

D: Substrate surface was exposed or abortion flaws occurred.

Preparation of Printing Plate

Images were formed by an ink jet system using an ink having the following composition and then dried at 100° c. for 2 min. to obtain printing plate samples, as shown in Table 8. The image formation by the ink jet system was performed at an ink discharging amount to give a dot diameter of ca 40 μm on the printing plate and at a resolution of 720 dpi.

| Ink composition | |
|---|---|
| Latex particles, Yodosol GD87B aqueous solution (available from KANEBO NSG Co., average size of 90 nm, Tg of 60° C., 50 wt % solid) | 170 parts |
| Carboxymethyl cellulose CMC-1220 (available from DAICEL Chemical Ind. Co.) | 5 parts |
| Aqueous carbon black solution (containing dispersing agent) SD9020 (available from Dainihon Ink Corp., primary particle size of 100 nm and 30 wt % solid) | 33 parts |
| Water was to make 7.0 wt % solid | |

Printing Condition

Employing a printing machine, HEIDER GTO, printing was performed by the use of coated paper, dampening water (H-solution SG-51, concentration of 1.5%, and available from TOKYO INK corp.) and an ink (TOYO KING HIGH ECHO M deep red, available from TOYO INK Corp.).

Evaluation

The thus prepared printing samples were evaluated with respect to printability according to the following.

Resistance to Staining in Non-imaging Area

At the time 1000 sheets were printed, the extent of staining in non-imaging area was visually evaluated.

Reproducibility of Shadow

At the time 1000 sheets were printed, reproducibility of screen images was visually evaluated in a shadow portion (70% halftone dot at 120 lines per inch).

Fingerprint Stain

An extent of staining at a previously fingerprinted portion in a non-imaging area was visually evaluated at the time of 1,000 sheets were printed Recovery from Staining At the time 1,000 sheets were printed, supplying of dampening water was stopped and only ink was attached overall to the printing plate. Thereafter, dampening water was again supplied and printing was again performed. Stain recovery was evaluated, based on the number of printed sheets at the time the extent of staining in non-imaging area became the same as that at the time 1,000 sheets were printed (the more, the worse).

Results of evaluation are shown in Table 8. In the Table, "slightly poor" and "poor" are levels unacceptable to practical uses.

Inventive Samples 27 to 34 and comparative Samples 7 to 15 were evaluated with respect to physical property of the supports and printability of printing plates by use the supports.

Physical Property

Measurement of Surface Roughness (Ra) of Hydrophilic Layer

Surface roughness (Ra) of the hydrophilic layer was measured using an optical three-dimensional surface roughness measuring machine RST plus (available from WYKO corp.). The measurement was made using an objective lens (of ×40) and an intermediate lens (of ×1.0) and at a field of view of 111×150 μm. An average value of measurements of n=5 was determined. Since the hydrophilic layer was light transmittable, the measurement was made after the sample surface was coated with aluminum in a thickness of ca. 50 nm by the vapor evaporation.

Printing Plate Preparation

On polyethylene terephthalate film of 50 μm thick, a thermal transfer layer (of 1.5 μm thick) having the following composition was formed to prepare a thermal transfer sheet. The thermal transfer layer was brought into contact with the hydrophilic layer of the support for printing plate, wound around a drum of a laser exposure apparatus so that the thermal transfer sheet was outwardly wound, and then imagewise exposed to 830 nm infrared laser. An image layer was thermally transferred to obtain a printing plate.

| Composition of thermal transfer layer | |
|---|---|
| Latex particles, Yodosol GD87B aqueous solution (available from KANEBO NSG Co., average size of 90 nm, Tg of 60° C., 50 wt % solid) | 100 parts |
| Microcrystaline Wax Emulsion A206 (available from Gifu Selac Co., average size of 0.5 μm, softening point of 65° C., meting point of 108° C., melt viscosity of 8 cps at 140° C., 40 wt % solid) | 125 parts |
| Aqueous carbon black solution (containing dispersing agent) SD9020 (available from Dainihon Ink Corp., primary particle size of 100 nm and 30 wt % solid) | 50 parts |
| Water was added to make 11.0 wt % solid. | |

Printing Condition

Employing a printing machine DAIYAIF-1 (produced by MITSUBISHI JUHKOGYO Co.,), printing was performed by the use of coated paper, dampening water (H-solution SG-51, concentration of 1.5%, and available from TOKYO INK corp.) and an ink (HIGH plus M deep red, available from TOYO INK Corp.).

Evaluation

The thus prepared printing samples (inventive Samples 27 to 34 and comparative Samples 7 to 15) were evaluated with respect to printability according to the following.

Resistance to Staining at Low Water-supplying Rate

When a dampening water-supplying rate was reduced, resistance to staining (i.e., entanglement of halftone dots, stain in non-imaging area) was evaluated.

Water Amount Latitude

When a dampening water-supplying rate was varied, latitude of the water-supplying rate in which superior print quality was obtained was determined.

Small Dot Reproducibility

It was compared whether dots of 25 μm in diameter formed on a printing plate are confirmed on a print at the time of 100 sheets being printed.

Blanket Stain

Stains accumulated on a blanket were peeled off with a tape at the time of 2,000 sheets being printed, the tape was attached onto white paper to compare an extent of staining.

Plate Life

Printing was carried our until ink receptivity reached an unacceptable level, the number of at that time was determined to evaluate the plate life.

Evaluation results are shown in Table 9. In the Table, the grades “slightly poor”, “poor” and “very poor” are unacceptable levels to practical uses.

The degree of orientation of flaky inorganic particles contained on the hydrophilic layer of inventive Samples 16, 17, 35 and 36 was measured by observing the section of the support with a scanning electronmicroscope, according to the afore-mentioned manner. The higher the degree of orientation, the higher the layer strength. Results thereof are shown in Table 10, together with the evaluation with respect to physical properties. In the Table, the grades the grade “D” is an unacceptable level to practical uses.

TABLE 8

| | | | | | | | Print Evaluation | | | |
|---|---|---|---|---|---|---|---|---|---|---|
| | | Coating | Average Layer Thickness | Physical Property Evaluation | | | Resistance | Shadow | Fingerprint | Recovery from Staining |
| Sample No. | Substrate | Solution | (μm) | Cracking | Scaling | Abrasion | to Staining | Reproducibility | Stain | (sheets) |
| 2-1 (Inv.) | PET-1 | 3-1 | 2 | B | C | C | Good | Good | Good | 20 |
| 2-2 (Inv.) | PET-1 | 3-2 | 2 | C | C | C | Good | Good | Good | 25 |
| 2-3 (Inv.) | PET-1 | 3-3 | 2 | B | B | B | Excellent | Excellent | Good | 30 |
| 2-4 (Inv.) | PET-1 | 3-4 | 2 | B | B | B | Excellent | Excellent | Excellent | 30 |
| 2-5 (Inv.) | PET-1 | 3-5 | 2 | B | B | B | Excellent | Excellent | Excellent | 30 |
| 2-6 (Inv.) | PET-1 | 3-6 | 2 | B | B | B | Excellent | Excellent | Excellent | 30 |
| 2-7 (Inv.) | PET-1 | 3-7 | 2 | B | B | B | Excellent | Excellent | Good | 30 |
| 2-8 (Inv.) | PET-1 | 3-8 | 2 | A | A | B | Excellent | Excellent | Good | 40 |
| 2-9 (Inv.) | PET-1 | 3-9 | 2 | B | B | B | Excellent | Excellent | Excellent | 30 |
| 2-10 (Inv.) | PET-1 | 3-10 | 2 | A | A | B | Excellent | Good | Excellent | 45 |
| 2-11 (Inv.) | PET-1 | 3-11 | 2 | B | B | B | Excellent | Excellent | Good | 20 |
| 2-12 (Inv.) | PET-1 | 3-12 | 2 | B | B | B | Excellent | Excellent | Excellent | 20 |
| 2-13 (Inv.) | PET-1 | 3-13 | 2 | A | B | B | Excellent | Excellent | Excellent | 20 |
| 2-14 (Inv.) | PET-1 | 3-14 | 2 | A | B | B | Excellent | Excellent | Excellent | 20 |
| 2-15 (Inv.) | PET-1 | 3-15 | 2 | A | A | B | Excellent | Excellent | Good | 20 |
| 2-16 (Inv.) | PET-1 | 3-16 | 2 | A | A | B | Excellent | Excellent | Excellent | 20 |
| 2-17 (Inv.) | PET-1 | 3-17 | 2 | A | A | B | Excellent | Excellent | Excellent | 20 |
| 2-18 (Inv.) | PET-1 | 3-18 | 2 | A | A | B | Excellent | Excellent | Excellent | 20 |
| 2-19 (Inv.) | PET-1 | 3-19 | 2 | A | A | A | Excellent | Excellent | Excellent | 40 |

TABLE 8-continued

| Sample No. | Substrate | Coating Solution | Average Layer Thickness (μm) | Physical Property Evaluation Cracking | Scaling | Abrasion | Print Evaluation Resistance to Staining | Shadow Reproducibility | Fingerprint Stain | Recovery from Staining (sheets) |
|---|---|---|---|---|---|---|---|---|---|---|
| 2-20 (Inv.) | PET-1 | 3-20 | 2 | A | A | A | Excellent | Excellent | Good | 20 |
| 2-21 (Inv.) | PET-1 | 3-21 | 2 | A | A | A | Excellent | Excellent | Excellent | 15 |
| 2-22 (Inv.) | PET-1 | 3-22 | 2 | A | A | A | Excellent | Excellent | Excellent | 15 |
| 2-23 (Inv.) | PET-1 | 3-23 | 2 | A | A | A | Excellent | Excellent | Excellent | 15 |
| 2-24 (Inv.) | PET-1 | 3-24 | 2 | A | A | A | Excellent | Excellent | Excellent | 12 |
| 2-25 (Inv.) | PET-1 | 3-25 | 2 | A | A | A | Excellent | Excellent | Excellent | 20 |
| 2-26 (Inv.) | PET-1 | 3-26 | 2 | A | A | A | Excellent | Excellent | Excellent | 15 |
| 2-1 (Comp.) | PET-1 | 3-1 | 2 | D | D | D | Good | Poor | Poor | 50 |
| 2-2 (Comp.) | PET-1 | 3-2 | 2 | D | D | B | Good | Poor | Poor | >100 |
| 2-3 (Comp.) | PET-1 | 3-3 | 2 | A | A | C | Poor | Poor | Poor | >100 |
| 2-4 (Comp.) | PET-1 | 3-4 | 2 | A | A | C | Poor | Poor | Poor | >100 |
| 2-5 (Comp.) | PET-1 | 3-5 | 2 | D | D | D | Good | Poor | Poor | 40 |
| 2-6 (Comp.) | PET-1 | 3-6 | 2 | B | B | C | Slightly poor | Slightly good | Poor | >100 |

TABLE 9

| Sample No. | Substrate | Coating Solution | Average Layer Thickness (μm) | Ra (nm) | Print Evaluation Resistance to Staining at Reduced Water | Dampening Water Latitude | Small Dot Reproducibility | Blanket Stain | Plate Life (sheets) |
|---|---|---|---|---|---|---|---|---|---|
| 2-27 (Inv.) | Al-1 | 1-20 | 2 | 350 | Excellent | Excellent | Excellent | Excellent | >20000 |
| 2-28 (Inv.) | Al-1 | 1-22 | 2 | 350 | Excellent | Excellent | Excellent | Excellent | >20000 |
| 2-29 (Inv.) | Al-2 | 1-24 | 2 | 370 | Excellent | Excellent | Excellent | Excellent | >20000 |
| 2-30 (Inv.) | Al-2 | 1-25 | 2 | 330 | Excellent | Excellent | Excellent | Excellent | >20000 |
| 2-31 (Inv.) | Al-2 | 1-20 | 2 | 350 | Excellent | Excellent | Excellent | Excellent | >20000 |
| 2-32 (Inv.) | Al-4 | 1-25 | 2 | 370 | Excellent | Excellent | Excellent | Excellent | >20000 |
| 2-33 (Inv.) | Al-4 | 1-26 | 2 | 340 | Excellent | Excellent | Excellent | Excellent | >20000 |
| 2-34 (Inv.) | Al-3 | 1-17 | 2 | 420 | Excellent | Excellent | Good | Good | >20000 |
| 2-7 (Comp.) | Al-1 | 2-2 | 2 | 120 | Slightly poor | Poor | Poor | Good | 5000 |
| 2-8 (Comp.) | Al-1 | 2-3 | 2 | 110 | Slightly poor | Poor | Poor | Poor | 5000 |
| 2-9 (Comp.) | Al-2 | 2-1 | 2 | 350 | Poor | Poor | Poor | Slightly poor | 5000 |
| 2-10 (Comp.) | Al-2 | 2-4 | 2 | 110 | Slightly poor | Poor | Poor | Poor | 5000 |
| 2-11 (Comp.) | Al-2 | 2-5 | 2 | 360 | Poor | Poor | Slightly poor | Poor | 10000 |
| 2-12 (Comp.) | Al-2 | 2-6 | 2 | 100 | Slightly good | Slightly poor | Slightly good | Slightly poor | 5000 |
| 2-13 (Comp.) | Al-3 | 2-5 | 2 | 650 | Very Poor | Poor | Poor | Very poor | 10000 |
| 2-14 (Comp.) | Al-3 | 2-6 | 2 | 320 | Slightly good | Good | Slightly good | Poor | 5000 |
| 2-15 (Comp.) | Al-3 | None | — | 550 | Poor | Poor | Good | Poor | >20000 |

TABLE 10

| Sample No. | Substrate | Coating Solution | Average Layer Thickness (μm) | Physical Property Evaluation Degree of Orientation | Cracking | Scaling | Abrasion |
|---|---|---|---|---|---|---|---|
| 2-16 (Inv.) | PET-1 | 3-16 | 2 | 0.8 | A | A | B |
| 2-17 (Inv.) | PET-1 | 3-17 | 2 | 0.85 | A | A | B |
| 2-35 (Inv.) | PET-1 | 3-16 | 2 | 0.55 | B | B | B |
| 2-36 (Inv.) | PET-1 | 3-17 | 2 | 0.6 | B | B | B |

Example 3

On a polyethylene terephthalate (PET) film support, the photosensitive layer side of which was previously subjected to corona discharge treatment at 15 $W/m^2 \cdot min$, a hydrophilic layer having the following composition 3 was coated so as to have a dry thickness of 2.0 μm, dried at 50° C. for 5 min. and then further subjected overall to heating treatment at 55° C. for 3 hr. to obtain support 3 for a printing plate.

| Hydrophilic layer composition 3 | |
|---|---|
| Aqueous dispersible filler SYLOJET Grade P405 (available from GRACE Davidson Co.) | 70 parts |
| Colloidal silica Snowtex (available from NISSAN KAGAKU) | 30 parts |
| Water | 1250 parts |

Thereafter, on the thus obtained support, the following photosensitive composition 3 was coated with a wire bar so as to form dry weight of 2.0 g/$m^2$ and dried at 95° C. for 90 sec. to obtain image forming material 3.

| Photosensitive composition 3 | |
|---|---|
| Infrared absorbent | 4 parts |
| Novolac resin | 96 parts |
| Propylene glycol monomethyl | 700 parts |
| Methyl ethyl ketone | 300 parts |

Image forming material 4 was prepared in the same manner as image forming material 3, except that hydrophilic layer composition 3 was replaced by the following composition 4.

| Hydrophilic layer composition 4 | |
|---|---|
| Aqueous dispersible filler Silton B (available from MIZUSAWA Kagaku Co) | 70 parts |
| Colloidal silica Snowtex (available from NISSAN KAGAKU) | 30 parts |
| Water | 1250 parts |

Image forming material 5 was prepared in the same manner as image forming material 3, except that the hydrophilic layer composition 3 and photosensitive composition 3 was replaced by the following hydrophilic layer composition 5 and photosensitive composition 5.

| | |
|---|---|
| Hydrophilic layer composition 5 | 70 parts |
| Aqueous dispersible filler Cyclo-jet Grade P405 (available from GRACE Japan Co. Ltd.) | |
| Colloidal silica Snowtex (available from NISSAN KAGAKU) | 30 parts |
| Water | 1250 parts |
| Photosensitive composition 5 | |
| Infrared dye IR 15 | 1 part |
| Acid generating agent, exemplified compound (3) | 5 parts |
| Acid-decomposable compound* | 79 parts |
| Propylene glycol monomethyl | 700 parts |
| Methyl ethyl ketone | 300 parts |

*The acid-decomposable compound was prepared in the following manner. 1,1-Dimethoxycyclohexane of 58 g, diethylene glycol of 85 g, p-toluenesulfonic acid of 194 g and toluene of 200 ml were mixed and allowed to react at 120° C. for 11 hr. with stirring. After completing reaction, reaction-produced methanol and a reaction solvent were removed, the remaining reaction product solution was washed with 200 ml of water and further with 400 ml of aqueous 1 wt % sodium hydroxide solution, and thereafter was washed with aqueous saturated sodium chloride solution, until the solution was neutralized. The obtained product was dehydrated with anhydrous potassium carbonate and then distilled under reduced pressure to obtain the desired acid-decomposable compound.

Example 6

Image forming material 6 was prepared in the same manner as the image forming material 3, except that the hydrophilic layer composition 3 was replaced by the following hydrophilic layer composition 6.

| Hydrophilic layer composition 6 | |
|---|---|
| Aqueous dispersible filler Cyclo-jet Grade P405 (available from GRACE Japan Co. Ltd.) | 30 parts |
| gelatin binder | 70 parts |
| Water | 1250 parts |

Example 7

Image forming material 7 was prepared in the same manner as the image forming material 3, except that the hydrophilic layer composition 3 was replaced by the following hydrophilic layer composition 7.

| Hydrophilic layer composition 7 | |
|---|---|
| Aqueous dispersible filler Cyclo-jet Grade P616 (available from GRACE Japan Co. Ltd.) | 70 parts |
| Colloidal silica Snowtex (available from NISSAN KAGAKU) | 30 parts |
| Water | 1250 parts |

Example 8

Image forming material 8 was prepared in the same manner as the image forming material 3, except that the hydrophilic layer composition 3 was replaced by the following hydrophilic layer composition 8.

| Hydrophilic layer composition 8 | |
|---|---|
| Aqueous dispersible filler Cyclo-jet Grade P616 (available from GRACE Japan Co. Ltd.) | 70 parts |
| Colloidal silica Snowtex 20L (pH = 11) (available from NISSAN KAGAKU) | 30 parts |
| Water | 1250 parts |

The thus prepared image forming materials 3 to 8 each were imagewise exposed semiconductor laser (of 830 nm and having an output of 500 mW), in which the laser radius was 13 μm at 1/$e^2$ of the peak and the resolution 2,000 dpi in the main-scanning and sub-scanning directions. After exposure, each material was developed at 30° C. for 30 min. using Konica PS plate developer SDR-1 (available from Konica Corp.), which was previously diluted with a given amount of water, washed and dried.

The thus developed image forming materials were evaluated with respect to sensitivity, plate life and print stain.

Sensitivity

Sensitivity was represented by exposure energy (mJ/$cm^2$) necessary to completely remove exposed portions with the developer.

Plate Life

Prints obtained at the time 10,000 sheets were printed were evaluated based on the following criteria:

A: 2% small dots were reproduced,

B: 2% dots were reproduced but slightly non-uniform, and

C: 2% dots were not reproduced.

Print Stain

The exposed portion (300 ml/$cm^2$) of the obtained print was visually evaluated, based on the following criteria:

A: no stain observed,

B: slight stain observed, and

C: stain observed.

The obtained results are shown in Table 11. In the Table, the grade "C" is an unacceptable level to practical uses.

TABLE 11

| | Hydrophilic Layer | | | | Photosensitive Layer | | | | | | | |
|---|---|---|---|---|---|---|---|---|---|---|---|---|
| | Aqueous Dispersible Filler | | | | | | | | | | | |
| Sample No. | Average size ($\mu$m) | Content | Colloidal Silica | Hydrophilic Resin | IR Dye | Novolac Resin | Acid Generating Agent | Acid decomposable Compd. | Sensitivity (mJ/cm$^2$) | Plate Life | Print Stain | Remark |
| 3 | 3.5 | 70 | 30 | — | 4 | 96 | — | — | 200 | A | A | Inv. |
| 4 | 3.5 | 70 | 30 | — | 4 | 96 | — | — | 200 | A | A | Inv. |
| 5 | 3.5 | 70 | 30 | — | 1 | 79 | 5 | 15 | 150 | A | A | Inv. |
| 6 | 3.5 | 30 | — | 70 | 4 | 96 | — | — | 300 | A | B | Inv. |
| 7 | 12 | 70 | 30 | — | 4 | 96 | — | — | 250 | A | B | Inv. |
| 8 | 3.5 | 70 | 30 | — | 4 | 96 | — | — | 300 | B | B | Inv. |

As apparent from the Table, photosensitive planographic printing plates prepared based on the image forming materials according to the invention exhibited high sensitivity, reduced print stain and superior plate life.

Disclose embodiments can be varied by a skilled person without departing from the spirit and scope of the invention.

What is claimed is:

1. A printing plate comprising a substrate and at least one component layer, wherein said component layer contains porous particles having a pore volume of not less than 0.5 ml/g and said printing plate contains a thermally fusible material which is ink-receptive and has a melting point of 50 to 200° C. and wherein said thermally fusible material of exposed area fuses and surface of said printing plate of said exposed area varies from hydrophilicity to hydrophobicity.

2. The printing plate of claim 1, wherein said porous particles are porous inorganic particles.

3. The printing plate of claim 2, wherein said porous inorganic particles comprise porous silica particles or porous aluminosilicate particles.

4. The printing plate of claim 1, wherein said component layer is an image recording layer.

5. The printing plate of claim 4, wherein said thermally fusible material is a thermally fusible particle and said component layer contains said thermally fusible particles.

6. The printing plate of claim 5, wherein the surface of said thermally fusible particles is covered with a material exhibiting a thermal conductivity of 0.10 to 70 $Wm^{-1}K^{-1}$ at 300 K.

7. The printing plate of claim 1, wherein the printing plate further has an image recording layer.

8. The printing plate of claim 7, wherein said thermally fusible material is thermally fusible particle and said image recording layer contains said thermally fusible particles.

9. The printing plate of claim 8, wherein the surface of said thermally fusible particles is covered with a material exhibiting a thermal conductivity of 0.10 to 70 $Wm^{-1}K^{-1}$ at 300 K.

10. The printing plate of claim 8 wherein said component layer is a hydrophilic layer and said component layer is nearer to said substrate than said image recording layer and said component layer contains light-to-heat converting material.

11. The printing plate of claim 1 wherein said component layer is a hydrophilic layer.

12. The printing plate of claim 1 wherein said porous particles have an average particle size of not more than 1 $\mu$m.

15. The printing plate of claim 1, wherein the melting point is 80° to 150° C.

13. The printing plate of claim 1, wherein said component layer contains metal oxide particles having an average particle size of not more than 100 nm.

14. The printing plate of claim 13, wherein said metal oxide particles are colloidal silica.

* * * * *

UNITED STATES PATENT AND TRADEMARK OFFICE

CERTIFICATE OF CORRECTION

PATENT NO. : 6,399,270 B1
DATED : June 4, 2002
INVENTOR(S) : Mori et al.

It is certified that error appears in the above-identified patent and that said Letters Patent is hereby corrected as shown below:

Title page,
Item [30], Foreign Application Priority Data,
"Dec. 4, 1998 (JP) ..............." entry, cancel "10-34525" and insert -- 10-345825 --

Signed and Sealed this

Thirtieth Day of July, 2002

Attest:

JAMES E. ROGAN

*Attesting Officer* *Director of the United States Patent and Trademark Office*